United States Patent
Yamazaki et al.

(10) Patent No.: US 8,023,312 B2
(45) Date of Patent: Sep. 20, 2011

(54) NONVOLATILE SEMICONDUCTOR MEMORY DEVICE

(75) Inventors: Shinobu Yamazaki, Osaka (JP); Yasunari Hosoi, Osaka (JP); Nobuyoshi Awaya, Osaka (JP); Shinichi Sato, Osaka (JP); Kenichi Tanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 16 days.

(21) Appl. No.: 12/515,286

(22) PCT Filed: Nov. 5, 2007

(86) PCT No.: PCT/JP2007/071502
§ 371 (c)(1),
(2), (4) Date: May 18, 2009

(87) PCT Pub. No.: WO2008/068992
PCT Pub. Date: Jun. 12, 2008

(65) Prior Publication Data
US 2009/0273964 A1 Nov. 5, 2009

(30) Foreign Application Priority Data
Dec. 8, 2006 (JP) ................................ 2006-331689

(51) Int. Cl.
*G11C 11/00* (2006.01)
(52) U.S. Cl. .................. 365/148; 365/175; 365/189.09
(58) Field of Classification Search .................. 365/148, 365/175, 189.09
See application file for complete search history.

(56) References Cited

U.S. PATENT DOCUMENTS

| 7,433,222 B2 * | 10/2008 | Hosoi et al. ................. 365/148 |
| 2006/0067106 A1 | 3/2006 | Mori et al. |
| 2009/0052225 A1 | 2/2009 | Morimoto |
| 2009/0184389 A1 * | 7/2009 | Bertin et al. ................. 257/476 |

FOREIGN PATENT DOCUMENTS

| JP | 2006-99882 A | 4/2006 |
| JP | 2006-203098 A | 8/2006 |

OTHER PUBLICATIONS

Chen et al., "Non-Volatile Resistive Switching for Advanced Memory Applications", IEDM, 2005.
Baek et al., "Highly Scalable Non-volatile Resistive Memory using Simple Binary Oxide Driven by Asymmetric Unipolar Voltage Pulses", IEDM, 2004.

(Continued)

*Primary Examiner* — Huan Hoang
(74) *Attorney, Agent, or Firm* — Birch, Stewart, Kolasch & Birch, LLP

(57) ABSTRACT

A nonvolatile semiconductor memory device include: a two terminal structured variable resistive element, wherein resistive characteristics defined by current-voltage characteristics at both ends transit between low and high resistance states stably by applying a voltage satisfying predetermined conditions to the both ends. A transition from the low resistance state to the high resistance state occurs by applying a voltage of a first polarity whose absolute value is at or higher than first threshold voltage, and the reverse transition occurs by applying a voltage of a second polarity whose absolute value is at or higher than a second threshold voltage. A load circuit is connected to the variable resistive element in series having an adjustable load resistance. A voltage generation circuit applies a voltage to both ends of a serial circuit. The variable resistive element can transit between the states by adjusting a resistance of the load circuit.

6 Claims, 66 Drawing Sheets

OTHER PUBLICATIONS

Zhuang et al., "Novell Colossal Magnetoresistive Thin Film Non-volatile Resistance Random Access Memory (RRAM)", IEDM Technical Digest, pp. 193-196, Dec. 2002.

Pagnia et al., "Bistable Switching in Electroformed Metal-Insulator-Metal Devices", Physica Stat. Sol. (a) 108, pp. 11-65, 1988.

* cited by examiner

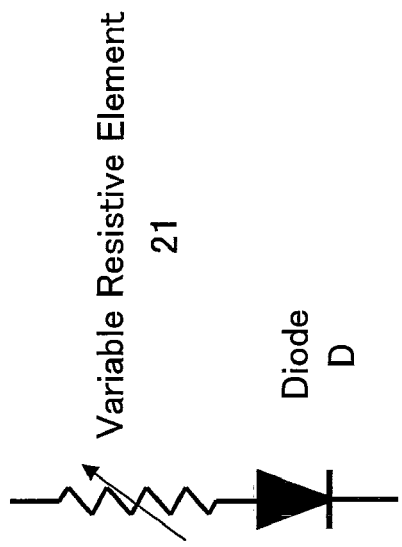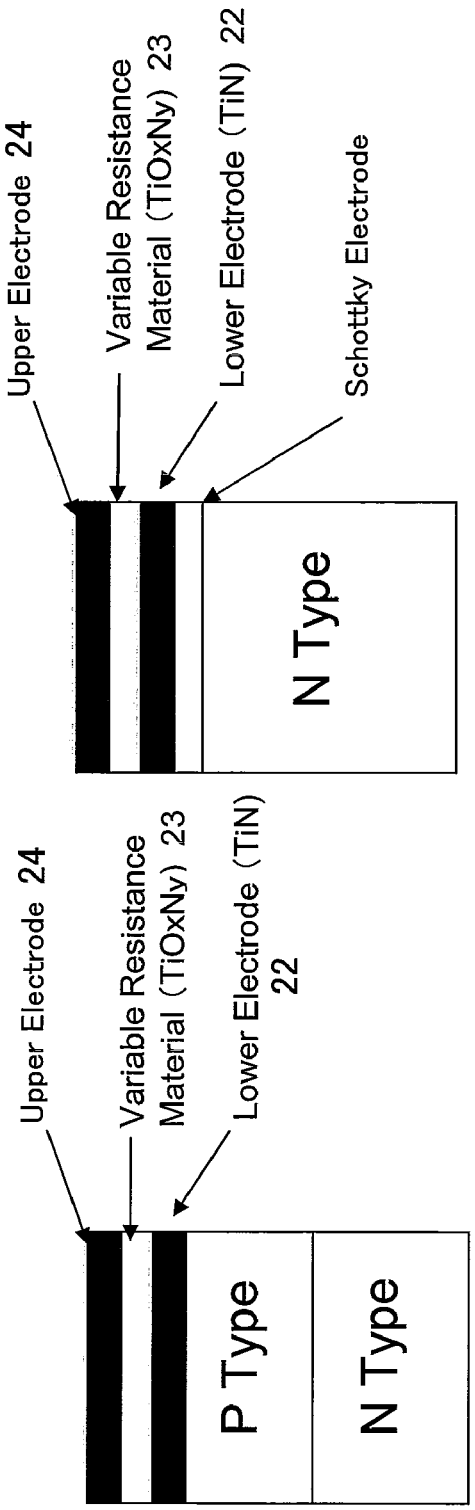
FIG. 9A
FIG. 9B
FIG. 9C

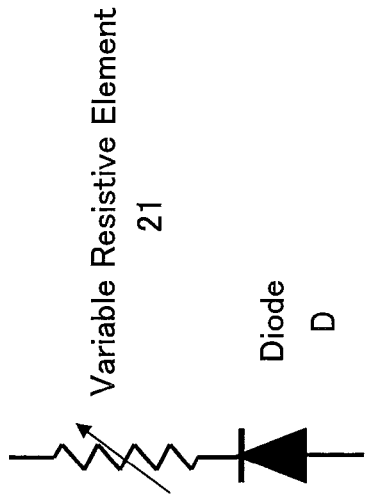
FIG. 15A
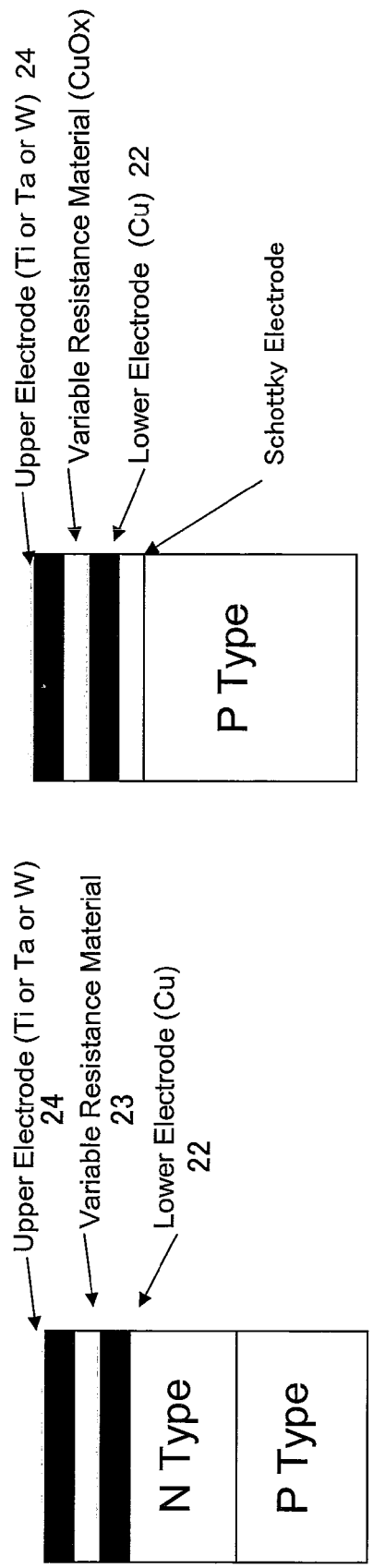
FIG. 15C
FIG. 15B

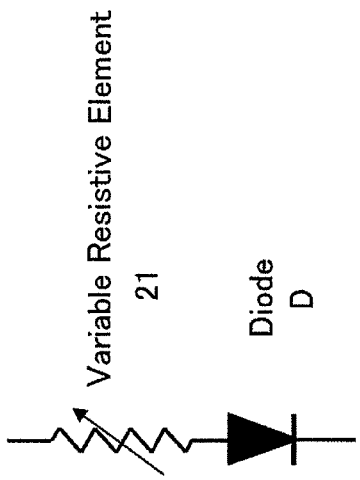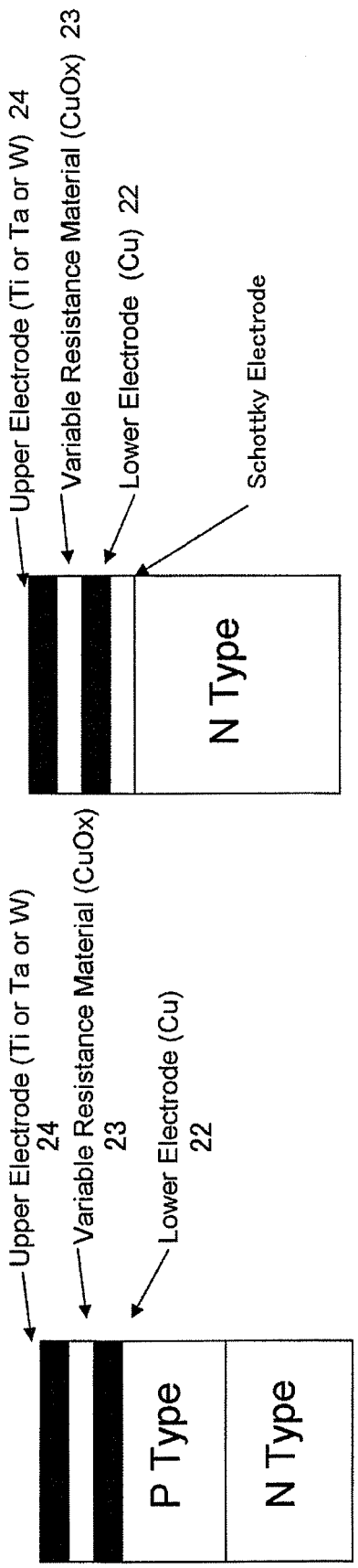

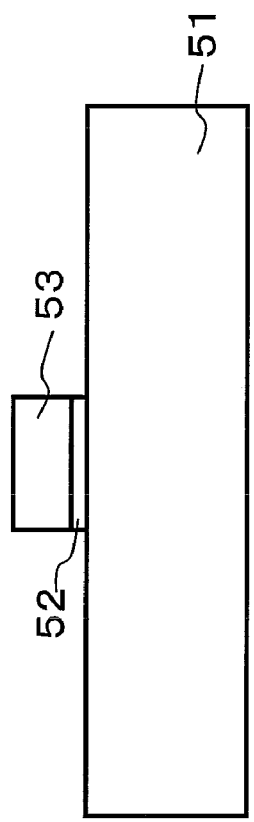
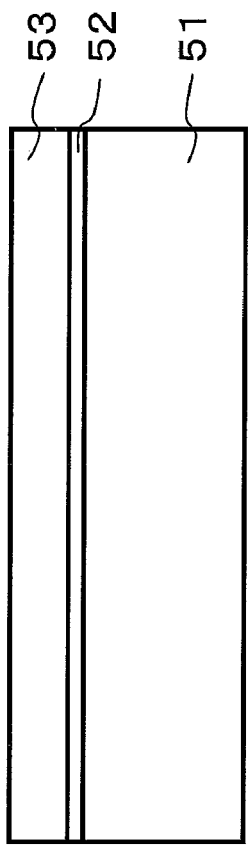

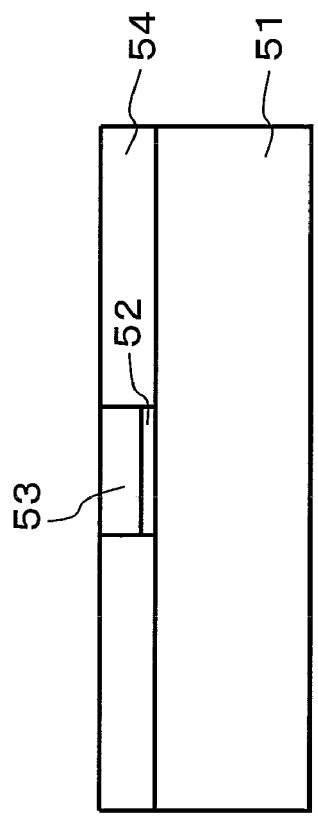
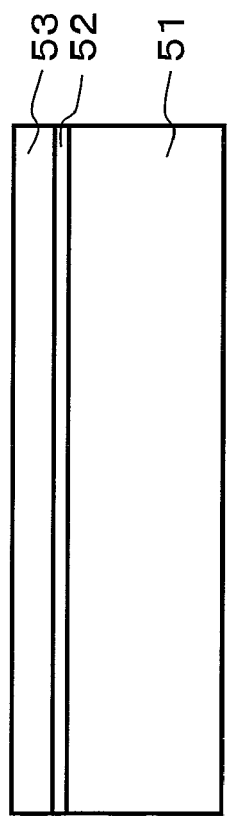
FIG. 25B
FIG. 25A

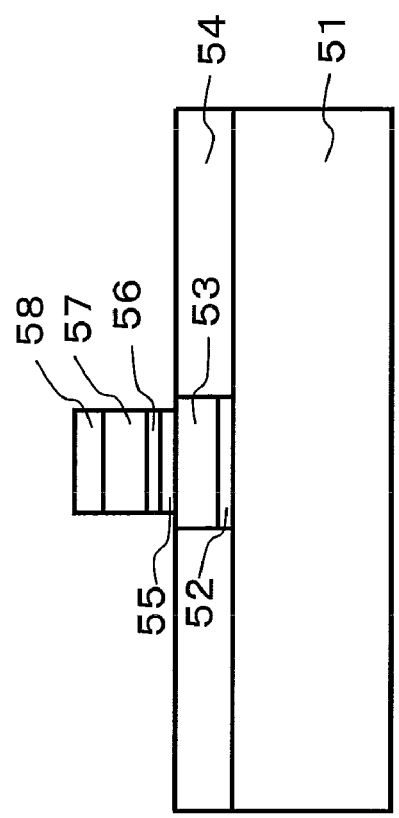
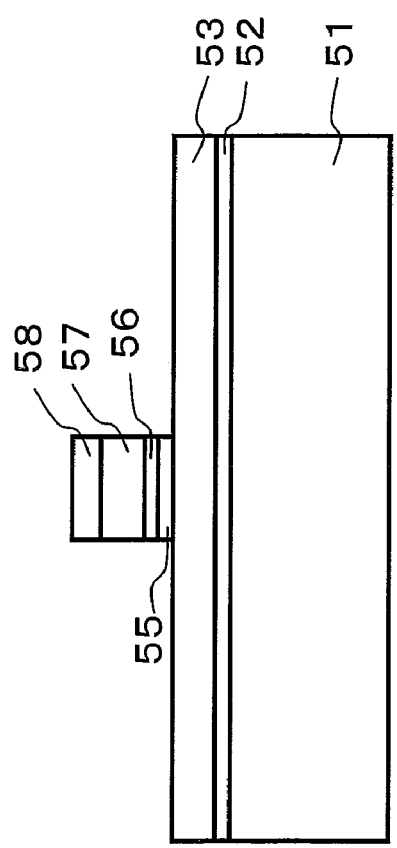

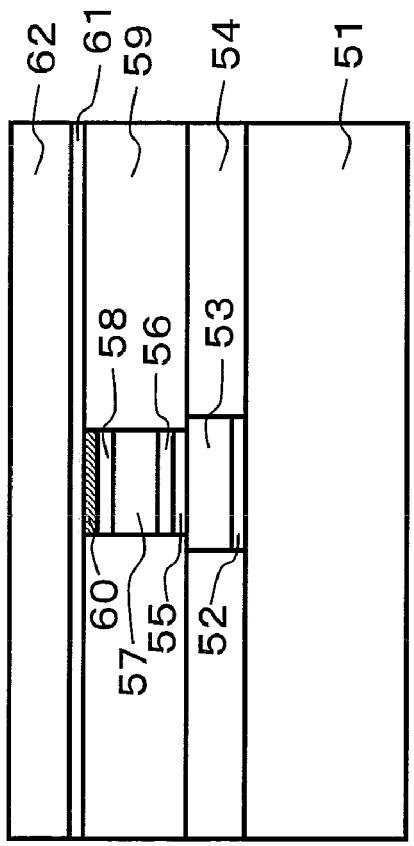
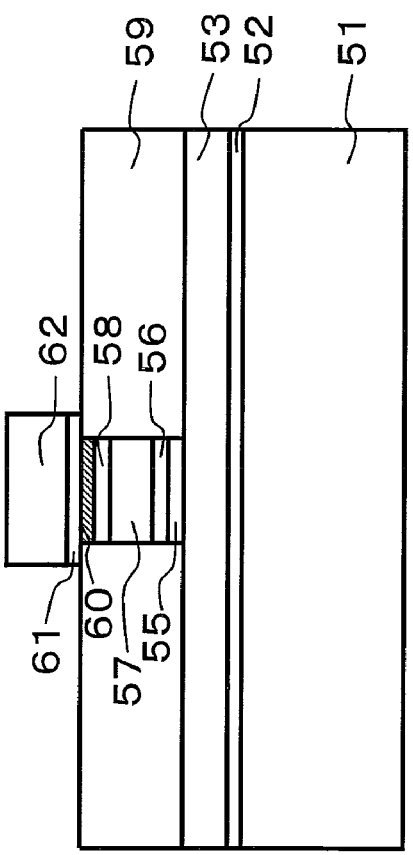
FIG. 32A
FIG. 32B

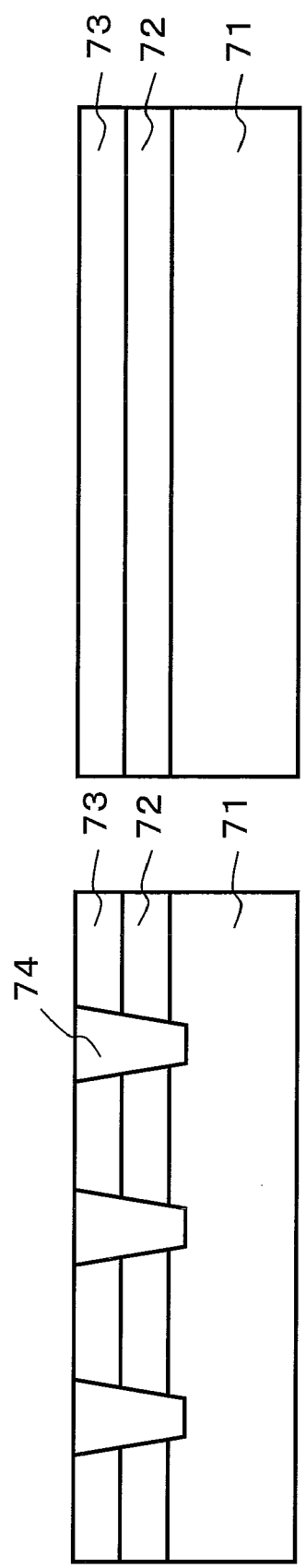

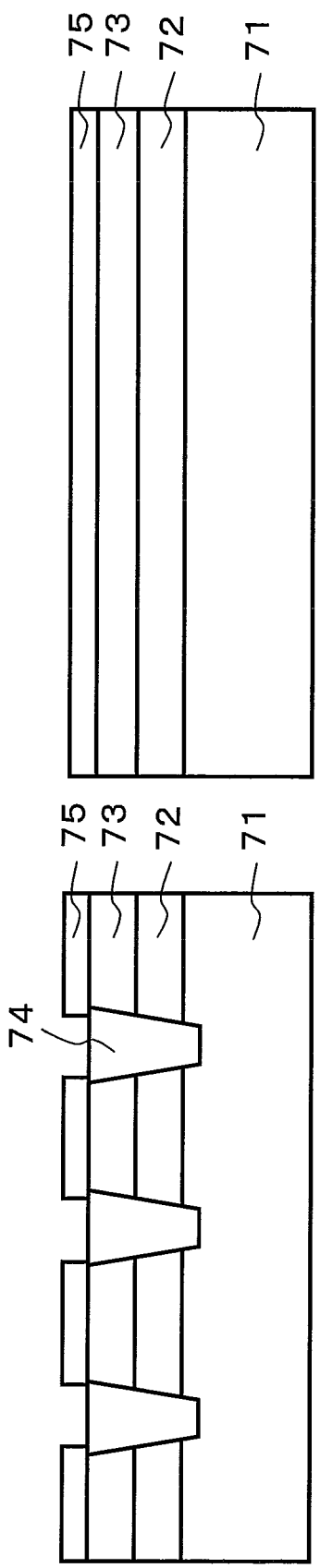

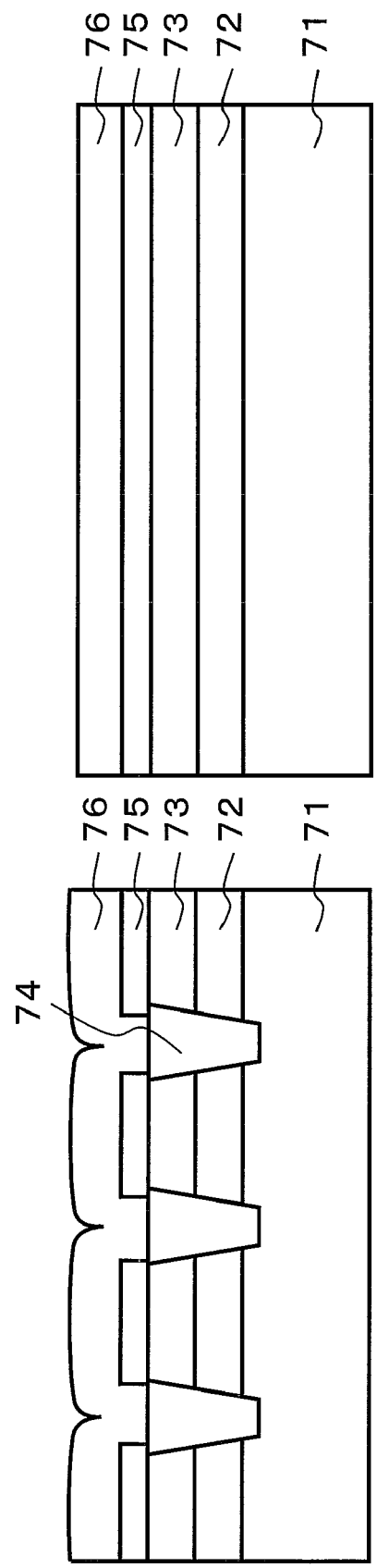

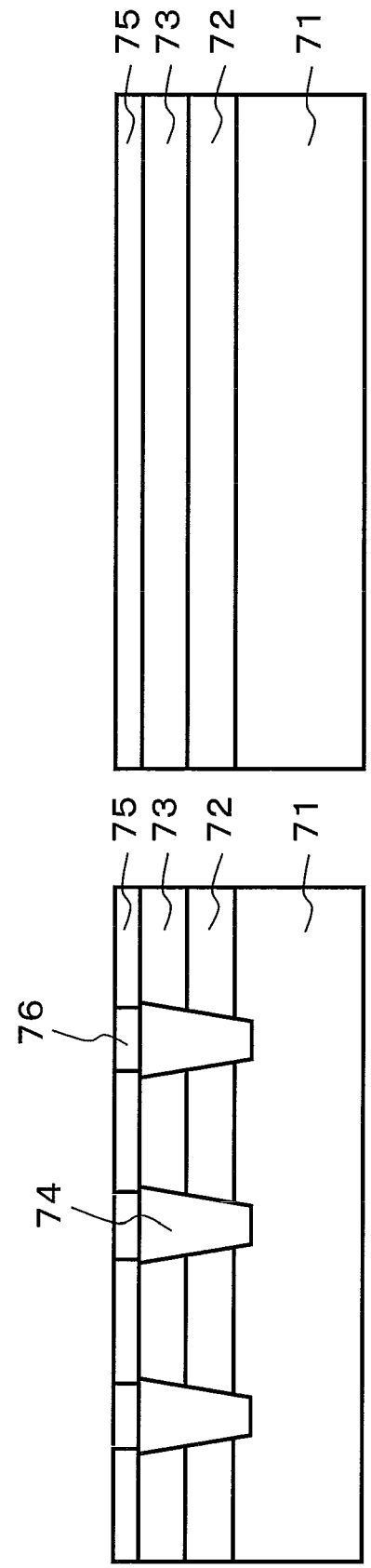

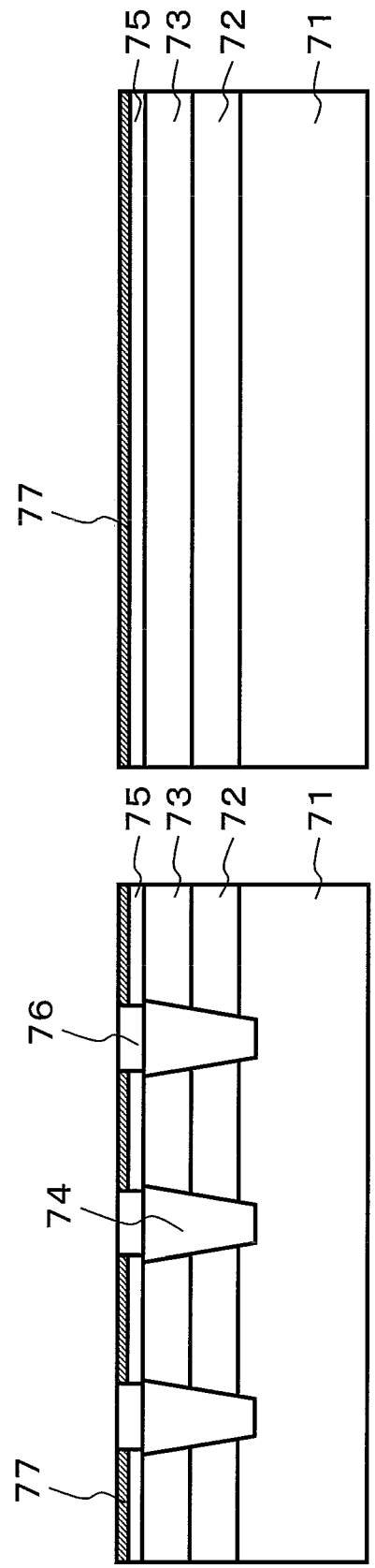

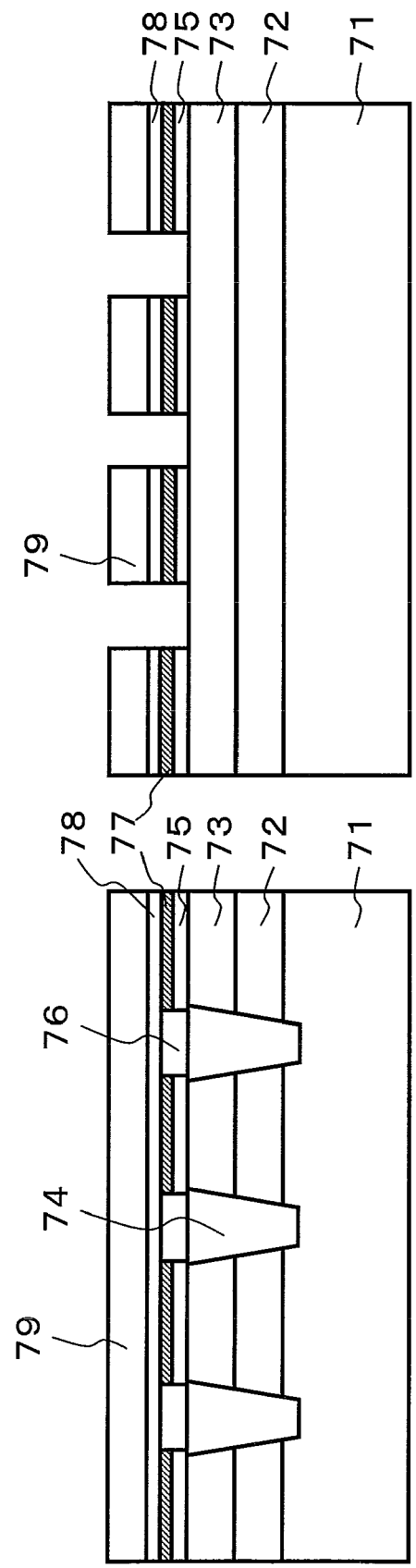

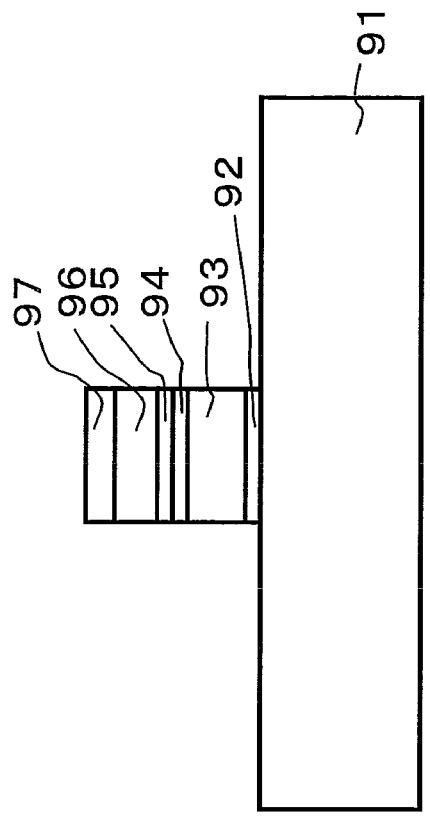
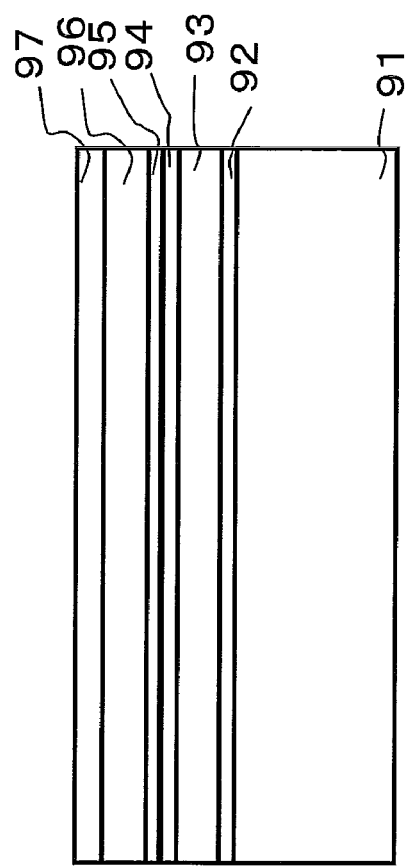

NONVOLATILE SEMICONDUCTOR MEMORY DEVICE

CROSS-REFERENCE TO RELATED APPLICATIONS

This application is a National Phase filing under 35 U.S.C. §371 of International Application No. PCT/JP2007/071502 filed on Nov. 5, 2007, and which claims priority to Japanese Patent Application No. 2006-331689 filed on Dec. 8, 2006.

TECHNICAL FIELD

The present invention relates to a nonvolatile semiconductor memory device and more particularly, to a nonvolatile semiconductor memory device including a variable resistive element whose resistive characteristics vary in accordance with application of voltage.

BACKGROUND ART

A nonvolatile semiconductor memory device typified by a flash memory is used in various fields such as computers, communications, measurement devices, automatic control units and household appliances used around individuals, as an information recording medium that is large in capacity and small in size, so that there is great demand for the nonvolatile semiconductor memory device that is lower in price and larger in capacity. This is because, since data can be written electrically and data is not erased even when a power supply is cut, the nonvolatile semiconductor memory device can function as a data storage and a program storage in which initial setting to run portable devices such as memory cards and mobile phones is stored as nonvolatile data.

Meanwhile, in view of a great increase in application program and data itself in current circumstances, there is great demand for a system that can write software stored in the flash memory, fix bugs, upgrade the function, and the like. However, according to a conventional flash memory as the representative of the nonvolatile semiconductor memory devices, since it takes a long time to write data, and it is necessary to provide an extra storage region to buffer a file because data amount that can be written at one time is limited, the problem is that a processing procedure in writing the data becomes very complicated as a result.

In addition, flash memory is expected to face limit of miniaturization in principle, and thus research on new nonvolatile semiconductor memory devices that will replace flash memory has been widely carried out. Among them, a study of resistance change nonvolatile semiconductor memory device that utilizes the phenomenon that application of voltage to a metal oxide film causes resistance to change has been actively conducted recently, because the memory is more advantageous than flash memory in terms of limitation of miniaturization and because it is also capable of writing data at a high speed.

Although the study of the phenomenon that application of voltage to metal oxides such as nickel, iron, copper, titanium or the like changes resistance had been under way since 1960s (refer to Non-Patent Document 1), then, it was never put into practical use in actual devices. At the end of 1990s, it was proposed to apply to nonvolatile semiconductor memory device the fact that by giving voltage pulse for a short time to such oxides of manganese or copper having the Perovskite-type structure, deterioration of materials can be minimized and resistance can be irreversibly increased or decreased. Then, it was demonstrated that a memory array of memory unit devices (memory cells) in which variable resistive elements using these metal oxides were combined with a transistor or a diode could be really formed on a semiconductor chip. This was reported in IEDM (International Electron Device Meeting) in 2002 (refer to Non-Patent Document 2), which triggered wide research to be undertaken in the semiconductor industry. Later, a similar approach was also taken in the research on oxides of nickel or copper carried out in 1960s, and memory devices produced by being combined with a transistor or diode were also reported (refer to Non-Patent Documents 3 and 4).

All of these technologies are basically considered a same technology as they utilize resistance change in a metal oxide film to be induced by application of voltage pulse and use different resistance states as stored information in a nonvolatile semiconductor memory device (memory devices which constitute the nonvolatile semiconductor memory device).

Variable resistive elements (resistive elements made of metal oxides) whose resistance change is induced by application of voltage, as described above, exhibit various resistive characteristics or resistance change characteristics, depending on a material of a metal oxide (a metal oxide which changes its resistance by voltage application is referred to as a "variable resistor", hereinafter), that of an electrode, form and size of a device, and operating condition. However, it is not known what causes the diversity in these characteristics. In other words, when researchers fabricated nonvolatile semiconductor memory devices, they simply made operating conditions that happened to exhibit the best characteristics as memory devices constituting a nonvolatile semiconductor memory device (referred to as a "nonvolatile semiconductor memory device", hereinafter) operating conditions of those devices. Therefore, the overall picture of these characteristics has not been well understood, which still leaves us without any uniform design guideline.

Such condition without any uniform design guideline indicates that the above variable resistive element has not yet grown to be an industrially applicable technology in a true sense. In other words, in the empirically optimized technology as above, although the variable resistive element described above could be used as a single nonvolatile memory device or as a component in which the nonvolatile memory devices are integrated at a small scale, it cannot be applied to modern semiconductor devices that demand high quality assurance of large-scale integration of 1 million to 100 million units as with flash memory.

Specific instances the overall picture of which has not yet been understood, as described above, include bipolar (two polarities) switching characteristics and unipolar (unipolarity) switching characteristics. The switching characteristics of the both and applications thereof have already been reported in IEDM (refer to Non-Patent Document 2).

The bipolar switching implements switching between two resistance states by utilizing voltage pulses having two different polarities of positive and negative, having resistance of a variable resistive element transit from low resistance state to high resistance state with voltage pulse of any one of the polarities, and then having it transit from the high resistance state to the low resistance state with voltage pulse of the other polarity.

In contrast, the unipolar switching implements switching between two resistance states by utilizing voltage pulses having a same polarity and two different durations of long and short application (pulse width), having resistance of a variable resistive element transit from the low resistance state to the high resistance state with voltage pulse of one duration of application and then having it transit from the high resistance state to the low resistance state with voltage pulse of other duration of application.

Although so far there have been some reports on the both switching characteristics as described above, no report has done more than stating the characteristics in the operating conditions of any specific nonvolatile semiconductor memory device fabricated.

Each of the switching operations according to the above-mentioned two switching characteristics has advantages and disadvantages.

Since the bipolar switching can implement transit time of several 10 ns or shorter as resistance increases or decreases, a memory device utilizing this can write accumulated data at a very high rate. However, since both positive and negative voltage pulses are used, in order to operate only the selected memory cell while preventing a sneak path current, it is necessary to provide a selection transistor with respect to each memory cell (refer to FIG. 61).

FIG. 61 is a view showing a part of a memory cell array CA90 in which 1T1R type memory cells each including a variable resistive element and a selection transistor are arranged. A memory cell MC11 shown in FIG. 61 has a variable resistive element R11 and a selection transistor Tr11, and a predetermined voltage is applied to both ends of the variable resistive element R11 based on on-off control of the selection transistor Tr11. When it is assumed that a source line SL is the ground line, the voltage value applied to both ends of the variable resistive element R11 is determined by a voltage applied to a bit line BL1. In the case of the 1T1R type memory cell shown in FIG. 61, since an area per memory cell is increased as compared with the flash memory configured by 1T type memory cells, it is difficult to implement a memory device that is low in bit cost and superior to the flash memory.

In addition, although an attempt is made to reduce the area per memory cell configured by a variable resistive element showing the bipolar switching characteristics by combining with a two-terminal nonlinear element, in the nonlinear element in this case, a simple rectifying element cannot be used and very special characteristics are required. That is, as shown in FIG. 62A, when an applied voltage to both ends is changed, if the nonlinear element shows varistor characteristics in which a resistance value is lowered abruptly in a range where an absolute value is a certain voltage or more in either polarity, the above memory cell can be implemented in principle, but since an actual nonlinear element shows characteristics in which the resistance value is sequentially decreased as the absolute value of the applied voltage is increased as shown in FIG. 62B, it cannot show the ideal characteristics as shown in FIG. 62A. Accordingly, at this point in time, the memory cell using the nonlinear element having the characteristics shown in FIG. 62A cannot be implemented.

On the other hand, as the unipolar switching can implement switching operation with voltage pulses of a single polarity, circuit configuration can be simplified. In addition, as a combination of a diode and a variable resistive element (1D1R type) can be used, possible effect of a sneak path current from adjacent memory cells, which will be a problem when a memory cell array is configured as a cross point type, can be substantially reduced, thereby resulting in considerably improved electric characteristics in readout operation. FIG. 63 is a view showing a memory cell array CA91 configured by 1D1R type memory cells each having the variable resistive element and a diode serving as a two-terminal rectifying element. When this is compared with the 1T1R type memory cell shown in FIG. 61, the configuration of the memory cell can be simplified while preventing the sneak path current. Thus, the chip size can be reduced and the manufacturing cost can be reduced as compared with the configuration shown in FIG. 61, that is, the case of the bipolar switching.

However, as two long and short voltage pulses are needed in order to have the resistance state of the variable resistive element transit by the unipolar switching, and, in particular, the former one needs the pulse width of a few µs, writing thereof takes 100 times longer than that of the bipolar switching. In addition, since the memory cell current during writing ranges from about several hundreds µA to a few mA as with the case of the bipolar switching, to write each memory cell, the unipolar switching also requires about 100 times as high power consumption as the bipolar switching. Thus, it is severely inferior to the bipolar switching in terms of performance during writing. Since it is difficult to use means for erasing data in block and for programming a plurality of bits like the flash memory in view of chip power consumption, an operation speed of the single element exceeds the flash memory, but when the performance of the memory system is compared, performance difference in writing speed cannot be superior to the flash memory. Consequently, it is difficult to have a competitive edge over the flash memory.

On the one hand, in terms of stability of switching operations, there exist challenges in any switching characteristics. In order to start switching operations in a stable manner, voltage pulses having optimal voltage amplitude should be selected. However, the voltage amplitude must be determined through trial and error and according to characteristics of a variable resistive element. Thus, even in the case of the bipolar switching, stable switching operation can often be obtained by using voltage pulses to be applied that have different voltage amplitude as well as different polarities.

Non-patent Document 1: H. Pagnia, et. al, "Bistable Switching in Electroformed Metal-Insulator-Metal Devices", Physica Status Solidi (a), 108, pp. 11-65, 1988

Non-patent Document 2: W. W. Zhuang, et. al, "Novell Colossal Magnetoresistive Thin Film Nonvolatile Resistance Random Access Memory (RRAM)", IEDM Technical Digest, pp. 193-196, December 2002

Non-patent Document 3: I. G. Beak et al., "Highly Scalable Non-Volatile Resistive Memory Using Simple Binary Oxide Driven By Asymmetricunipolar Voltage Pulses", IEDM, 2004

Non-patent Document 4: A. Chen et al., "Non-Volatile Resistive Switching For Advanced Memory Applications", IEDM, 2005

DISCLOSURE OF THE INVENTION

First, before describing the problems to be resolved by the invention and the means for solving the problems, we describe conditions that can stably implement switching operations based on the bipolar and unipolar switching characteristics as described above, as technological idea on which the present invention is founded.

FIG. 64 is representative of current-voltage characteristics showing basic characteristics of resistance change due to application of voltage between both electrodes in a variable resistive element that is configured to sandwich a variable resistor between an upper electrode and a lower electrode. The current-voltage characteristics as shown in FIG. 64 were measured by using a commercially available measuring apparatus (e.g., a parameter analyzer made by Hewlett-Packard Company with the model number 4156B) that can set the upper limit (compliance) of current. Specific voltage and current values differ, depending on a material, a device structure, a manufacturing process, and a device size of individual samples to be measured. However, irrespective of a type of a variable resistor, qualitative characteristics such as those in FIG. 64 can be seen, when a variable resistor is made of an oxide metal of iron, nickel, copper, titanium or the like.

More specifically, when voltage equal to or higher than threshold voltage Va (Va$^+$ or Va$^-$) is applied to a variable resistive element showing resistive characteristics of high resistance state (A in the figure), it transits to resistive characteristics of low resistance state (B in the figure). The current flowing through the variable resistive element rises to the compliance value of Ic1 when applied voltage is Va or higher. Then, when the current compliance value Ic1 is set to a value that will not exceed a current value at a point Tb showing the resistance state immediately before a transition from the low resistance state (characteristics B) to the high resistance state (characteristics A) (a point showing the resistance state of the variable resistive element will be referred to as a "characteristic point", hereinafter), the current greater than the compliance value Ic1 does not run. Then, if applied voltage is lowered while maintaining the current value Ic1, a transition from the high resistance state (characteristics A) to the low resistance state (characteristics B) will take place. Since the applied voltage after the transition to the low resistance state is lower than the threshold voltage Vb (Vb$^+$ or Vb$^-$) at the characteristic point Tb, the resistive characteristics steadily transit to the low resistance state (characteristics B) rather than going back to the high resistance state (characteristics A). Next, either when the current compliance value is set greater than the current value at the characteristic point Tb or when the original setting is cancelled and voltage higher than the threshold voltage Vb is applied to a variable resistive element exhibiting the resistive characteristics (B in the figure) of the low resistance state, current flowing through the variable resistive element will decrease and the resistive characteristics will transit to high resistance value (A in the figure).

If voltage equal to or higher than the threshold voltage Va continues to be applied while the variable resistive element is in the high resistance state (A in the figure), without setting the current compliance value, a transition from the low resistance state (characteristics B) to the high resistance state (characteristics A) occurs immediately after a transition from the high resistance state (characteristics A) to the low resistance state (characteristics B) because the applied voltage is higher than the threshold voltage Vb. This results in an unstable oscillation phenomenon that the resistive characteristics of a variable resistive element keep on changing between the high resistance state (characteristics A) and the low resistance state (characteristics B). If the applied voltage is lowered in such the oscillating condition, oscillation stops when the applied voltage reaches voltage less than the higher threshold voltage Va. As the applied voltage is then higher than the threshold voltage Vb, the resistive characteristics of the variable resistive element are in the high resistance state (characteristics A), and thus no transition to the low resistance state (characteristics B) occurs. In sum, application of voltage to a variable resistive element alone without setting a current compliance value could not implement desired switching operations.

In addition, although FIG. 64 shows the case of resistive characteristics in which the threshold voltage Vb for the transition from the low resistance state to the high resistance state is lower than the threshold voltage Va for the transition from the high resistance state to the low resistance state, magnitude relation of these threshold voltages Va, Vb may be reversed. In such a case, although at the threshold voltage Va, a transition from the high resistance state to the low resistance state takes place in stable manner, oscillation occurs when the threshold voltage is equal to or higher than Vb, and no stable transition to the high resistance state occurs.

Thus, for a variable resistive element to perform switching operations in a stable manner, the following two conditions should be satisfied in each of the operations of transiting from the high resistance state to the low resistance state, and of transiting from the low resistance state to the high resistance state, respectively.

Firstly, when the resistive characteristics of a variable resistive element transit from the high resistance state to the low resistance state, it is necessary to apply voltage higher than the threshold voltage Va wherein the threshold voltage Va is lower than the threshold voltage Vb. Secondly, when the resistive characteristics of a variable resistive element transit from the low resistance state to the high resistance state, it is necessary to apply voltage higher than the threshold voltage Vb wherein the threshold voltage Vb is lower than the threshold voltage Va.

In a symmetrically configured variable resistive element that was reported in the past, if switching operations are performed in the variable resistive element alone, i.e., when voltage applied to the variable resistive element is turned ON and OFF under the condition that load resistance is zero or fixed to certain load resistive characteristics, applied voltages to cause transitions between the two resistance states cannot satisfy the above two conditions simultaneously if the respective applied voltages have a same polarity. Then, in order to meet the above two conditions, it was necessary to use asymmetric nature of the bipolar switching characteristics to an asymmetrically configured variable resistive element to be discussed later or the unipolar switching operation that uses changes in the resistive characteristics due to elevated temperatures.

FIG. 65 shows resistive characteristics (current-voltage characteristics) of a variable resistive element capable of bipolar switching operation by satisfying the above two conditions. FIG. 65 shows load resistive characteristics C of a load circuit as well as two resistive characteristics A, B of a variable resistive element. The load circuit forms a serial circuit by electrically connecting to the variable resistive element in series, and when voltage is applied to both ends of the serial circuit, resistive voltage division of the variable resistive element and the load circuit determines voltage to be applied to the variable resistive element. In FIG. 65, voltage at each intersection of the load resistive characteristics C and the resistive characteristics A, B is voltage to be actually applied to the variable resistive element, and the intersection of the load resistive characteristics C and the voltage axis represents voltage to be applied to both ends of the serial circuit. Increasing and decreasing voltage to be applied to both ends of the serial circuit results in lateral translation (in the direction of voltage axis) of a characteristic curve or a characteristic line representative of the load resistive characteristics C. In the example shown in FIG. 65, load resistance exhibiting linear load resistive characteristics as a load circuit is assumed in the description.

In the current-voltage characteristics shown in FIG. 65, threshold voltage VA+ for a transition from the high resistance state (characteristics A) to the low resistance state (characteristics B) as a result of application of voltage to the serial circuit on the side of one polarity (positive polarity) is smaller in absolute value than threshold voltage VB$^+$ for a transition from the low resistance state to the high resistance state on the side of the same polarity (positive polarity), wherein voltage equal to or higher than threshold voltage Va$^+$ is applied between both terminals of the variable resistive element when voltage absolute value of which is equal to or higher than the threshold voltage $VA^+$ is applied to both ends of the serial circuit, thus causing the transition from the high resistance state to the low resistance state. The example shown in FIG. 65 has achieved similar effect to that described in FIG. 64, by substituting a load circuit for setting a current compliance. In fact, due to presence of the load circuit, increase in the current through the variable resistive element caused by the transition from the high resistance state to the low resistance state lowers voltage through the load circuit, thus automatically reducing voltage applied to the variable resistive element. If the load resistive characteristics of a load circuit are properly set, an absolute value of the voltage applied to the variable resistive element after the transition to low resistance is lower than the threshold voltage $Vb^+$ that has the resistive characteristics transit from the low resistance state to the high resistance state, thus implementing the transition from the high resistance state to the low resistance state in a stable manner. However, even if voltage equal to or higher than the threshold voltage $VB^+$ of the same polarity (positive polarity) is applied to the serial circuit after the transition to the low resistance state, no transition to the high resistance state occurs in a stable manner because voltage not less than the threshold voltage $Vb^+$ that is higher than the threshold voltage $Va^+$ is applied between both terminals of the variable resistive element and oscillation occurs.

On the contrary, threshold voltage $VB^-$ for a transition from the low resistance state (characteristics B) to the high resistance state (characteristics A) as a result of application of voltage to a serial circuit on the side of the other polarity (negative polarity) is smaller in absolute value than threshold voltage $VA^-$ for a transition from the high resistance state to the low resistance state on the side of the same polarity (negative polarity), wherein voltage absolute value of which is equal to or higher than threshold voltage $Vb^-$ is applied between both terminals of the variable resistive element when voltage absolute value of which is equal to or higher than the threshold voltage $VB^-$ is applied to both ends of the serial circuit, thus causing the transition from the low resistance state to the high resistance state. If the load resistive characteristics of the load circuit common to the positive and negative polarities are set, the absolute value of voltage applied to the variable resistive element after the transition to the high resistance state is lower than the threshold voltage $Va^-$ that has the resistive characteristics transit from the high resistance state to the low resistance state, thus implementing the transition from the low resistance state to the high resistance state in a stable manner. However, even if voltage absolute value of which is equal to or higher than the threshold voltage $VA^-$ of a same polarity (negative polarity) is applied to the serial circuit after the transition to the high resistance state, no transition from the high resistance state to the low resistance state occurs because voltage not less than the threshold voltage $Va^-$ that is higher than the threshold voltage $Vb^-$ is applied between both terminals of the variable resistive element and oscillation occurs.

The point to be noted here is as follows: for a variable resistive element alone, irrespective of polarity of applied voltage, threshold voltages $Vb^+$ and $Vb^-$ for the transition from the low resistance state to the high resistance state are respectively lower than threshold voltages $Va^+$ and $Va^-$ for the transition from the high resistance state to the low resistance state (see FIG. 65). Nevertheless, by making a correlation (e.g., voltage difference or voltage ratio) of the threshold voltages $Va^+$ and $Vb^+$ asymmetrical to that of the threshold voltages $Va^-$ and $Vb^-$, and by properly setting the load resistive characteristics of the load circuit, as threshold voltage of voltage applied to the serial circuit, it is possible to set the threshold voltage $VA^+$ lower in absolute value than the threshold voltage $VB^+$ on the side of positive polarity, and the threshold voltage $VB^-$ lower in absolute value than the threshold voltage $VA^-$ on the side of negative polarity. Consequently, the magnitude relations of the threshold voltages $VA^+$ and $VB^+$ and of the threshold voltages $VB^-$ and $VA^-$ can be reversed, thus enabling stable bipolar switching operations by applying voltages of both positive and negative polarities.

Now, the asymmetrical nature of both positive and negative polarities in the correlation of threshold voltages of the variable resistive element shown in FIG. 65 can be obtained by configuring in up-down asymmetrical manner a material of a lower electrode and an upper electrode of the variable resistive element, composition of a variable resistor, device shape, or device size or the like. In particular, implementation of stable bipolar switching may require extremely asymmetrical nature, for instance, the lower and upper electrodes being made of different materials, interface structure between the lower electrode and a variable resistor being different from that between the upper electrode and the variable resistor or the like. Excellent asymmetrical nature is easy to be occurred if rectifying characteristics such as Schottky junction are exhibited on either one of the interface between the lower electrode and the variable resistor and that between the upper electrode and the variable resistor.

However, since the conventional bipolar switching operations use voltage pulses of both the positive and negative polarities, as described above, the circuit configuration for implementing a semiconductor memory device becomes complex, chip size expands, and the manufacturing cost increases.

Meanwhile, aside from the bipolar switching operations to the variable resistive element of the asymmetrical structure as described above, the two conditions for conducting the stable switching operations described earlier may be satisfied even by application of voltage of a same polarity if two different values are set for the duration of voltage application to the variable resistive elements.

FIGS. 66A and 66B show resistive characteristics (current-voltage characteristics) of a variable resistive element that can satisfy the above two conditions and perform unipolar switching operations. FIG. 66A shows resistive characteristics (current-voltage characteristics) of a variable resistive element when voltage pulses having short pulse width (voltage application duration) are applied, and FIG. 66B shows resistive characteristics (current-voltage characteristics) of a variable resistive element when voltage pulses having long pulse width (voltage application duration) are applied. In addition, similar to FIG. 65, FIG. 66 also shows load resistive characteristics C of a load circuit as well as two resistive characteristics A, B of a variable resistive element.

In the current-voltage characteristics shown in FIG. 66A, threshold voltage VAs for a transition from the high resistance state (characteristics A) to the low resistance state (characteristics B) as a result of application of voltage having short pulse width to a serial circuit is lower in absolute value than threshold voltage VBs for a transition from the low resistance state to the high resistance state as a result of application of voltage having the same pulse width, wherein voltage equal to or higher than threshold voltage Vas is applied between both terminals of the variable resistive element when voltage pulses absolute value of which is equal to or higher than threshold voltage VAs is applied to both ends of the serial circuit, thus causing the transition from the high resistance state to the low resistance state. Now in the example shown in FIG. 66A, similar effect to that described in FIG. 64 is obtained by substituting a load circuit for setting a current compliance shown in FIG. 64. In fact, due to presence of the load circuit, increase in the current through the variable resistive element caused by the transition from the high resistance state to the low resistance state lowers voltage through the load circuit, thus automatically reducing voltage applied to the variable resistive element. If the load resistive characteristics of a load circuit are properly set, an absolute value of the voltage applied to the variable resistive element after the transition to low resistance is lower than the threshold voltage Vbs for having the resistive characteristics transit from the low resistance state to the high resistance state, thus implementing the transition from the high resistance state to the low resistance state in a stable manner. However, even if voltage equal to or higher than the threshold voltage VBs is applied to the serial circuit by applying voltage pulses of same pulse width after the transition to the low resistance state, no transition from the low resistance state to the high resistance state occurs (oscillation occurs) because voltage not less than the threshold voltage Vbs that is higher than the threshold voltage Vas is applied between both terminals of the variable resistive element.

On the contrary, in the current-voltage characteristics shown in FIG. 66B, threshold voltage VB1 for a transition from the low resistance state (characteristics B) to the high resistance state (characteristics A) as a result of application of voltage pulses having long pulse width to the serial circuit is lower in absolute value than threshold voltage VA1 for a transition from the high resistance state to the low resistance state in the same long pulse width, wherein voltage absolute value of which is higher than the threshold voltage Vb1 is applied between both terminals of the variable resistive element when voltage absolute value of which is equal to or higher than the threshold voltage VB1 is applied to both ends of the serial circuit, causing the transition from the low resistance state to the high resistance state. When the load resistive characteristics of the load circuit are set for the long pulse width similar to the short pulse width, the absolute value of voltage applied to the variable resistive element after the transition to the high resistance state is lower than the threshold voltage Va1 for having the resistive characteristics transit from the high resistance state to the low resistance state, thus implementing the transition from the low resistance state to the high resistance state in a stable manner. However, even if voltage equal to or higher than the threshold voltage VA1 is applied to the serial circuit, by applying voltage pulses of the same long pulse width after the transition to the high resistance state, no transition from the high resistance state to the low resistance state occurs (oscillation occurs) because voltage not less than the threshold voltage Va1 that is higher than the threshold voltage Vb1 is applied between both terminals of the variable resistive element.

Thus, with the same pulse width, while the resistive characteristics of the variable resistive element only transit from one to the other of the high resistance state (characteristics A) and the low resistance state (characteristics B), it cannot transit in the reverse orientation, which thus makes stable switching operations impossible. In contrast, in the conventional unipolar switching operations, through the use of application of voltage pulses having two long and short pulse widths and of same polarity, a transition from the high resistance state to the low resistance state is stably implemented by application of voltage pulse of one of the two different pulse widths, while a transition from the low resistance state to the high resistance state can be stably implemented by application of voltage pulse of the other of the two different pulse widths.

The point to be noted here is as follows: for a variable resistive element alone, irrespective of whether pulse width is long or short, threshold voltages Vbs and Vb1 for a transition from the low resistance state to the high resistance state are respectively lower than threshold voltages Vas and Va1 for a transition from the high resistance state to the low resistance state. Nevertheless, by making a correlation (e.g., voltage difference or voltage ratio) of the threshold voltages Vas and Vbs differ from that of the threshold voltages Va1 and Vb1 in terms of whether pulse width is long or short, and by properly setting the load resistive characteristics of the load circuit, as threshold voltage of voltage applied to the serial circuit, it is possible to set the threshold voltage VAs lower in absolute value than the threshold voltage VBs in short pulse width, and the threshold voltage VB1 lower in absolute value than the threshold voltage VA1 in the long pulse width. Consequently, the magnitude relation of the threshold voltages VAs and VBs and of the threshold voltages VB1 and VA1 can be reversed, thus enabling stable unipolar switching operations by applying voltage pulses of different pulse width.

Now it is believed that a difference in correlation between the threshold voltages Va1 and Vb1 of the variable resistive element shown in FIG. 66 due to the length of pulse width results from a change in the high resistance state (characteristics A) and the low resistance state (characteristics B) of the variable resistive element caused by changing a resistance value of the variable resistive element or resistance components in the vicinity thereof due to Joule heat generated at the variable resistive element when voltage pulses of longer pulse width are applied. In particular, when voltage amplitude of voltage pulses applied to the serial circuit is fixed, generation of Joule heat will be remarkable in the case that voltage pulses of long pulse width are applied to the variable resistive element in the low resistance state (characteristics B). Thus, it is believed that characteristic change due to difference in pulse width is most obvious in the resistive characteristics in the low resistance state (characteristics B). In fact as can be seen from a comparison of FIGS. 66A and 66B, due to effect of Joule heat, the resistive characteristics in the low resistance state (characteristics B) becomes less resistive when voltage pulses of long pulse width are applied, and the threshold voltage VB1 becomes lower than the threshold voltage VBs of when the pulse width is short.

However, the conventional unipolar switching operations are disadvantageous in terms of time and power consumption needed for writing, because two types of voltage pulses of long and short pulse widths should be used.

The present invention was made in light of the above problems of the conventional bipolar switching operations or unipolar switching operations in a nonvolatile semiconductor memory device comprising a variable resistive element resistive characteristics of which vary as a result of application of voltage. The invention aims to provide a nonvolatile semiconductor memory device capable of stable switching operations at a high speed to variable resistive elements, by applying voltages having either one of positive and negative polarities without differentiating the duration of voltage application, based on uniform understanding of the phenomenon of bipolar switching operations or unipolar switching operations.

A nonvolatile semiconductor memory device according to the present invention in order to achieve the above object comprises: a memory cell having a variable resistive element having two terminals, the variable resistive element having resistive characteristics defined by current-voltage characteristics at both ends, the resistive characteristics transiting between two stably provided resistive characteristics of a low resistance state and a high resistance state when a voltage satisfying a predetermined condition is applied to the both ends; a load circuit connected to one end of the variable resistive element in series, the load circuit having load resistive characteristics defined by the current-voltage characteristics, the load resistive characteristics being switched between first load resistive characteristics and second load resistive characteristics, the second load resistive characteristics having a resistance higher than the first load resistive characteristics; and a voltage generation circuit for applying a voltage to both ends of a serial circuit configured by the variable resistive element and the load circuit, and is characterized as first characteristics in that a stored state of the variable resistive element is determined whether the resistive characteristics are in the low resistance state or the high resistance state and written when the resistive characteristics transit between the low resistance state and the high resistance state in response to application of a voltage to the both ends of the variable resistive element, the variable resistive element shows asymmetric characteristics in which when a polarity of an applied voltage to one terminal based on the other terminal is a first polarity, a first threshold voltage is lower than a second threshold voltage, the first threshold voltage being a lower limit value of an absolute value of the applied voltage required for the resistive characteristics to transit from the low resistance state to the high resistance state, the second threshold voltage being a lower limit value of an absolute value of the applied voltage required for the resistive characteristics to transit from the high resistance state to the low resistance state, and when the polarity of the applied voltage is a second polarity different from the first polarity, the first threshold voltage is higher than the second threshold voltage, the load resistive characteristics of the load circuit are switched so as to show the first load resistive characteristics during a first writing operation in which the resistive characteristics of the variable resistive element transit from the low resistance state to the high resistance state, and show the second load resistive characteristics during a second writing operation in which the resistive characteristics of the variable resistive element transit from the high resistance state to the low resistance state, and the voltage generation circuit applies a first writing voltage to the both ends of the serial circuit of the variable resistive element and the load circuit so that a voltage of the first polarity having an absolute value equal to or higher than the first threshold voltage is applied to the both ends of the variable resistive element of the memory cell to be written during the first writing operation, and applies a second writing voltage to the both ends of the serial circuit of the variable resistive element and the load circuit so that the voltage of the first polarity having the absolute value equal to or higher than the second threshold voltage is applied to the both ends of the variable resistive element of the memory cell to be written during the second writing operation.

According to the first characteristics of the nonvolatile semiconductor memory device of the present invention, even when the variable resistive element shows the bipolar switching characteristics by itself, the switching operation can be implemented (unipolar switching operation can be implemented) by applying a voltage having either positive or negative polarity. Therefore, it is not necessary to provide a selection transistor to avoid the sneak path current to each memory cell, and an area per memory cell can be reduced.

Moreover, the nonvolatile semiconductor memory device according to the present invention, in addition to the first characteristics, has second characteristics that the variable resistive element has a three-layer structure in which a variable resistor is sandwiched between a first electrode and a second electrode.

Moreover, the nonvolatile semiconductor memory device according to the present invention, in addition to the second characteristics, has third characteristics that the memory cell has a rectifying element connected to the variable resistive element in series, and the rectifying element provides forward bias when the voltage having the first polarity is applied to the both ends of the variable resistive element.

According to the third characteristics of the nonvolatile semiconductor memory device of the present invention, an effect of the sneak path current from the adjacent memory cell can be reduced without affecting the unipolar switching operation.

Moreover, the nonvolatile semiconductor memory device according to the present invention, in addition to the third characteristics, has fourth characteristics that when the first polarity is a positive polarity, a Schottky barrier diode is provided at an interface between an N-type polycrystalline semiconductor and the lower electrode, the N-type polycrystalline semiconductor being formed so as to be in contact with a lower surface of the lower electrode, and when the first polarity is a negative polarity, the Schottky barrier diode is provided at an interface between a P-type polycrystalline semiconductor and the lower electrode, the P-type polycrystalline semiconductor being formed so as to be in contact with the lower surface of the lower electrode.

Moreover, the nonvolatile semiconductor memory device according to the present invention, in addition to the fourth characteristics, has fifth characteristics that when the first polarity is the positive polarity, a P-type impurity is implanted to a part of a contact region with the lower electrode in the N-type polycrystalline semiconductor, and when the first polarity is the negative polarity, an N-type impurity is implanted to a part of the contact region with the lower electrode in the P-type polycrystalline semiconductor.

According to the fifth characteristics of the nonvolatile semiconductor memory device of the present invention, when a reverse voltage is applied to the Schottky barrier diode, since the reverse current is reduced due to a spread of a depletion layer from the PN junction as compared with a general Schottky barrier diode, an excellent device having less sneak path current can be provided.

Moreover, the nonvolatile semiconductor memory device according to the present invention, in addition to the third characteristics, has sixth characteristics that when the first polarity is the positive polarity, a P-type impurity is implanted to a part of the contact region with the lower electrode in the N-type polycrystalline semiconductor, and when the first polarity is the negative polarity, an N-type impurity is implanted to a part of the contact region with the lower electrode in the P-type polycrystalline semiconductor.

According to the configuration in the present invention, since the resistive characteristics of the variable resistive element can be changed by applying the voltage having the same polarity without changing the voltage application time, when the nonvolatile semiconductor memory device is configured so as to have a plurality of memory cells each having the above variable resistive element, the writing time can be shortened and the circuit size can be reduced in the nonvolatile semiconductor memory device.

BRIEF DESCRIPTION OF THE DRAWINGS

FIGS. 9A to 9C are schematic views showing a memory cell in the nonvolatile semiconductor memory device according to the present invention.

FIGS. 15A to 15C are views showing an example of the structure of the variable resistive element.

FIGS. 16A to 16C are views showing an example of the structure of the variable resistive element.

FIGS. 23A and 23B are schematic sectional views showing a manufacturing step according to the first embodiment of the nonvolatile semiconductor memory device according to the present invention.

FIGS. 25A and 25B are schematic sectional views showing a manufacturing step according to the first embodiment of the nonvolatile semiconductor memory device according to the present invention.

FIGS. 27A and 27B are schematic sectional views showing a manufacturing step according to the first embodiment of the nonvolatile semiconductor memory device according to the present invention.

FIGS. 32A and 32B are schematic sectional views showing a manufacturing step according to the first embodiment of the nonvolatile semiconductor memory device according to the present invention.

FIGS. 40A and 40B are schematic sectional views showing a manufacturing step according to the second embodiment of the nonvolatile semiconductor memory device according to the present invention.

FIGS. 41A and 41B are schematic sectional views showing a manufacturing step according to the second embodiment of the nonvolatile semiconductor memory device according to the present invention.

FIGS. 42A and 42B are schematic sectional views showing a manufacturing step according to the second embodiment of the nonvolatile semiconductor memory device according to the present invention.

FIGS. 43A and 43B are schematic sectional views showing a manufacturing step according to the second embodiment of the nonvolatile semiconductor memory device according to the present invention.

FIGS. 44A and 44B are schematic sectional views showing a manufacturing step according to the second embodiment of the nonvolatile semiconductor memory device according to the present invention.

FIGS. 46A and 46B are schematic sectional views showing a manufacturing step according to the second embodiment of the nonvolatile semiconductor memory device according to the present invention.

FIGS. 53A and 53B are schematic sectional views showing a manufacturing step according to the third embodiment of the nonvolatile semiconductor memory device according to the present invention.

BEST MODE FOR CARRYING OUT THE INVENTION

Figure 1:
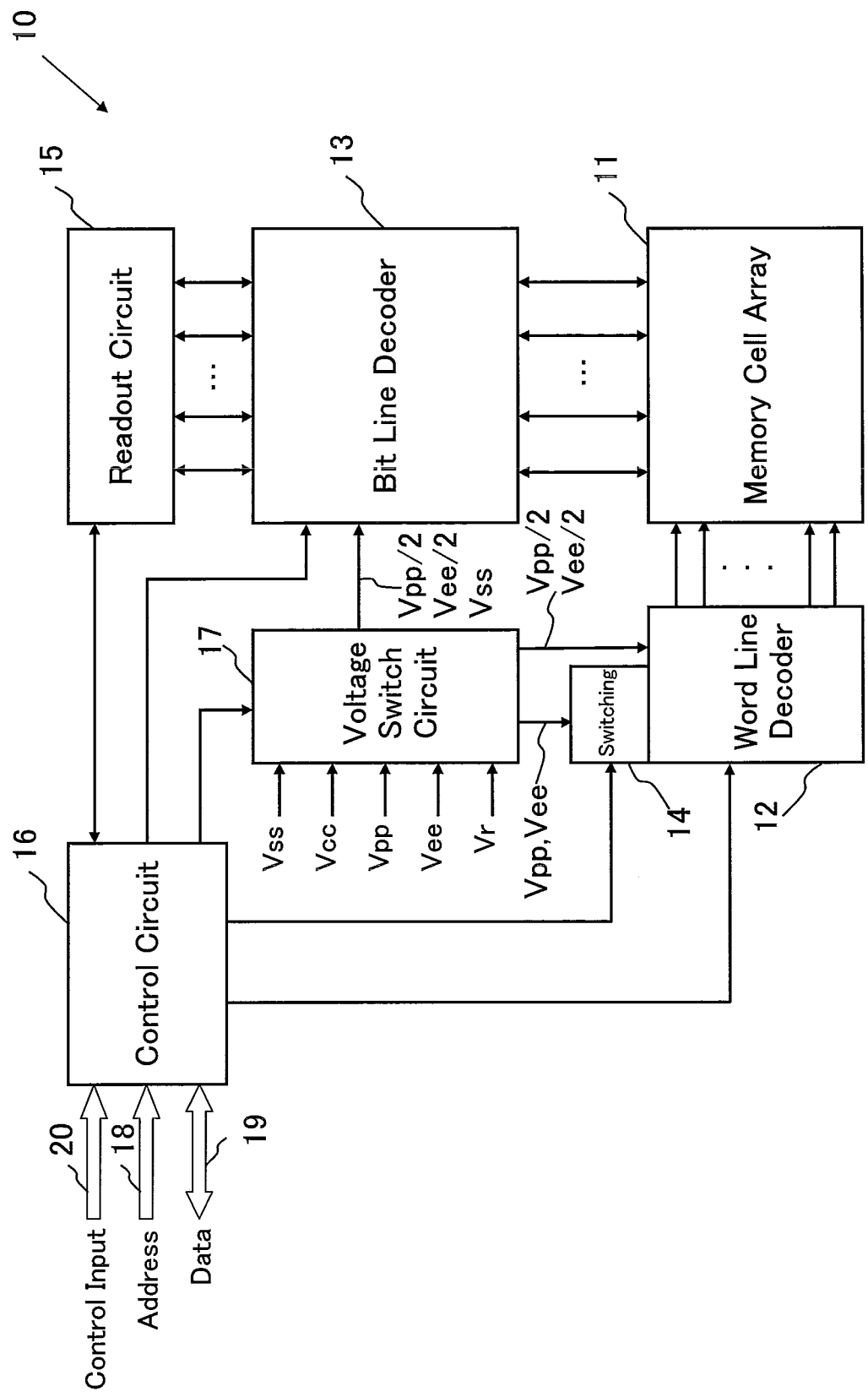
FIG. 1 is a block diagram showing a schematic configuration of a nonvolatile semiconductor memory device according to the present invention.

Hereinafter, embodiments of a nonvolatile semiconductor memory device according to the present invention (hereinafter occasionally referred to as a "device of the present invention") will be described with reference to the drawings.
Configuration of Device of the Present Invention A configuration of the device of the present invention will be described with reference to FIGS. 1 to 19. FIG. 1 is one example of a block diagram showing a schematic configuration of the nonvolatile semiconductor memory device according to the present invention. As shown in FIG. 1, the device of the present invention 10 comprises a memory cell array 11, a word line decoder (corresponding to a word line selection circuit) 12, a bit line decoder (corresponding to a bit line selection circuit) 13, a load resistance characteristic variable circuit 14, a readout circuit 15, a control circuit 16, and a voltage switch circuit 17.

The memory cell array 11 comprises a plurality of arrays of nonvolatile memory cells arranged in a row direction and in a column direction, respectively, and not only information can be electrically programmed into memory cells to be addressed from the external, but also information stored in the addressed memory cells can be read out. More specifically, information is stored in specific memory cells in the memory cell array 11 that correspond to an address signal entered from an address line 18, and the information is outputted to an external device through a data line 19. Here, each memory cell includes a variable resistive element having a three-layer structure in which a variable resistor is sandwiched between an upper electrode and a lower electrode.

Connecting to respective word lines of the memory cell array 11, the word line decoder 12 selects, as a selected word line, a word line of the memory cell array 11 that corresponds to an address signal entered in the address line 18 for row selection, and individually applies to the selected word line and an unselected word line selected word line voltage and unselected word line voltage for respective memory operations such as programming, erasing, and readout.

Connecting to respective bit lines of the memory cell array 11, the bit line decoder 13 selects, as a selected bit line, a bit line of the memory cell array 11 that corresponds to an address signal entered in the address line 18 for column selection, and individually applies to the selected bit line and an unselected bit line selected bit line voltage and unselected bit line voltage for respective memory operations such as programming, erasing, and readout.

Controlled by a control circuit 16, the load resistive characteristic variable circuit 14 switches between two different load resistive characteristics (low resistance state and high resistance state) the load resistive characteristics specified by the current-voltage characteristics of a load circuit that electrically connects to a selected memory cell in series that was selected from the memory cell array 11 as a target of writing by the word line decoder 12 and bit line decoder 13 in programming or erasing operation. In the device of the present invention 10 shown in FIG. 1, as an example, the load resistive characteristic variable circuit 14 is provided between the word line decoder 12 and a voltage switch circuit 17.

The control circuit 16 controls the respective memory operations of programming, erasing and read out of the memory cell array 11. Based on an address signal entered from the address line 18, data entry made from the data line 19 (in programming operation), and a control input signal entered from a control signal line 20, the control circuit 16 controls the word line decoder 12 and bit line decoder 13 to control readout, programming and erasing operations of the memory cell array 11. Specifically, in each memory operation, the control circuit executes control for applying to each of the selected word line, unselected word line, selected bit line and unselected bit line, predetermined voltage corresponding to the respective memory operations, on the voltage switch circuit 17, the word line decoder 12, bit line decoder 13 or the like. In particular, in programming and erasing operations, it controls voltage amplitude and pulse width of each voltage pulse to be applied to a memory cell to be written through the load circuit. Furthermore, in programming and erasing operations, it executes control for switching the load resistive characteristics of the load circuit on the load resistive characteristic variable circuit 14. In the example shown in FIG. 1, the control circuit 16 is provided with the capability in general as an address buffer circuit, a data input/output buffer circuit, a control input buffer circuit (not shown). In addition, programming and erasing mean a transition (switching) between the two resistive characteristics (low resistance state and high resistance state) of a variable resistive element comprising memory cells, to be discussed later, and a transition from one resistive characteristic to the other is defined as programming and a transition in the reverse direction is defined as erasing.

The voltage switch circuit 17 provides the word line decoder 12 and the bit line decoder 13 with selected word line voltage, unselected word line voltage, selected bit line voltage and unselected bit line voltage necessary for readout, programming and erasing operations of the memory cell array 11. Vcc represents service voltage (supply voltage), Vss represents ground voltage, Vpp represents voltage for programming, Vee represents voltage for erasing, and Vr represents voltage for readout. In the configuration shown in FIG. 1, selected word line voltage in programming and erasing operations is supplied to the word line decoder 12 through the load resistive characteristic variable circuit 14.

Data readout is performed from the memory cell array 11 through the bit line decoder 13 and a readout circuit 15. The readout decoder 15 judges status of data, sends result thereof to the control circuit 16, and outputs it to the data line 19.

Figure 2:
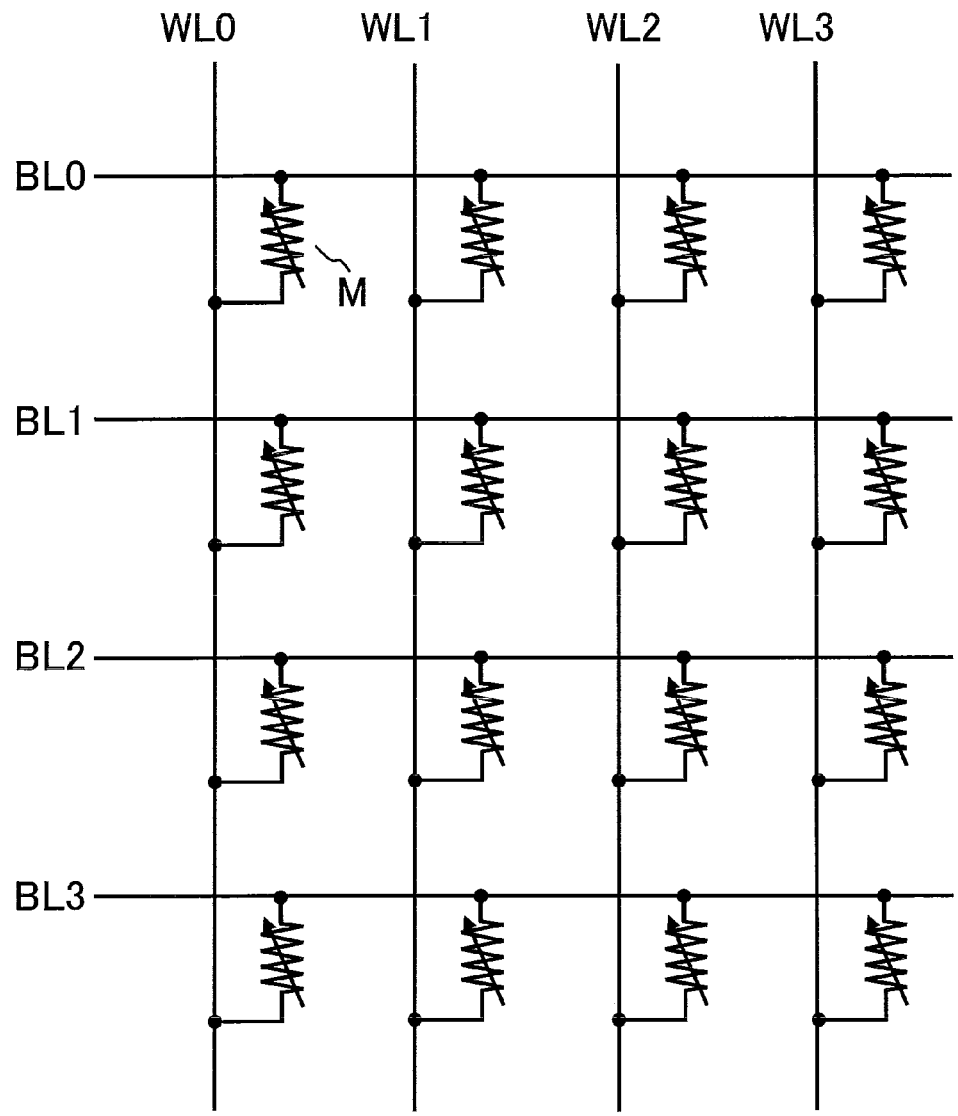
FIG. 2 is a circuit diagram showing a partial configuration of a cross point memory cell array.

FIG. 2 schematically shows partial configuration of the cross-point type memory cell array 11. In FIG. 2, in the memory cell array 11, memory cells M are held at intersections of four bit lines BL0 to BL3 and four word lines WL0 to WL3. As shown in FIG. 2, the memory cell array 11 has the cross-point type memory cell array structure, wherein a plurality of memory cells M of two-terminal structure having variable resistive elements that store information as a result changes in electrical resistance are arranged in a row direction and in a column direction, respectively. It comprises a plurality of word lines extending in the row direction and a plurality of bit lines extending in the column direction, wherein each of the memory cells in the same row has one end connected to a common word line, and each of the memory cells in the same column has the other end connected to a common bit line.

As each memory cell constituting the memory cell array 11 of the device of the present invention 10, a memory cell configured as follows is assumed: when voltage pulses for writing (for programming and for erasing) are applied between two terminals of the variable resistive element having two-terminal structure, resistive characteristics specified by current-voltage characteristics of the variable resistive element change, i.e., electrical resistance changes under certain bias conditions, which thus enables programming of information.

Figure 3:
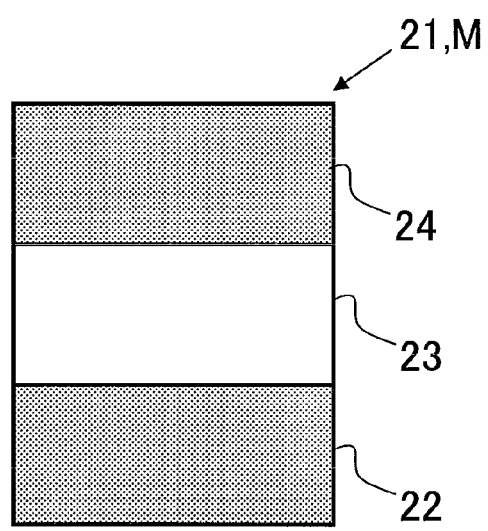
FIG. 3 is a schematic vertical sectional view of memory cells only consisting of variable resistive elements in the cross point type memory cell array shown in FIG. 2.

FIG. 3 is a schematic sectional structure diagram showing the variable resistive element constituting the memory cell. As shown in FIG. 3, a variable resistive element 21 constituting the memory cell M has a three-layer structure including a lower electrode 22, a variable resistor 23, and an upper electrode 24. In addition, although the variable resistor 23 is sandwiched between two electrodes of the lower electrode 22 and the upper electrode 24, in a vertical direction in FIG. 3, a direction the variable resistor 23 is sandwiched is not limited to the vertical direction (that is, a direction perpendicular to a substrate surface) and the variable resistor 23 may be sandwiched between the two electrodes formed in a direction parallel to the substrate surface. The following description will be made assuming that the variable resistive element 21 has the configuration in which the variable resistor 23 is sandwiched between the two electrodes formed in the vertical direction as shown in FIG. 3.

Figure 4:
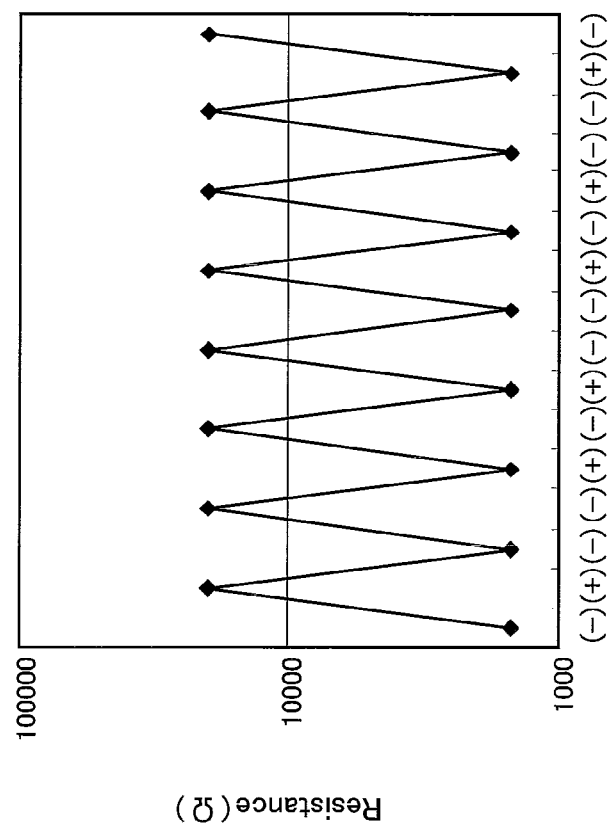
FIG. 4 is a view showing switching characteristics of the variable resistive element having the configuration shown in FIG. 3.

The variable resistive element 21 composing the memory cell in the device of the present invention is configured such that upper and lower sides thereof are asymmetric. For example, the lower electrode 22 and the upper electrode 24 are formed of different metal materials, or have different electrode areas. Alternatively, the asymmetric configuration of the upper and lower sides may be provided by differentiating a contact state of an interface between the variable resistor 23 and the lower electrode 22, from a contact state of an interface between the variable resistor 23 and the upper electrode 24. For example, the lower electrode 22 is formed of TiN, the variable resistor 23 is formed of titanium oxynitride ($TiO_xN_y$) by oxidizing an upper surface of the TiN electrode, and the upper electrode 24 is formed by depositing Pt, TiN, W, Co, Ni or the like thereon. That is, each memory cell in the memory cell array 11 of the device 10 of the present invention includes the vertically asymmetric variable resistive element 21, and the above-described bipolar switching can be implemented when voltages having both positive and negative polarities are applied. For example, the resistive characteristics of the variable resistive element 21 can be switched between the low resistance state and the high resistance state by alternately applying a first writing voltage in which the upper electrode 24 shows a negative polarity based on the lower electrode 22, and a second writing voltage in which it shows a positive polarity as an opposite polarity, to both ends of the variable resistive element 21 for a predetermined period of time. FIG. 4 is a graph showing a change in resistive characteristics of the variable resistive element 21 when −3 V as the first writing voltage and +3 V as the second writing voltage are applied alternately for 30 ns. Thus, according to the variable resistive element 21 of the device 10 of the present invention, the resistive characteristics thereof can be switched, that is, the variable resistive element 21 shows the bipolar switching characteristics when the voltages of positive and negative polarities are applied alternately.

One reason that the above variable resistive element 21 shows the bipolar switching characteristics are believed that it has a Schottky junction. That is, as described above, a material constituting the variable resistor 23 that contributes to the resistance change is formed by oxidizing the surface of the lower electrode 22 (TiN), in the variable resistive element 21. The variable resistor 23 is composed of the titanium oxynitride and has a thin film structure in which oxygen concentration is highest at a surface and nitrogen concentration becomes continuously high toward inside. That is, an ohmic contact is provided at a boundary between the lower electrode 22 and the variable resistor 23 due to continuous composition change. Meanwhile, since the upper electrode 24 is formed by depositing a new electrode material on the variable resistor 23, discontinuous composition change is formed at an interface between the upper electrode 24 and the variable resistor 23. The variable resistor 23 shows N-type conductivity because an impurity is introduced and oxygen is lost during a manufacturing process. When a metal having a relatively large work function such as Pt, TiN, W, Co, or Ni is used for the upper electrode, the Schottky junction is formed at the interface with the upper electrode, so that the condition of the bipolar switching is satisfied.

Figure 5:
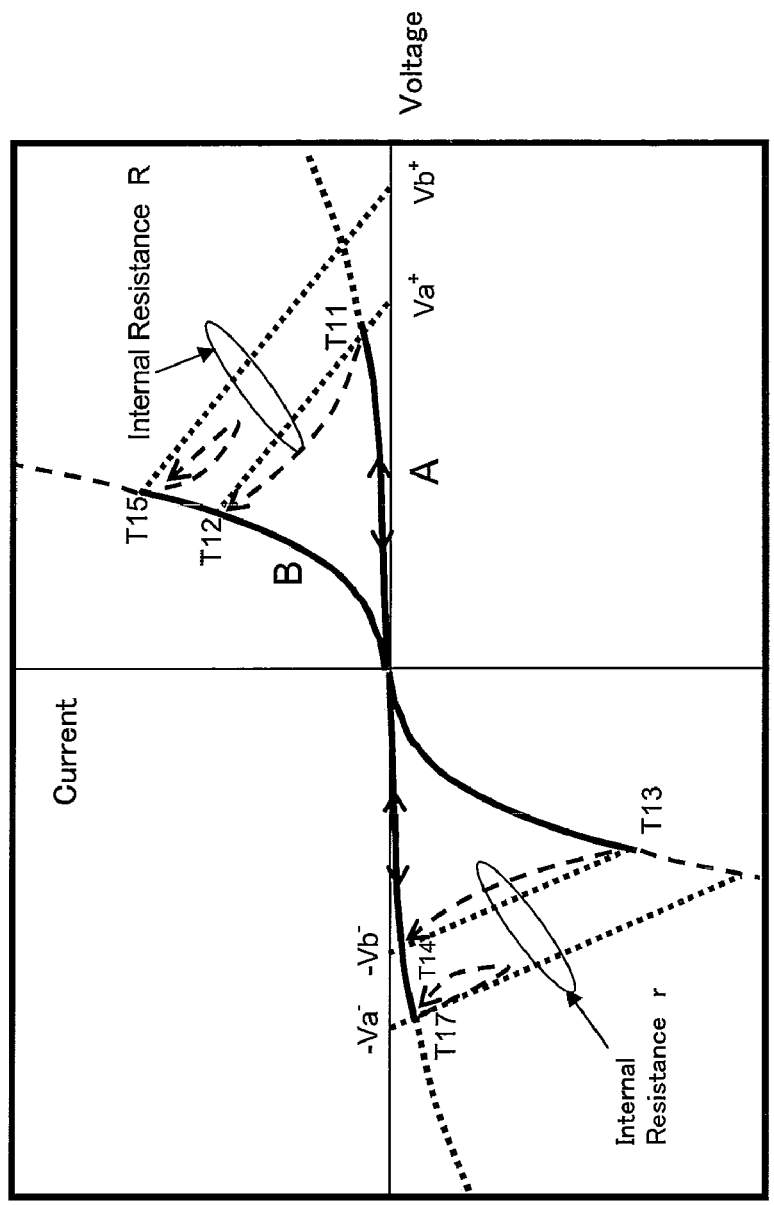
FIG. 5 is a view showing one example of current-voltage characteristics of a variable resistive element having an asymmetric structure.

FIG. 5 shows one example of current-voltage characteristics of the variable resistive element 21 having the asymmetric structure. In addition, FIG. 5 is provided such that the resistance component of the variable resistive element 21 is decomposed to a variable resistance component Rv transiting between the low resistance state and the high resistance state based on the applied voltage, and an asymmetric resistance component Rc whose value is not changed depending on the amount of the applied voltage but changed depending on the polarity of the applied voltage, and the graph is made of the state of the variable resistance component Rv regarding the asymmetric resistance component Rc as an internal resistance. That is, in FIG. 5, when the transit phenomenon is generated between the low resistance state and the high resistance state, the applied voltage required to generate the transit phenomenon corresponds to a voltage value shown at a point where an extended line connecting a point (characteristic point) showing the state before the transition to a characteristic point after the transition crosses a voltage axis, in the I-V characteristic curves in FIG. 5. One example will be described hereinafter. In order to transit (the state of the variable resistance component Rv of) the variable resistive element 21 from a characteristic point T11 to a characteristic point T12, it is necessary to apply a voltage $Va^+$ shown at a point where a line connecting the characteristic point T12 to the characteristic point T11 and extending toward the side of the characteristic point T11 crosses the voltage axis, to both ends of the variable resistive element 21. In addition, in FIG. 5, R designates the internal resistance Rc when the positive voltage is applied, and r designates the internal resistance Rc when the negative voltage is applied.

As shown in FIG. 5, according to the variable resistive element having the asymmetric characteristics, the magnitude relations of the absolute values of the threshold voltages are reversed according to the polarity of the applied voltage. More specifically, in the case of the positive polarity, the threshold voltage $Va^+$ to cause a transition from the high resistance state to the low resistance state is lower than a threshold voltage $Vb^+$ to cause a transition from the low resistance state to the high resistance state, while in the case of the negative polarity, an absolute value $Va^-$ of a threshold voltage to cause the transition from the high resistance state to the low resistance state is larger than an absolute value $Vb^-$ of a threshold voltage to cause the transition from the low resistance state to the high resistance state. In other words, when the positive voltage that is equal to or higher than $Va^+$ but lower than $Vb^+$ is applied to both ends of the variable resistive element 21, the transition from the high resistance state (A) to the low resistance state (B) can be stably made, and when the negative voltage having an absolute value that is equal to or higher than Vb− but lower than $Va^-$ is applied to both ends of the variable resistive element 21, the transition from the low resistance state (B) to the high resistance state (A) can be stably made.

Figure 6:
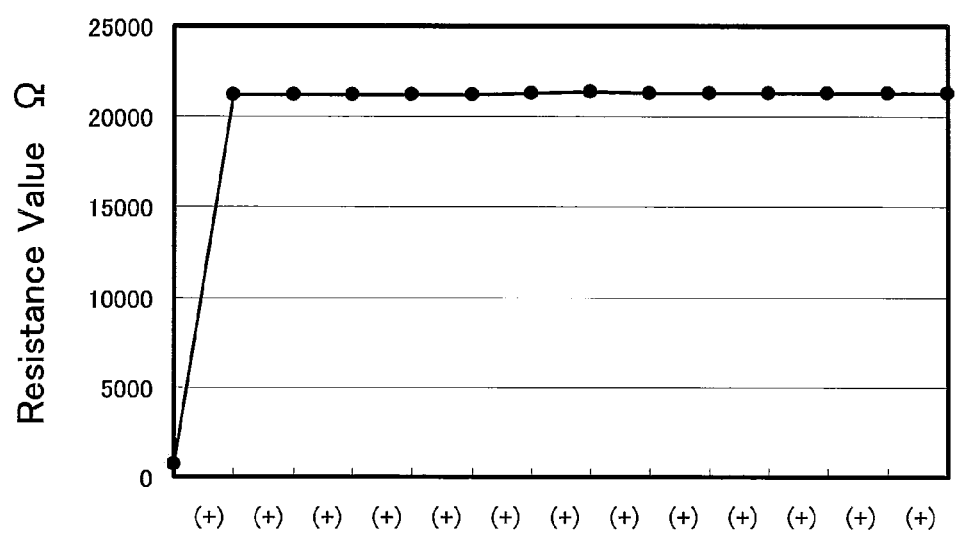
FIG. 6 is a view showing resistive characteristics of the variable resistive element showing the asymmetric structure.

Meanwhile, when voltages having the same polarity are applied to the variable resistive element 21, the resistive characteristics are kept constant and not changed. FIG. 6 is a graph showing a change in resistance state after the positive voltages are applied repeatedly for the same period of time as in the above switching operation, in which the resistance state is not changed by the voltage application. That is, according to FIGS. 4 and 6, it can be understood that when the voltages having positive and negative polarities are applied alternately for the same period of time to both ends of the variable resistive element having the asymmetric structure, the variable resistive element shows the switching characteristics in which the transition is made between the low resistance state and the high resistance state alternately, but when the voltages having the same polarity (only the positive polarity or the negative polarity) are sequentially applied for the same period of time, the variable resistive element does not show the switching characteristics.

When the transition is made from the high resistance state to the low resistance state or when the transition is made from the low resistance state to the high resistance state in FIG. 5, an inclination of the line connecting the I-V characteristic point before the transition to the I-V characteristic point after the transition is determined based on the resistance component in the variable resistive element 21. That is, the resistance of the variable resistive element 21 can be decomposed to the variable resistance Rv mainly attributed to the variable resistor 23, and the predetermined internal resistance Rc determined by the interface state or the like between the variable resistor 23 and the upper electrode 24 or the lower electrode 22, and they can be regarded as being connected in series.

For example, referring to FIG. 5, when a transition is made from the high resistance state to the low resistance state by applying the voltage Va+ to both ends of the variable resistive element 21 (a transition from the characteristic point T11 to the characteristic point T12), the variable resistance Rv is changed from the high resistance state to the low resistance state, so that the resistance ratio between the variable resistance Rv and the internal resistance Rc is changed. Meanwhile, since the voltage applied to both ends of the variable resistive element 21 is not changed before and after the change of the variable resistance Rv, the voltage applied to both ends of the variable resistance Rv is determined by dividing the voltage applied to both ends of the variable resistive element 21 by the resistance ratio between the variable resistance Rv and the internal resistance Rc, so that the voltage applied to both ends of the variable resistance Rv is lowered because the value of the variable resistance Rv is reduced. That is, in FIG. 5, the voltage value at the characteristic point T12 is smaller than that of the characteristic point T11.

Meanwhile, when a transition is made from the low resistance state to the high resistance state by applying the voltage −Vb− to both ends of the variable resistive element 21 (a transition from the characteristic point T13 to the characteristic point T14), the description can be made similarly to the above. That is, the resistance ratio between the variable resistance Rv and the internal resistance Rc is changed because the value of the variable resistance Rv is increased, and the voltage applied to both ends of the variable resistance Rv determined by dividing the voltage applied to both ends of the variable resistive element 21 by the resistance ratio between the variable resistance Rv and the internal resistance Rc is increased. That is, in FIG. 5, the voltage value (absolute value) at the characteristic point T14 is larger than that of the characteristic point T13.

In addition, in FIG. 5, the inclination of the line between the characteristic points T11 and T12 and the inclination of the line between the characteristic points T13 and the T14 show asymmetric property. This asymmetric property is provided because the internal resistance Rc varies depending on the polarity of the voltage applied to both ends of the variable resistive element 21, that is, the positive and negative polarities of the upper electrode 24 with respect to the lower electrode 22, and resistance ratio between the variable resistance Rv and the internal resistance Rc varies depending on the polarity even when the variable resistance Rv is in the same high resistance state. Thus, the reason that the value of the internal resistance Rc varies depending on the polarity of the applied voltage lies in the fact that the Schottky junction is formed between the electrode and the variable resistor due to the vertically asymmetric configuration of the variable resistive element 21 as described above.

Thus, according to the above bipolar switching, the resistive characteristics of the variable resistive element 21 are changed by applying the positive and negative voltages alternately using the fact that the value of the internal resistance Rc varies depending on the polarity.

However, according to the structure of the device 10 of the present invention, when the load resistive characteristics of the load circuit are changed by using the load resistive characteristic variable circuit 14, the switching characteristics can be implemented by sequentially applying the voltage having the same polarity for the same period of time even in the variable resistive element 21 having the above-described asymmetric structure. This will be described in detail below.

The load resistive characteristic variable circuit 14 in the device 10 of the present invention can control the resistance value of the load resistance Rz connected to one end of the variable resistive element 21 in series. Since the voltage applied to both ends of the variable resistive element 21 can be controlled by changing the value of the load resistance Rz, the resistance state of the variable resistive element 21 can be changed within the range of the I-V characteristic graph shown in FIG. 5 by adjusting the level of the voltage applied to both ends of a serial circuit configured by the load resistance Rz and the variable resistive element 21, and the value of the load resistance Rz.

First, a description will be made of the fact that the resistance state of the variable resistive element 21 can be controlled by controlling the load resistance, assuming that the variable resistive element 21 only has the variable resistance Rv (the resistive characteristics are symmetric with respect to the positive and negative polarities of the applied voltage) to facilitate the understanding of the description, and then a description will be made of the case where the internal resistance Rc of the variable resistive element 21 is taken into consideration (the resistive characteristics become asymmetric between the positive and negative polarities of the applied voltage).

First, a description will be made of the case where the resistive characteristics of the variable resistive element 21 show the symmetric property with respect to the positive and negative polarities. According to such variable resistive element 21, since the resistive characteristics when the positive voltage is applied and the resistive characteristics when the negative voltage is applied are symmetric, the description will be made below with reference to the resistive characteristics shown when the positive voltage is applied.

Figure 7A:
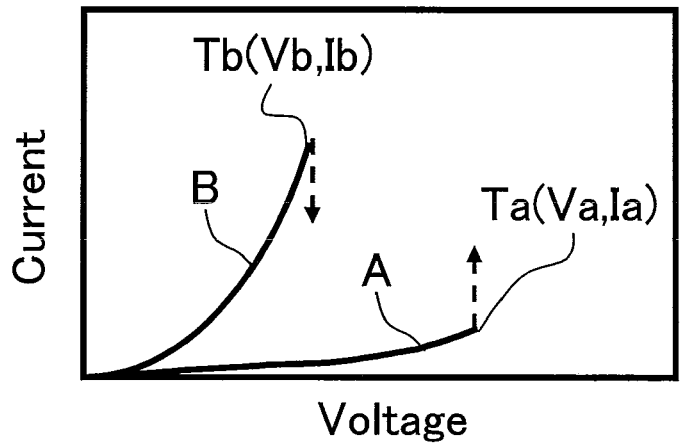
FIGS. 7A to 7C includes two types of current-voltage characteristic diagrams: one is the current-voltage characteristic diagram showing two resistive characteristics of the high resistance state and the low resistance state when the resistive characteristics of the variable resistive element was measured without going through load resistance, and the other is the current-voltage characteristic diagrams showing two resistive characteristics of the high resistance state and the low resistance state when the measurement was taken through load resistance.
Figure 7B:
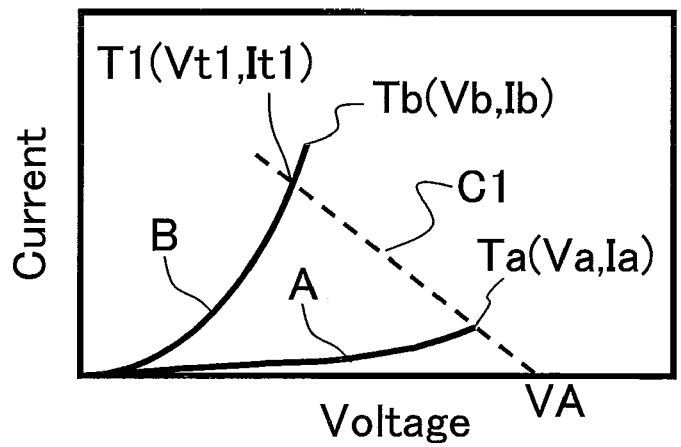

FIG. 7A is the I-V characteristic curve showing two resistive characteristics of high resistance state (characteristics A) and low resistance state (characteristics B) of a variable resistive element when it is measured without going through load resistance. In the high resistance state, a transition from the high resistance state to the low resistance state occurs at a characteristic point Ta (Va, Ia). In the low resistance state, a transition from the low resistance state to the high resistance state occurs at a characteristic point Tb (Vb, Ib). Hereinafter, the absolute value Va of the voltage required for the transition from the high resistance state to the low resistance state is referred to as a "second threshold voltage", and the absolute value Vb of the voltage required for the transition from the low resistance state to the high resistance state is referred to as a "first threshold voltage". In addition, the absolute value Ia of the current when the voltage between both ends of the variable resistive element in the high resistance state is the second threshold voltage Va is referred to as a "second threshold current", and the absolute value Ib of the current when the voltage between both ends of the variable resistive element in the low resistance state is the first threshold voltage Vb is referred to as a "first threshold current".

First, we describe a range of load resistive characteristics desirable for a transition from the high resistance state to the low resistance state, and a range of drive voltage Vda (voltage amplitude of voltage pulses) to be applied to a serial circuit of a load circuit and a variable resistive element (memory cell). If load resistance of resistance value R1 is connected in series to a variable resistive element having the resistive characteristics shown in FIG. 7A, the load resistive characteristics passing through the characteristic point Ta (Va, Ia) are plotted as a straight line C1 in FIG. 7B. Then, the drive voltage Vda is defined as a "second critical voltage VA".

Here, FIG. 7A shows the case where the first threshold voltage Vb is lower than the second threshold voltage Va. In this case, although the transition from the low resistance state to the high resistance state can be stably made by applying the voltage that is equal to or higher than Vb but lower than Va, to the variable resistive element 21, even when the voltage equal to or higher than the second threshold voltage Va is applied, the low resistance state (characteristics B) is not stably provided since this voltage is equal to or higher than the first threshold voltage Vb. In other words, FIG. 7A shows the characteristics in which only the transition from the high resistance state to the low resistance state can be stably made.

In the characteristics shown in FIG. 7A, in order for the variable resistive element 21 to transit from the high resistance state to the low resistance state in a stable manner by changing the load resistance Rz, it is required that the load resistive characteristic line C1 intersect the I-V characteristic curve in the low resistance state at a point T1 (Vt1, It1) on the low voltage side of the characteristic point Tb (Vb, Ib) from the low resistance state to the high resistance state. In fact, the load resistance characteristic line C1 going through the characteristic point Ta in FIG. 7B can be expressed by the Equation (1):

$$V = -R1 \times (I-Ia) + Va \quad (1)$$

Now, in order to satisfy the above requirement, V<Vb should be satisfied when I=Ib. Thus, the Equation (1) and the condition lead to the following Equation (2):

$$(Va-Vb)/(Ib-Ia) < R1 \quad (2)$$

Now, the resistance value in the left term of the Equation (2) corresponds to the critical resistance value. The resistance value R1 corresponds to the first resistance value, and can be expressed by the following Equation (3) by using respective coordinate values of the characteristic point Ta (Va, Ia) and the intersecting point T1 (Vt1, It1).

$$R1 = (Va-Vt1)/(It1-Ia) \quad (3)$$

Furthermore, then, the voltage amplitude Vda of voltage pulses that have the variable resistive element transit from the high resistance state to the low resistance state through load resistance should have higher voltage than the second critical voltage VA. In fact, since the value obtained by substituting 0 for I in the Equation (1) showing the load resistive characteristic line C1 is the second critical voltage VA, the voltage amplitude Vda should satisfy the following Equation (4).

$$Vda > Va + R1 \times Ia \quad (4)$$

We continue to describe a range of load resistive characteristics desirable for a transition from the low resistance state to the high resistance state, and a range of drive voltage Vdb (voltage amplitude of voltage pulses) to be applied to a serial circuit of a load circuit and a variable resistive element (memory cell). If load resistance of resistance value R2 is connected in series to a variable resistive element having the resistive characteristics shown in FIG. 7A, the load resistive characteristics passing through the characteristic point Tb (Vb, Ib) are plotted as a straight line C2 in FIG. 7C. Then, the drive voltage Vdb is defined as a "first critical voltage VB". In order to perform a stable operation from the low resistance state to the high resistance state, it is required that the load resistive characteristic line C2 intersect the I-V characteristic curve in the high resistance state at a point T2 (Vt2, It2) on the low voltage side of the characteristic point Ta (Va, Ia) from the high resistance state to the low resistance state. In fact, the load resistance characteristic line C2 going through the characteristic point Tb in FIG. 7C can be expressed by the Equation (5):

$$V = -R2 \times (I-Ib) + Vb \quad (5)$$

Now, in order to satisfy the above requirement, V<Va should be satisfied when I=Ia. Thus, the Equation (5) and the condition lead to the following Equation (6):

$$(Va-Vb)/(Ib-Ia) > R2 \quad (6)$$

Now, the resistance value in the left term of the Equation (6) corresponds to the critical resistance value. The resistance value R2 corresponds to the second resistance value, and can be expressed by the following Equation (7) by using respective coordinate values of the characteristic point Tb (Vb, Ib) and the intersecting point T2 (Vt2, It2).

$$R2 = (Vt2-Vb)/(Ib-It2) \quad (7)$$

Furthermore, then, the voltage amplitude Vdb of voltage pulses that have the variable resistive element transit from the low resistance state to the high resistance state through load resistance should have higher voltage than the first critical voltage VB. In fact, since the value obtained by substituting 0 for I in the Equation (5) showing the load resistive characteristic line C2 is the first critical voltage VB, the voltage amplitude Vdb should satisfy the following Equation (8).

$$Vdb > Vb + R2 \times Ib \quad (8)$$

In the above description, although the second critical voltage VA and the first critical voltage VB are different, it is possible to set same voltage to voltage amplitude Vda of voltage pulses for having the variable resistive element from the high resistance state to the low resistance state and voltage amplitude Vdb of voltage pulses for having the variable resistive element from the low resistance state to the high resistance state, as far as they satisfy the Equations (4) and (8).

Figure 7C:
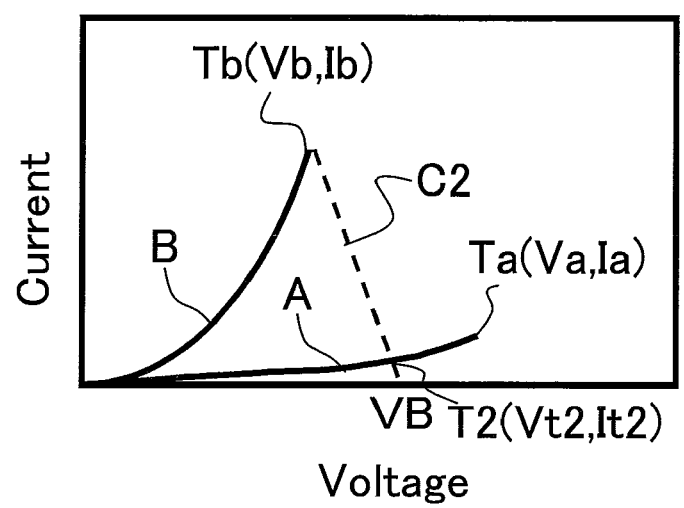

In this case, for instance, in switching operation from the low resistance state to the high resistance state, the voltage amplitude Vdb has considerably higher voltage than the first critical voltage VB, and in FIG. 7C, even if the load resistive characteristic line C2 moves in parallel to the right (the high voltage direction) and the intersection between the load resistive characteristic line C2 and the I-V characteristic curve in the high resistance state (characteristics A) moves to the high voltage side of the characteristic point Ta (Va, Ia), then bidirectional transitions occur between the high resistance state and the low resistance state, thus leading to unstable oscillation condition. However, when application of voltage pulses ends, the load resistive characteristic line C2 moves in parallel to the left (direction of low voltage) as the voltage amplitude Vdb lowers, and the intersection between the load resistive characteristic line C2 and the I-V characteristic curve in the high resistance state (characteristics A) moves to the low voltage side of the characteristic point Ta (Va, Ia). Thus, a transition to the high resistance state finally occurs and the resistive characteristics become stable in the high resistance state. Furthermore, in switching operation from the high resistance state to the low resistance state, the voltage amplitude Vda has considerably higher voltage than the second critical voltage VA, and in FIG. 7B, even if the load resistive characteristic line C1 moves in parallel to the right (the high voltage direction) and the intersection between the load resistive characteristic line C1 and the I-V characteristic curve in the low resistance state (characteristics B) moves to the high voltage side of the characteristic point Tb (Vb, Ib), then bidirectional transitions occur between the high resistance state and the low resistance state, thus leading to unstable oscillation condition. However, when application of voltage pulses ends, the load resistive characteristic line C1 moves in parallel to the left (direction of low voltage) as the voltage amplitude Vda lowers, and the intersection between the load resistive characteristic line C1 and the I-V characteristic curve in the low resistance state (characteristics B) moves to the low voltage side of the characteristic point Tb (Vb, Ib). Thus, a transition to the low resistance state finally occurs and the resistive characteristics becomes stable in the low resistance state. Then, due to the above, it is possible to set the voltage amplitude Vda and the voltage amplitude Vdb to same voltage in the device of the present invention.

In view of the above consideration, when the internal resistance Rc of the variable resistive element 21 is considered, that is, when the resistive characteristics become asymmetric based on the positive and negative applied voltages, a description will be made below of a case where the transition of the resistance state of the variable resistive element 21 is controlled by switching the load resistance Rz. Here also, the description will be made of the variable resistive element 21 showing the I-V characteristics in FIG. 5.

Figure 8:
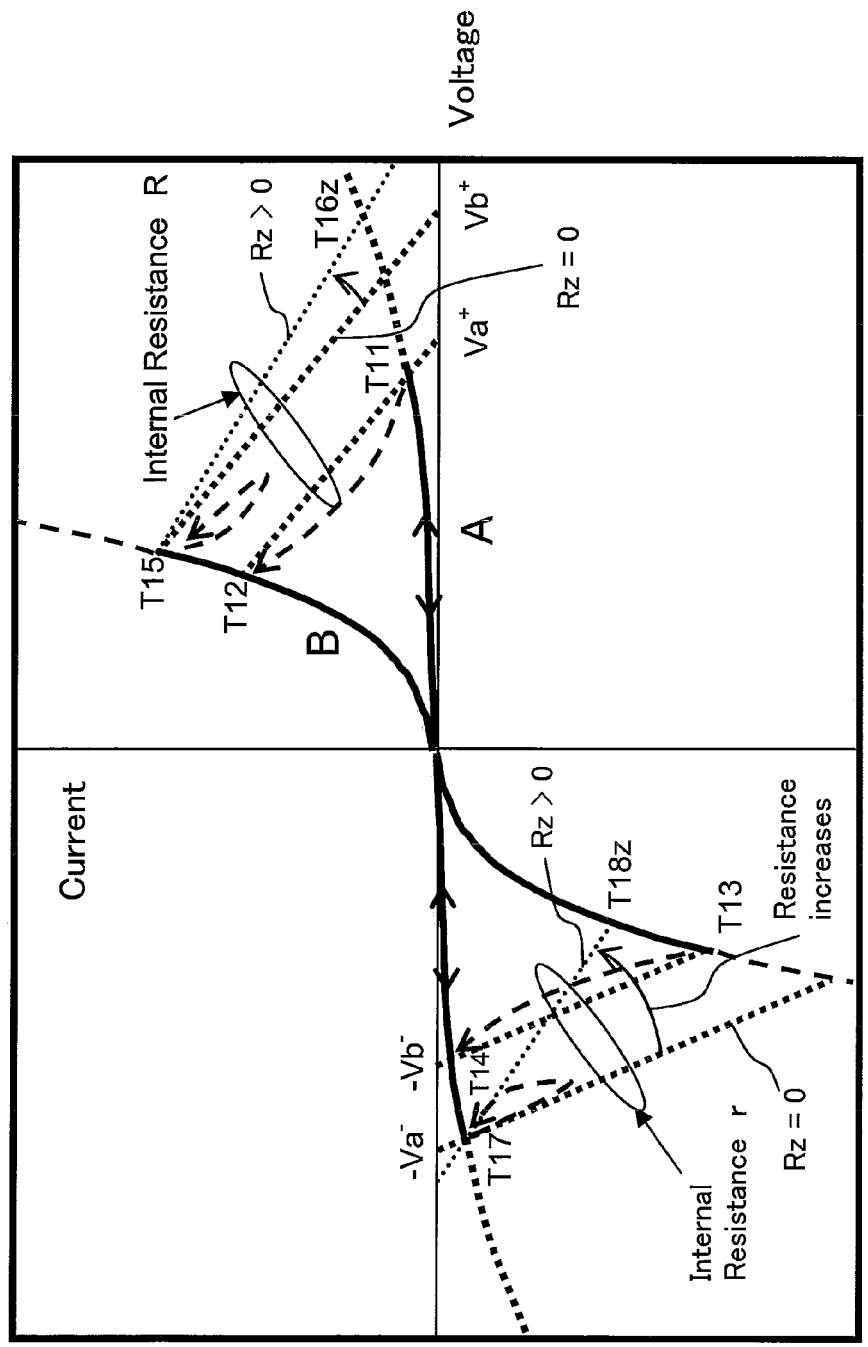
FIG. 8 is a view showing one example of the current-voltage characteristics of the variable resistive element showing the asymmetric structure.

The graph of the I-V characteristics in FIG. 5 shows a relation between the voltage applied to both ends of the serial circuit of the load resistance Rz and the variable resistive element 21 and the current flowing in the serial circuit under the condition that the load resistance Rz=0. Thus, as the load resistance Rz is sequentially increased from this state, since the load resistance Rz is connected to the internal resistance Rc in series, it is equivalent to adding the resistance value of the load resistance Rz to the resistance value of the internal resistance Rc in FIG. 5, so that the load resistance component (Rc+Rz) connected in series to the variable resistance component Rv (showing the symmetric property) in the variable resistive element 21 is increased (the inclination of the load resistance component in FIG. 5 becomes gentle). A description will be made of the above with reference to FIG. 8 shown in the same way as FIG. 5.

When the load resistance Rz is not considered, that is, when the load resistance Rz=0, according to the above consideration, in the case where the positive voltage is applied, although the transition from the high resistance state (A) to the low resistance state (B) can be stably made, the transition from the low resistance state (B) to the high resistance state (A) cannot be stably made. Meanwhile, in the case where the negative voltage is applied, although the transition from the low resistance state (B) to the high resistance state (A) can be stably made, the transition from the high resistance state (A) to the low resistance state (B) cannot be stably made. Therefore, when it is assumed that the transition from the low resistance state (B) to the high resistance state (A) can be stably made with the positive voltage by increasing the load resistance Rz to a predetermined value Z (>0), the switching characteristics are provided in response to only the application of the positive voltage (unipolar switching), by the switching control of the value of the load resistance Rz. Similarly, when it is assumed that the transition from the high resistance state (A) to the low resistance state (B) can be stably made with the negative voltage by setting the load resistance Rz to a predetermined value Z (>0), the switching characteristics are provided in response to only the application of the negative voltage (unipolar switching), by the switching control of the value of the load resistance Rz. In other words, since the switching characteristics can be provided in response to the applied voltage having the same polarity, the advantage of the unipolar switching can be obtained. In view of the above consideration, it will be verified whether the transition from the low resistance state to the high resistance state can be stably made in response to the application of the positive voltage and whether the transition from the high resistance state to the low resistance state can be stably made in response to the application of the negative voltage, by changing the value of the load resistance Rz.

First, it will be verified whether or not the transition from the low resistance state (B) to the high resistance state (A) can be stably made in the range of the positive polarity, by increasing the value of the load resistance Rz. That is, referring to FIG. 8, when the load resistance Rz is increased after the voltage is applied to satisfy the characteristic point T15 (or at the same time of this application), the resistive characteristics of the variable resistive element 21 transit to the high resistance state, and the characteristic point is moved from T15 to T16z. However, since the voltage at the T16z is higher than the voltage at the characteristic point T11 to cause the transition from the high resistance state to the low resistance state, the resistance state cannot be stable in the high resistance state and becomes an oscillation state. That is, even when the value of the load resistance Rz is changed, the transition from the low resistance state (B) to the high resistance state (A) still cannot be stably made in the range of the positive polarity, and the unipolar switching cannot be performed.

Next, it is verified whether or not the transition from the high resistance state (A) to the low resistance state (B) can be stably made in the range of the negative polarity, by increasing the value of the load resistance Rz. That is, referring to FIG. 9, when the load resistance Rz is increased after the voltage is applied to satisfy the characteristic point T17 (or at the same time of this application), the resistive characteristics of the variable resistive element 21 transit to the low resistance state, and the characteristic point is moved from T17 to T18z. Since the position of the characteristic point T18z is moved toward the origin as the value of the load resistance Rz is increased, when the value of the load resistance Rz is set so that at least the absolute value of the voltage at the characteristic point T18z may be smaller than the absolute value of the voltage at the characteristic point T13 to cause the transition from the low resistance state to the high resistance state, the transition from the high resistance state (A) to the low resistance state (B) can be stably made.

Consequently, the switching operation can be implemented only in the range of the negative polarity in the variable resistive element showing the I-V characteristics in FIG. 8, by adjusting the value of the load resistance Rz.

In other words, to implement the unipolar switching in the variable resistive element enabling the bipolar switching operation, the unipolar switching cannot be implemented by the positive or negative polarity, but under the state where the load resistance Rz is not considered, the unipolar switching can be implemented only by the polarity in which the first threshold voltage to be applied to both ends of the variable resistive element to cause the transition from the low resistance state to the high resistance state is lower than the second threshold voltage to be applied to both ends of the variable resistive element to cause the transition from the high resistance state to the low resistance state. Therefore, when the value of the load resistance is adjusted and the voltage of the polarity to satisfy the above condition is applied, since the resistive characteristics can be changed, the advantage of the unipolar switching can be obtained such that it is not necessary to apply both positive and negative voltages and the configuration of the memory cell can be simplified.

Thus, in order to implement the unipolar switching in the variable resistive element having the bipolar switching characteristics, since it is necessary to take care of the polarity of the applied voltage, when the memory cell is the 1D1R type having such a variable resistive element and a rectifying element, it is to be connected so as to be forward-biased when the voltage having the polarity enabling the unipolar switching operation is applied.

For example, when the unipolar switching can be implemented by applying the voltage enabling the upper electrode 24 to have the positive polarity with respect to the lower electrode 22, the unit memory cell can be formed when the rectifying element is connected so that forward bias can be applied when the positive voltage is applied as conceptually shown in FIG. 9A. Specifically, a PN junction diode is to be formed under the lower electrode 22 as shown in FIG. 9B, or a Schottky barrier diode is to be formed at an interface between an N-type polycrystalline semiconductor and the lower electrode 22 as shown in FIG. 9C.

Figure 10:
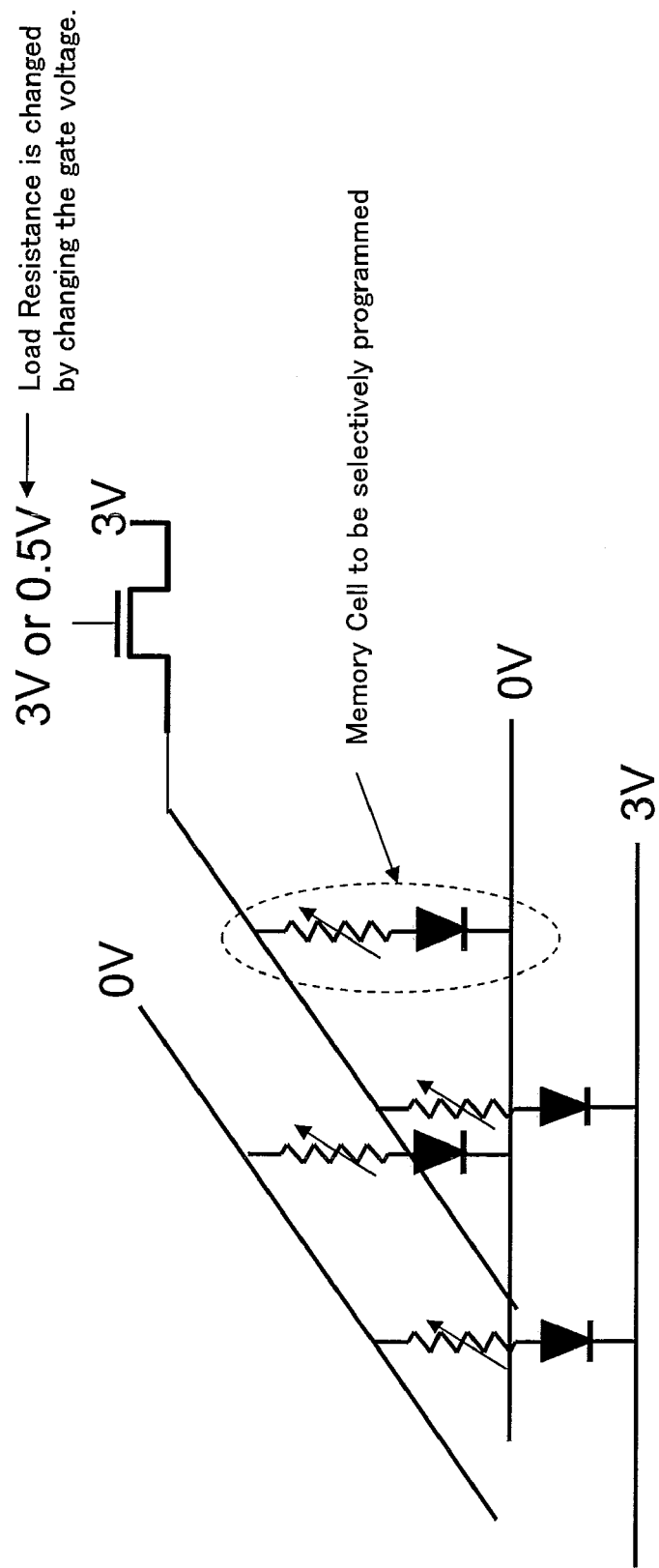
FIG. 10 is a circuit diagram of the nonvolatile semiconductor memory device according to the present invention.

Furthermore, as shown in a conceptual view in FIG. 10, a semiconductor memory device capable of performing a high-speed writing operation can be provided by arranging the memory cells having the above structure to form a circuit capable of changing the load resistance of a drive transistor connected to the word line or the bit line. Although the load resistance is changed by controlling a gate voltage of the drive transistor in FIG. 10, the same effect can be achieved, for example, when the load resistance is changed by switching the two transistors having different channel widths.

The above description has been made of the method for implementing the unipolar switching by adjusting the load resistance when the variable resistive element has the bipolar switching characteristics. Hereinafter, as a reference example, a brief description will be made of a case where the unipolar switching is implemented by adjusting a value of the load resistance when the variable resistive element does not have the bipolar switching characteristics, that is, when only the transition from the low resistance state to the high resistance state can be stably made by either the positive and negative polarities in the variable resistive element by itself.

Figure 11:
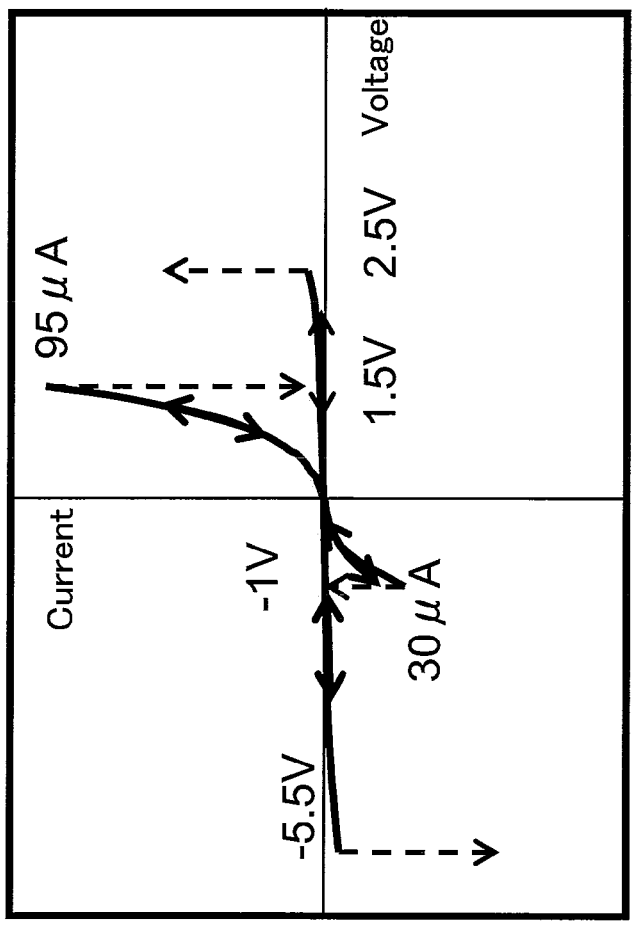
FIG. 11 is a view showing one example of the current-voltage characteristics of the variable resistive element.

For example, the lower electrode 22 is formed of copper, and the variable resistor 23 is formed by oxidizing the copper surface, and the upper electrode 24 is formed of Ti, Ta, and W in the structure shown in FIG. 3. FIG. 11 shows current-voltage characteristics (resistance characteristics) when a voltage is applied to both ends of the variable resistive element 21 having such a structure. Unlike the case where the lower electrode 22 is formed of TiN, a second threshold voltage required to make a transition from the high resistance state to the low resistance state is higher than a first threshold voltage required to make a transition from the low resistance state to the high resistance state in both the cases where the applied writing voltage is positive and negative. While the above structure shows, either in the positive or negative polarity, a stable transition from the low resistance state to the high resistance state, the stable transition from the high resistance state to the low resistance state cannot be made. That is, the variable resistive element 21 having the above structure cannot perform the switching operation by itself, so that it does not have the bipolar switching characteristics.

Figure 12:
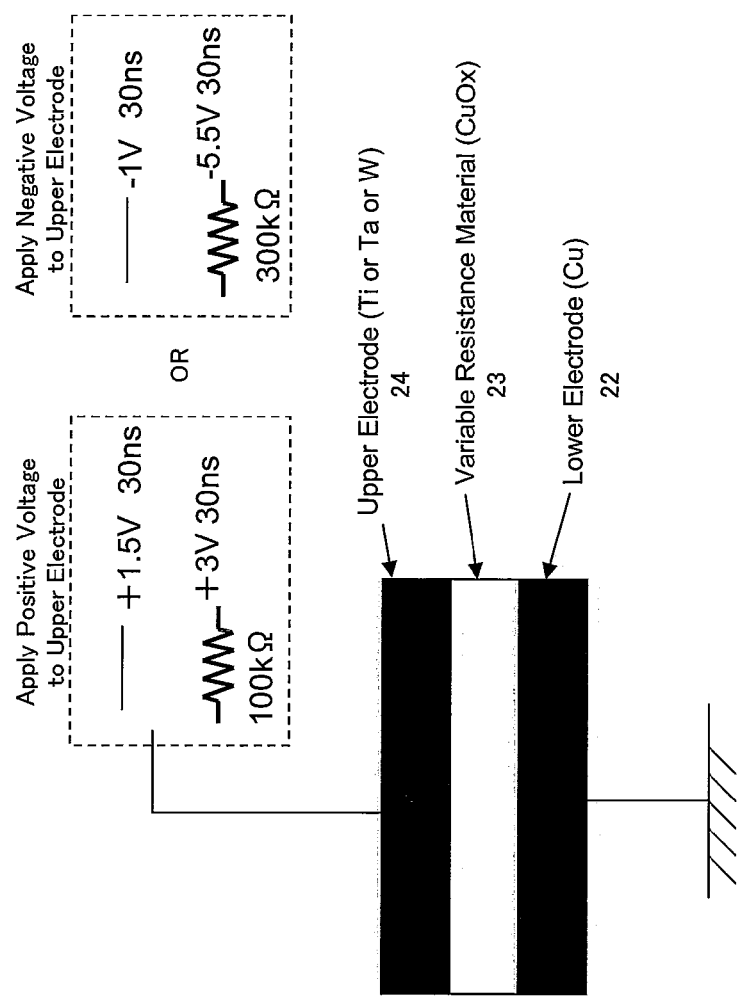
FIG. 12 is a view showing one example of a structure of the variable resistive element.
Figure 13:
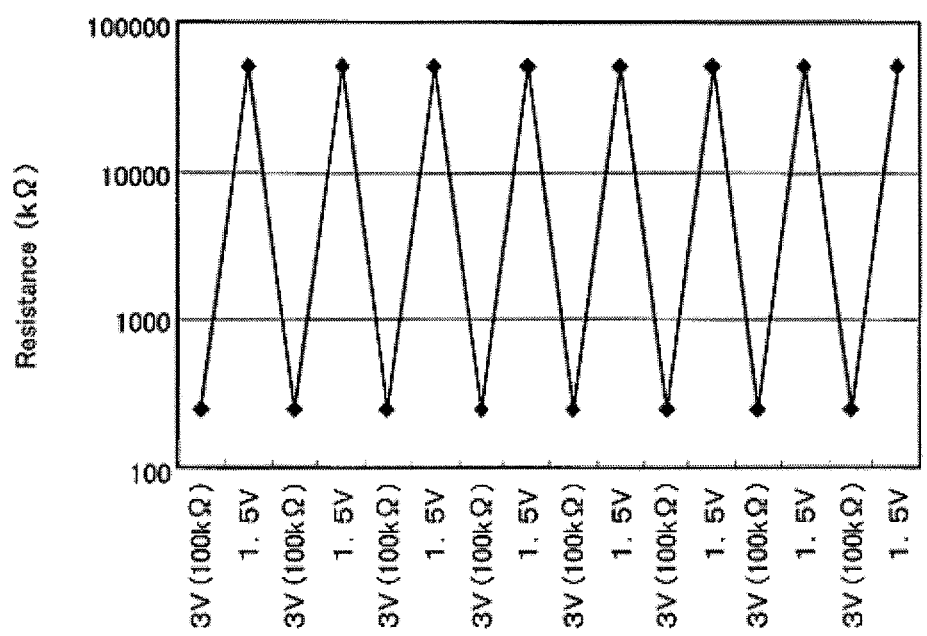
FIG. 13 is a view showing switching characteristics of the variable resistive element provided by switching a load resistance.

Based on the above technical concept, as shown in FIG. 12, a sequential switching can be implemented by either positive or negative voltage application in such variable resistive element 21 by connecting the load resistance to the variable resistive element in series and changing the load resistance. According to this example, in the case where the positive voltage is applied to the upper electrode 24, when the load resistance Rz of 100 kΩ is connected to change from a high resistance to a low resistance, the sequential switching can be implemented (refer to FIG. 13). FIG. 13 is a graph showing a resistance change of the variable resistive element 21, provided by alternately repeating the case where the positive voltage 1.5 V is applied for 30 ns without passing through the load resistance Rz (Rz=0) and the case where the positive voltage 3 V is applied for 30 ns through the load resistance Rz (Rz=100 kΩ).

Figure 14:
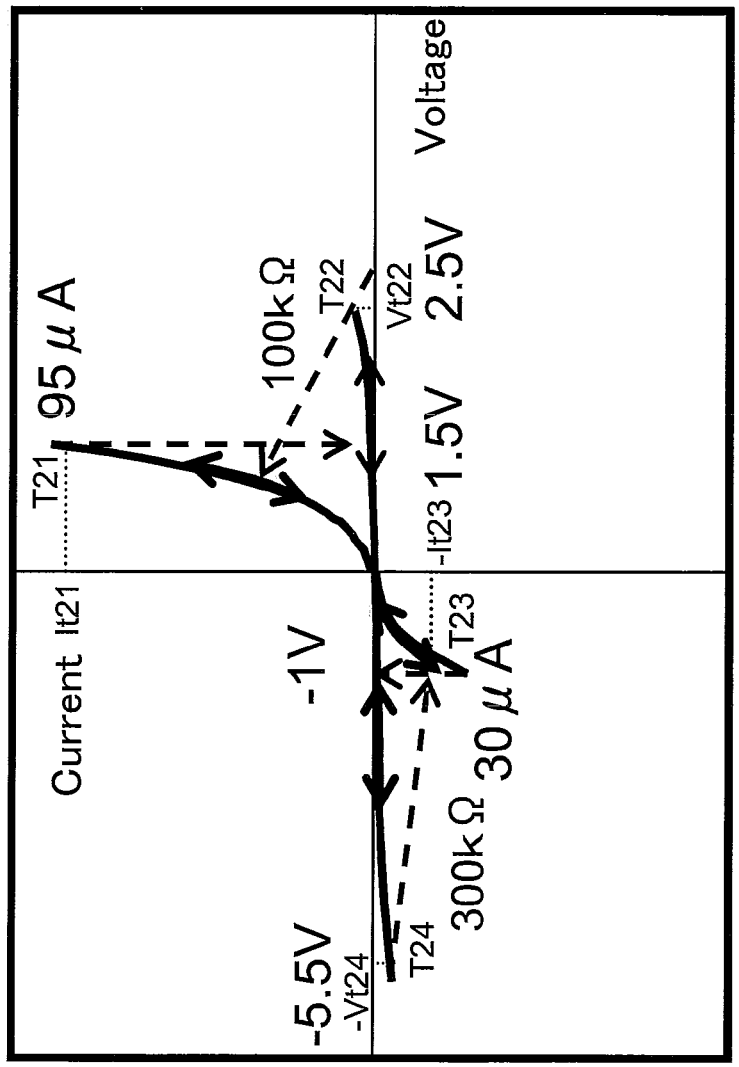
FIG. 14 is a view showing current-voltage characteristics of the variable resistive element provided by switching the load resistance.

Similarly, when the negative voltage is applied, the switching can be implemented by repeating the case where the negative voltage −1 V is applied for 30 ns without passing through the load resistance Rz (Rz=0) and the case where the negative voltage −5.5 V is applied for 30 ns through the load resistance Rz (Rz=300 kΩ). FIG. 14 shows I-V characteristics of the variable resistive element 21 when the resistive characteristics are changed under such conditions.

According to this structure, the material showing the resistance change is the copper oxide film formed by oxidizing the copper surface, and the film is a thin film in which an oxygen concentration is highest at a surface and the oxygen concentration becomes lower toward an inner side thereof. That is, the ohmic junction is formed between the lower electrode 22 and the variable resistor 23 due to the continuous composition change. Meanwhile, the interface having a discontinuous composition change is formed between the upper electrode 24 and the variable resistor 23. The variable resistive material has a property of P-type conductivity due to impurity introduction and oxygen loss. When a metal having a relatively small work function such as Ti, Ta, or W is used for the upper electrode 24, although the Schottky junction is formed at the interface between the variable resistor 23 and the upper electrode 24, extreme positive and negative asymmetric property shown in the above variable resistive element formed by oxidizing titanium nitride does not appear. That is, although the rates between the first threshold voltage and the second threshold voltage differ depending on the polarity, and the difference in work function is shown between the upper and lower electrodes, it does not cause their magnitude relation to be reversed.

As described above, in the case of the variable resistive element not showing the bipolar switching characteristics, either in the positive or negative polarity, the unipolar switching operation can be implemented by adjusting the value of the load resistance. That is, in the case of the 1D1R type memory cell, only the direction of the connected rectifying element based on the polarity of the applied voltage has to be decided. However, since the resistive characteristics differ a little depending on which polarity is used, the polarity to be used can be selected depending on the purpose. This case will be described with reference to FIG. 14.

For example, the absolute value of the threshold current to cause the transition from the low resistance characteristics to the high resistance characteristics is larger in the case where the positive voltage is applied to the upper electrode 24 than in the case where the negative voltage is applied to the upper electrode 24 (It21>It23 in FIG. 14). Meanwhile, the absolute value of the threshold voltage to cause the transition from the high resistance characteristics to the low resistance characteristics is larger in the case where the negative voltage is applied to the upper electrode 24 than in the case where the positive voltage is applied to the upper electrode 24 (Vt24>Vt22 in FIG. 14). In the case where the rectifying element is forwardly arranged when the negative voltage is applied to the upper electrode 24 as shown in FIG. 15, the current required for the writing operation can be small, and the writing speed of the memory block can be improved due to a reduction in current consumption and parallel writing. Meanwhile, it is necessary to set a reading current so as to be smaller since the resistance change occurs at a low current, and since the reading speed is a little slow, the structure is mainly advantageous in a memory having a relatively large size in which a design rule is 130 nm or more and a mobile memory. Meanwhile, in the case where the rectifying element is forwardly arranged when the positive voltage is applied to the upper electrode 24 as shown in FIG. 16, although the current required for the change from the low resistance to the high resistance is large, since the voltage for the change from the high resistance to the low resistance is low, the drive transistor can be used at a relatively low voltage, and the reading current can be sufficiently obtained, so that the reading operation can be performed at high speed. Thus, since the current required for the change from the low resistance to the high resistance is reduced due to miniaturization, the structure is advantageously used in a high-performance memory in which a design rule is 130 nm or less.

Respective threshold voltages or threshold currents and critical voltages or the like described above should be measured or evaluated by means of voltage pulses of pulse width as short as voltage pulses to be actually applied to the serial circuits of the load circuits and the memory cells. This is because each threshold voltage may change under the influence of voltage application duration when the resistive characteristics of the variable resistive element have remarkable temperature-responsiveness.

In addition, in the above description of the principle of operation and a method of determining optimal load resistive characteristics, although stand-alone load resistance having a linear load resistive characteristic is assumed as a load circuit, the load resistive characteristics are nonlinear in actual circuit configuration, as the load circuit includes transistors that have nonlinear current-voltage characteristics for selecting a word line or a bit line of the word line decoder 12 or the bit line decoder 13. Even when the load resistive characteristics are nonlinear, the idea about the above principle operation and the method of determining optimal load resistive characteristics would be same. However, as there are some points to be noted based on the current-voltage characteristics unique to MOSFET to be included in the load circuit, our description in the following assumes a stand-alone MOSFET having nonlinear load resistive characteristics.

Figure 17A:
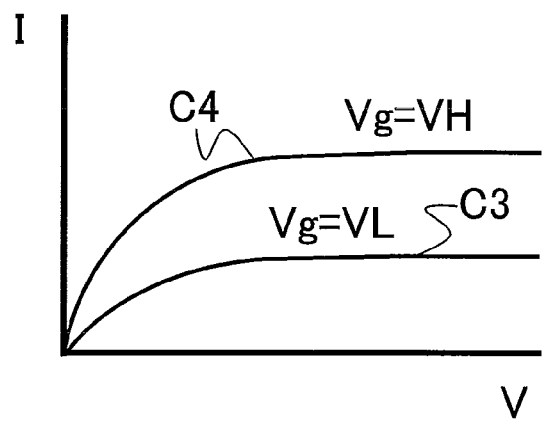
FIGS. 17A to 17C are a current-voltage characteristic diagram showing the load resistive characteristics of an MOSFET functioning as a load resistive characteristic variable circuit, and two types of current-voltage characteristic diagrams showing two resistive characteristics of a high resistance state and low resistance state of the variable resistive element when measured through the MOSFET as a load circuit.
Figure 17B:
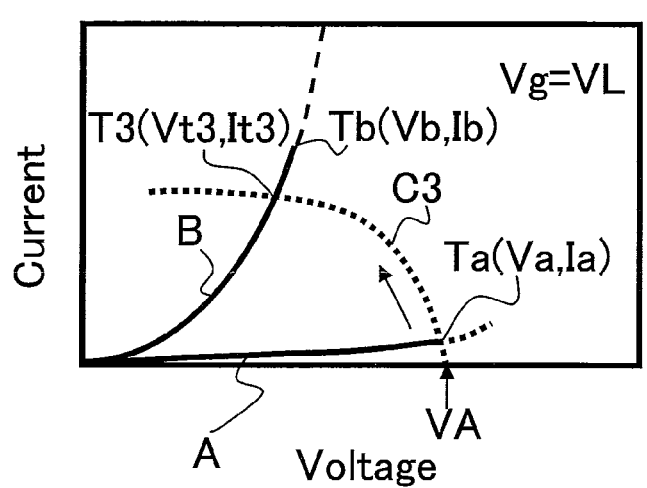
Figure 17C:
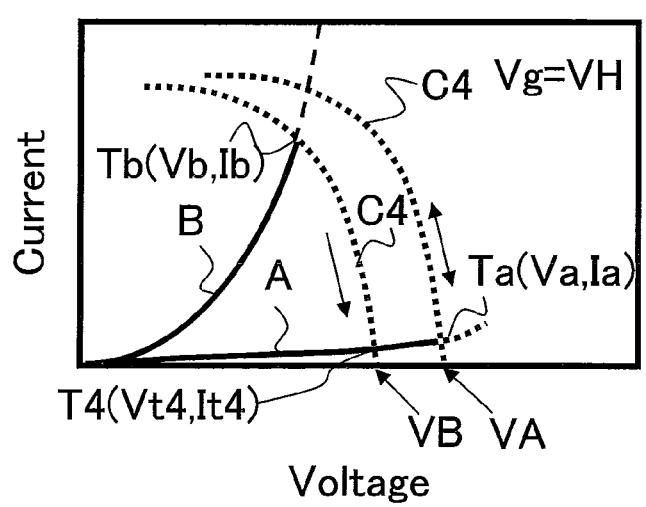

FIG. 17A shows load resistive characteristics C3, C4 specified by two current-voltage characteristics between source and drain at different gate voltages Vg of MOSFET. In fact, this MOSFET serves as a load resistive characteristic variable circuit 14 capable of switching load resistive characteristics by controlling the gate voltage. As shown in FIGS. 17B and 17C, the load resistive characteristics C3 having the lower gate voltage (Vg=VL) are used when the resistive characteristics of the variable resistive element transit from the high resistance state (characteristics A) to the low resistance state (characteristics B), while the load resistive characteristics C4 having the higher gate voltage (Vg=VH) are used when the resistive characteristics of the variable resistive element transit from the low resistance state (characteristics B) to the high resistance state (characteristics A).

First, we describe a range of load resistive characteristics desirable for the transition from the high resistance state to the low resistance state and a range of drive voltage Vda (voltage amplitude of voltage pulses) to be applied to a serial circuit of the load circuit and the variable resistive element (memory cell). If the variable resistive element has the resistive characteristics shown in FIG. 7A and the gate voltage of MOSFET is set to low level (VL) so as to use load resistive characteristics C3, the load resistive characteristics going through the characteristic point Ta (Va, Ia) are plotted like the curve C3 in FIG. 17B. The drive voltage Vda then is defined as the second critical voltage VA. In order to perform a stable operation from the high resistance state to the low resistance state, it is required that the load resistive characteristic line C3 intersect the I-V characteristic curve in the low resistance state at a point T3 (Vt3, It3) on the low voltage side of the characteristic point Tb (Vb, Ib) from the low resistance state to the high resistance state. In fact, since, to the two resistive characteristics shown in FIG. 7A, the load resistance characteristic line C3 going through characteristic point Ta in FIG. 17B and the intersecting point T3 (Vt3, It3) functions equivalent to load resistance of the first resistance value R3 defined by respective coordinate values of the characteristic point Ta (Va, Ia) and the intersecting point T3 (Vt3, It3) of the Equation (9) as shown below, and thus the load resistance characteristic line C3 is expressed by the Equation (10) if the load resistive characteristic is represented by the first resistance value R3 for convenience.

$$R3=(Va-Vt3)/(It3-Ia) \quad (9)$$

$$V=-R3\times(I-Ia)+Va \quad (10)$$

Now, in order to satisfy the above requirement, V<Vb should be satisfied when I=Ib. Thus, the Equation (10) and the condition lead to the following Equation (11). The resistance value in the left term of the Equation (11) corresponds to the critical resistance value.

$$(Va-Vb)/(Ib-Ia)<R3 \quad (11)$$

In addition, in MOSFET, even though voltage between source and drain has increased, increase in current is controlled when the voltage reaches a saturation region. Thus, the Equation (11) can be satisfied if the gate voltage is set so that the saturated current will be smaller than the current value (first threshold current) Ib at the characteristic point Tb (Vb, Ib).

Furthermore, as with the case in which linear load resistance is used, it is necessary that the voltage amplitude Vda of the voltage pulse for having the variable resistive element transit from the high resistance state to the low resistance state through MOSFET have higher voltage than the second critical voltage VA (Vda>VA). However, in FIG. 17B, the second critical voltage VA is given by a voltage value of the intersection of the load resistive characteristic curve C3 going through the characteristic point Ta (Va, Ia) and the voltage axis.

We continue to describe a range of load resistive characteristics desirable for a transition from the low resistance state to the high resistance state, and a range of drive voltage Vdb (voltage amplitude of voltage pulses) to be applied to a serial circuit of a load circuit and a variable resistive element (memory cell). If the variable resistive element has the resistive characteristics shown in FIG. 7A, and the gate voltage of MOSFET is set to high level (VH) so as to use load resistive characteristics C4, the load resistive characteristics going through the characteristic point Tb (Vb, Ib) are plotted like the curve C4 in FIG. 17C. Then, the drive voltage Vdb is defined as the first critical voltage VB. In order to perform stable operation from the low resistance state to the high resistance state, it is required that the load resistive characteristic line C4 intersect the I-V characteristic curve in the high resistance state at a point T4 (Vt4, It4) on the low voltage side of the characteristic point Ta (Va, Ia) from the high resistance state to the low resistance state. In fact, since, to the two resistive characteristics shown in FIG. 7A, the load resistance characteristic line C4 going through the characteristic point Tb in FIG. 17C and the intersecting point T4 (Vt4, It4) functions equivalent to load resistance of the second resistance value R4 defined by respective coordinate values of the characteristic point Tb (Vb, Ib) and the intersecting point T4 (Vt4, It4) of the Equation (12) as shown below, and thus the load resistance characteristic line C4 is expressed by the Equation (13) if the load resistive characteristics are represented by the second resistance value R4 for convenience.

$$R4=(Vt4-Vb)/(Ib-It4) \quad (12)$$

$$V=-R4\times(I-Ib)+Vb \quad (13)$$

Now, in order to satisfy the above requirement, V<Va should be satisfied when I=Ia. Thus, the Equation (13) and the condition lead to the following Equation (14). The resistance value in the left term of the Equation (14) corresponds to the critical resistance value.

$$(Va-Vb)/(Ib-Ia)>R4 \quad (14)$$

In addition, since the load resistive characteristic curve C4 needs to intersect the characteristic point Tb (Vb, Ib), the gate voltage should be set so that the saturated current of MOSFET can be larger than the current value Ib at the characteristic point Tb (Vb, Ib) (first threshold current).

Furthermore, then, as with the case in which linear load resistance is used, it is necessary that the voltage amplitude Vdb of the voltage pulse for having the variable resistive element transit from the low resistance state to the high resistance state through MOSFET have higher voltage than the first critical voltage VB (Vdb>VB). However, in FIG. 17C, the first critical voltage VB is given by a voltage value of the intersection of the load resistive characteristic curve C4 going through the characteristic point Tb (Vb, Ib) and the voltage axis.

In addition, due to similar reasons to those in the case in which linear load resistance is used, although the second critical voltage VA and the first critical voltage VB differ, it is possible to set them to same voltage as far as the condition that the voltage amplitude Vda of voltage pulses for having the variable resistive element transit from the high resistance state to the low resistance state has higher voltage than the second critical voltage VA (Vda>VA), and the condition that the voltage amplitude Vdb of voltage pulses for having the variable resistive element transit from the low resistance state to the high resistance state has higher voltage than the first critical voltage VB (Vdb>VB) are met, respectively.

Figure 18:
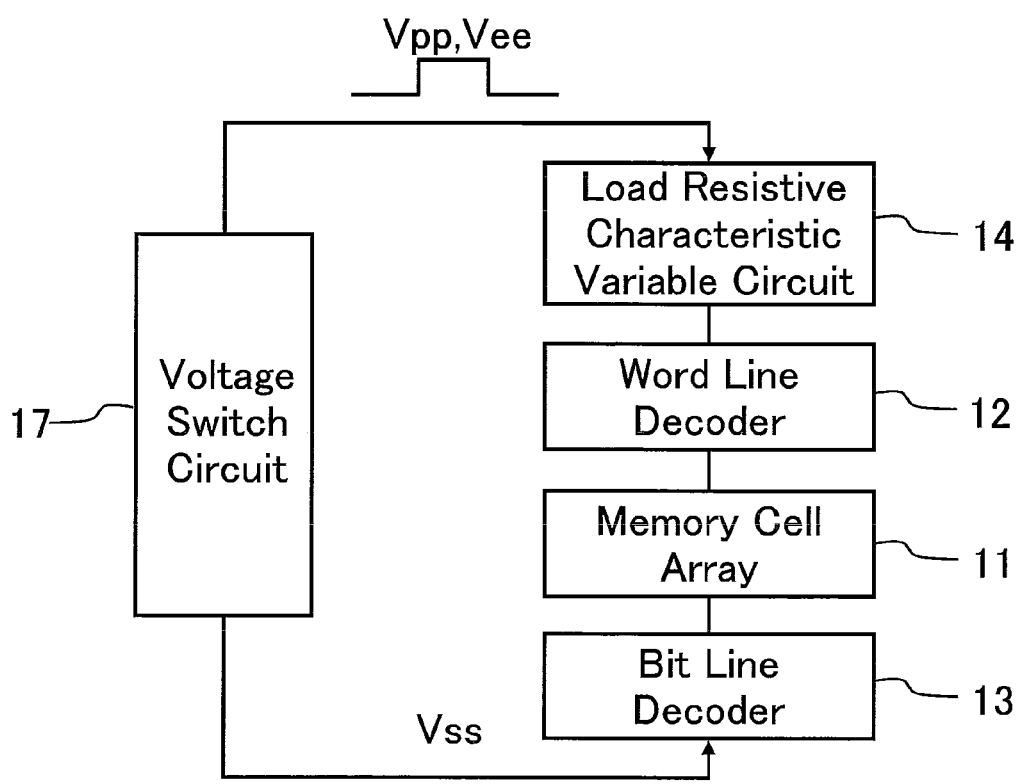
FIG. 18 is a block diagram schematically showing a relation among the variable resistive element of a selected memory cell to be written, the load circuit, and a voltage switch circuit.

In the following, we describe specific circuit configuration of the load resistive characteristic variable circuit 14, with reference to FIG. 18 and FIG. 19. FIG. 18 schematically shows a relation of the variable resistive element 21 of the selected memory cell to be written, the load circuit and the voltage switch circuit 17. In FIG. 18, the load circuit can be treated as all circuits excluding the selected memory cell in the circuit to which voltage pulses are applied from the voltage switch circuit 17, and include the word line decoder 12, the bit line decoder 13, the load resistive characteristic variable circuit 14, and parasitic resistance of signal wiring such as the selected word line or selected bit line or the like. Thus, the load resistive characteristics are assumed as the current-voltage characteristics of synthetic circuit of all circuits excluding the selected memory cell. In the example shown in FIG. 18, ground voltage Vss is applied to the selected bit line through the bit line decoder 13 from the voltage switch circuit 17, voltage for programming Vpp or voltage for erasing Vee are applied to the selected word line through the load resistance characteristic variable circuit 14 and the word line decoder 12. Although voltage for programming Vpp and voltage for erasing Vee are applied as voltage pulses to the selected word line, the pulse width (application duration) thereof is adjusted through control from the control circuit on the side of the voltage switch circuit 17 that supplies voltage for programming Vpp or voltage for erasing Vee, or on the side of the load resistive characteristic variable circuit 14 or the word line decoder 12 that is supplied with the voltage.

Figure 19A:
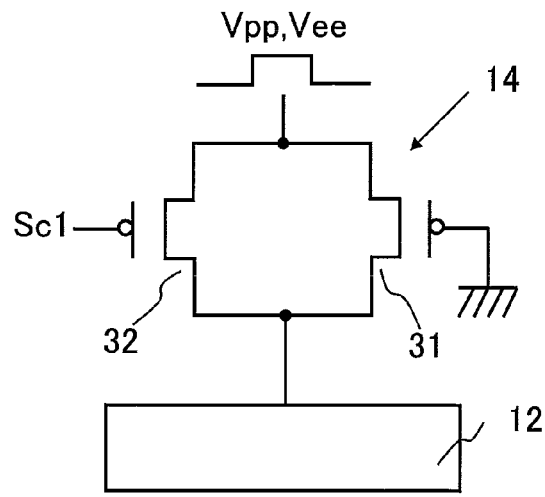
FIGS. 19A to 19E are circuit diagrams showing circuit configuration examples of the load resistive characteristic variable circuit.

FIGS. 19A to 19E show five examples of circuit configurations of the load resistive characteristic variable circuit 14. FIG. 19A shows the load resistive characteristic variable circuit 14 configured by parallel connection of P-type MOSFET 31 that is always in ON state and P-type MOSFET 32 that can be switched ON and OFF by a control signal Sc1. If the P-type MOSFET 31 and P-type MOSFET 32 are set to same size, switching of the load resistive characteristics as shown in FIG. 17A becomes possible by the control signal Sc1. In addition, use of a resistive element having linear or nonlinear resistive characteristics or a diode adapted to voltage polarities could also implement the load resistance characteristic circuit 14 capable of switching the load resistive characteristics by turning the P-type MOSFET 32 ON and OFF.

Figure 19B:
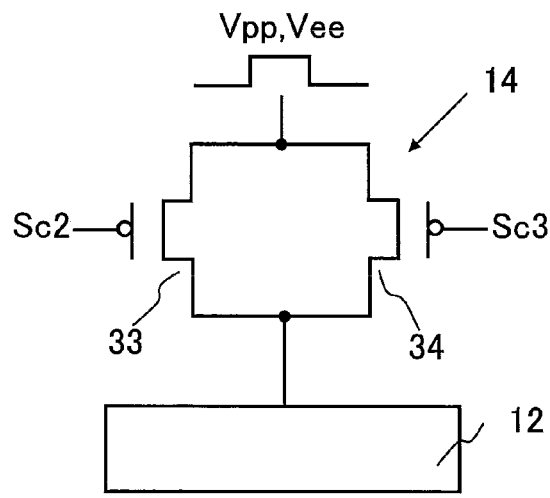

FIG. 19B shows the load resistive characteristic variable circuit 14 configured by parallel connection of P-type MOSFETs 33, 34 that can be switched ON or OFF by two control signals Sc2, Sc3. The P-type MOSFETs 33, 34 are controlled so that one is turned ON while the other is turned OFF. In the example shown in FIG. 19B, switching of the load resistive characteristics as shown in FIG. 17A becomes possible by making gate width or the like of the P-type MOSFETs 33, 34. In addition, the P-type MOSFETs 33, 34 may have same size and resistance component of different resistance values may be added in series to both or any one of them.

Figure 19C:
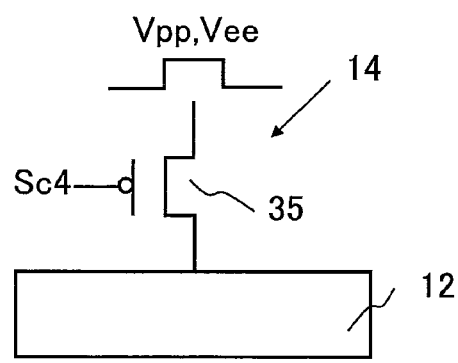

FIG. 19C shows the load resistive characteristic variable circuit 14 configured by one P-type MOSFET 35 that can control the gate voltage in multiple stages by one control signal Sc4. Switching of the load resistive characteristics as shown in FIG. 17A becomes possible, by configuring the control signal Sc4 so that one signal level for turning OFF the P-type MOSFET 35 and two signal levels for turning ON the P-Type MOSFET 35 can be outputted, and by switching the two signal levels for turning ON the P-type MOSFET 35.

Figure 19D:
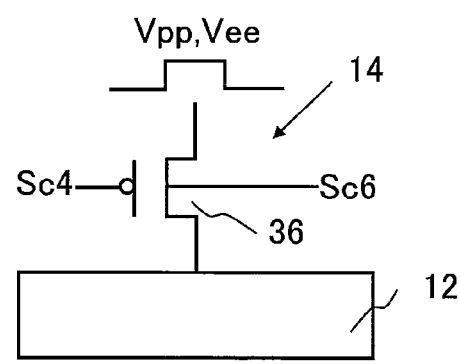

FIG. 19D shows the load resistive characteristic variable circuit 14 configured by one P-type MOSFET 36 that can control the gate voltage and back gate (substrate) voltage in two stages, respectively, with two control signals Sc5, Sc6. The control signal Sc5 controls whether to turn ON or OFF the P-type MOSFET 36, while the control signal Sc6 adjusts the back gate voltage of the P-type MOSFET 36, thus changing the threshold voltage. Switching of the load resistive characteristics as shown in FIG. 17A becomes possible by turning ON the P-type MOSFET 36 and switching the threshold voltage in two ways to high or low, with the back gate voltage.

Figure 19E:
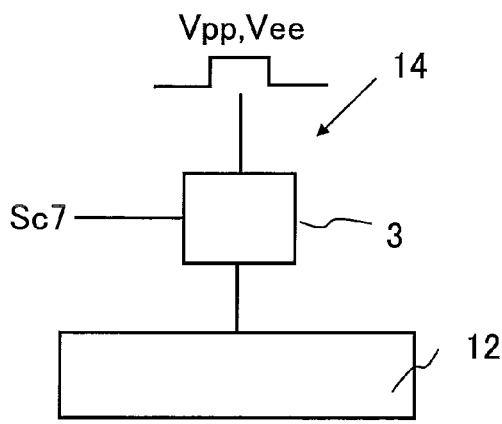

FIG. 19E shows the load resistive characteristic variable circuit 14 configured by one resistive control element 37 that can control the gate voltage in multiple stages with one control signal Sc7. As the resistive control element 37, a transfer gate composed of anything other than MOSFET or that composed of a single channel transistor or the like can be used. Switching of the load resistive characteristics becomes possible by switching signal levels of the control signal Sc7.

As shown in FIG. 1 and FIG. 18, in the above embodiment, we described the case in which the load resistive characteristic variable circuit 14 is provided between the voltage switch circuit 17 and the word line decoder 12, and voltage for programming Vpp and voltage for erasing Vee of same voltage polarity is applied to the load resistive characteristic circuit 14 from the voltage switch circuit 17. However, the load resistive characteristic variable circuit 14 is not limited to this configuration example, and may be provided within the word line decoder 12, between the word line decoder 12 and the memory cell array 11, between the bit line decoder 13 and the memory cell array 11, within the bit line decoder 13, between the bit line decoder 13 and the voltage switch circuit 17, or within the voltage switch circuit 17, for instance. In addition, if the load resistive characteristic variable circuit 14 is provided within the word line decoder 12 or the bit line decoder 13, a transistor for selecting a word line constituting the word line decoder 12 or that for selecting a bit line constituting the bit line decoder 13 may be configured by the same transistor as the load resistive characteristic variable circuit 14. In addition, the load resistive characteristic variable circuit 14 may not only be formed in one location, but also distributed in more than one location.

In addition, if the load resistive characteristic variable circuit 14 is configured by using MOSFET, depending on where it is formed or voltage polarity of voltage for programming Vpp and voltage for erasing Vee, N-type MOSFET may replace P-type MOSFET.

In the following, we describe the programming operation of the memory cells of the device of the present invention. In the following description, the programming operation is the case of having the resistive characteristics of the variable resistive element of the selected memory cell transit from the low resistance state to the high resistance state.

First, when the control circuit 16 is instructed by an address signal, a data entry signal, a control input signal, or the like from the external to program into a memory cell specified by the address signal, it activates the voltage switch circuit 17 and gives instruction to output voltage to be applied to each of the selected word line, unselected word line, selected bit line, and unselected bit line, during programming. The voltage switch circuit 17 supplies voltage for programming Vpp generated at the voltage generation circuit (not shown) to the word line decoder 12 through the load resistive characteristic variable circuit 14, supplies to the word line decoder 12 and the bit line decoder 13 programming inhibit voltage Vpp/2 that is one-half of the voltage for programming Vpp, and supplies ground voltage Vss to the bit line decoder 13. In addition, the control circuit 16 controls so that the load resistive characteristic variable circuit 14 can be load resistive characteristics for programming operation. In this embodiment, it controls so that the load resistive characteristics can be in the lower resistance state. As a result, by setting the voltage for programming Vpp higher than or equal to the above first critical voltage, voltage obtained by subtracting the voltage drop at the load resistive characteristic variable circuit 14 and the word line decoder 12 from the voltage for programming Vpp is applied to the selected word line through the load resistive characteristic variable circuit 14 and the word line decoder 12, while voltage increased from ground voltage Vss depending on the voltage drop at the bit line decoder 13 is applied to the selected bit line. Then, voltage higher than or equal to the first threshold voltage necessary for having the resistive characteristics transit from the low resistance state to the high resistance state is applied to both ends of the selected memory cell, the resistive characteristics transit from the low resistance state to the high resistance state, and programming completes. Then, as the variable resistive element transits to the high resistance state, a synthetic resistance value of the serial circuit of the load circuit and the memory cells increases, current flowing through the load circuit decreases, and voltage drop at the load circuit decreases. Thus, although voltage to be applied to both ends of the selected memory cell after transition to the high resistance state increases, the transition to the high resistance state occurs in a stable manner in a voltage condition in which voltage at both ends of the selected memory cell is lower than the second threshold voltage due to the load resistive characteristics selected by control of the load resistive characteristic variable circuit 14. As a result, the variable resistive element can maintain the high resistance state in a stable manner after voltage surges.

In addition, since voltage obtained by subtracting the voltage drop at the word line decoder 12 from the programming inhibit voltage Vpp/2 is applied to the unselected word line through the word line decoder 12 while voltage that increases by the voltage drop at the bit line decoder 13 from the programming inhibit voltage Vpp/2 is applied to the unselected bit line through the bit line decoder 13, no voltage is applied to the unselected memory cells that connect to the unselected word line and unselected bit line, and voltage obtained by subtracting the voltage drop at the word line decoder 12 and bit line decoder 13 from the programming inhibit voltage Vpp/2 is applied to the unselected memory cells that connect to the unselected word line and the selected bit line and those that connect to the selected word line and unselected bit line. Thus, any unwanted programming operation to the unselected memory cells can be prevented, by setting the voltage for programming Vpp so that at least the programming inhibit voltage Vpp/2 is lower than the first threshold voltage necessary for transiting the resistive characteristics from the low resistance state to the high resistance state.

In the following, we describe the erasing operation of memory cells. Now, the erasing operation is the case of having the resistive characteristics of the variable resistive element of the selected memory cell transit from the high resistance state to the low resistance state.

First, when the control circuit 16 is instructed by an address signal, a data entry signal, or a control input signal, etc. from the external to perform erasing of a target memory cell specified by the address signal, it activates the voltage switch circuit 17 and gives instruction to output voltage to be applied to each of the selected word line, unselected word line, selected bit line, and unselected bit line, during erasing. The voltage switch circuit 17 supplies voltage for erasing Vee of the same polarity as voltage for programming Vpp generated at the voltage generation circuit (not shown) to the word line decoder 12 through the load resistive characteristic variable circuit 14, supplies to the word line decoder 12 and the bit line decoder 13 erasing inhibit voltage Vee/2 that is one-half of the voltage for erasing Vee, and supplies ground voltage Vss to the bit line decoder 13. In addition, the control circuit 16 controls so that the load resistive characteristic variable circuit 14 can be load resistive characteristics for erasing operation. In this embodiment, it controls so that the load resistive characteristics can be in higher resistance state. As a result, by setting the voltage for erasing Vee higher than or equal to the above second critical voltage, voltage obtained by subtracting the voltage drop in the load resistive characteristic variable circuit 14 and the word line decoder 12 from the voltage for erasing Vee is applied to the selected word line through the load resistive characteristic variable circuit 14 and the word line decoder 12, while voltage increased from ground voltage Vss depending on the voltage drop at the bit line decoder 13 is applied to the selected bit line. Then, voltage higher than or equal to the second threshold voltage necessary for having the resistive characteristics transit from the high resistance state to the low resistance state is applied to both ends of the selected memory cell, the resistive characteristics transit from the high resistance state to the low resistance state, and erasing completes. Then, as the variable resistive element transits to the low resistance state, a synthetic resistance value of the serial circuit of the load circuit and the memory cells decreases, current flowing through the load circuit increases, and voltage drop at the load circuit increases. Thus, although voltage to be applied to both ends of the selected memory cell after transition to the low resistance state decreases, the transition to the low resistance state occurs in a stable manner in a voltage condition in which voltage at both ends of the selected memory cell is lower than the first threshold voltage due to the load resistive characteristics selected by control of the load resistive characteristic variable circuit 14. As a result, the variable resistive element can maintain the low resistance state in a stable manner after voltage surges.

In addition, since voltage obtained by subtracting the voltage drop at the word line decoder 12 from the erasing inhibit voltage Vee/2 is applied to the unselected word line through the word line decoder 12 while voltage that increases by the voltage drop at the bit line decoder 13 from the erasing inhibit voltage Vee/2 is applied to the unselected bit line through the bit line decoder 13, no voltage is applied to the unselected memory cells that connect to the unselected word line and unselected bit line, and voltage obtained by subtracting the voltage drop at the word line decoder 12 and bit line decoder 13 from the erasing inhibit voltage Vee/2 is applied to the unselected memory cells that connect to the unselected word line and the selected bit line and those that connect to the selected word line and unselected bit line. Thus, any unwanted erasing operation to the unselected memory cells can be prevented, by setting the voltage for erasing Vee so that at least the erasing inhibit voltage Vee/2 is lower than the second threshold voltage necessary for having the resistive characteristics transit from the high resistance state to the low resistance state.

In addition, although the second critical voltage VA and the first critical voltage VB are different, due to the reasons described above, it is possible to set the voltage for programming Vpp and that for erasing Vee to same voltage in this embodiment. In addition, the pulse widths of both voltage for programming Vpp and that for erasing Vee may be set to short pulse width such as 100 ns or shorter, for instance, and both pulse widths may be of same length. This could make it possible to distinguish programming operations from erasing operations only by switching the load resistive characteristics of the load resistive characteristic variable circuit 14, thereby considerably simplify the circuit configuration.

A known readout operation for memory cells written through the conventional unipolar switching operation or bipolar switching operations may be used as readout operations of memory cells of the device of the present invention. In addition, we omit detailed description of the readout operation as it is not the main object of the present invention.

As described above, according to the device of the present invention, since the load resistive characteristics of the load circuit can be switched between the two different load resistive characteristics, and the two load resistive characteristics can be selectively switched between the case where the resistive characteristics of the variable resistive element as the writing target transit from the low resistance state to the high resistance state and the case where the resistive characteristics transit from the high resistance state to the low resistance state, regardless of symmetric property of the element structure of the variable resistive element, a length of the voltage application time, or the polarity of the applied voltage, the load resistive characteristics can be set so as to separately satisfy the following two conditions to perform the stable switching operation as the variable resistive element that is a new aspect of the inventors of the present invention, such that, (1) when the resistive characteristics of the variable resistive element transit from the high resistance state to the low resistance state, a voltage higher than the threshold voltage of the transition is to be applied while the threshold voltage of the transition is lower than a threshold voltage of a transition in an opposite direction, and (2) when the resistive characteristics of the variable resistive element transit from the low resistance state to the high resistance state, a voltage higher than the threshold voltage of the transition is to be applied while the threshold voltage of the transition is lower than the threshold voltage of the transition in the opposite direction. Thus, the resistive characteristics of the variable resistive element can be switched between the high resistance state and the low resistance state in a stable manner.

Thus, especially, when the unipolar switching operation is implemented in the variable resistive element showing the bipolar switching characteristics by switching the load resistance, the unipolar switching operation can be implemented by supplying the both ends of the variable resistive element with the voltage showing the polarity in which the first threshold voltage to be applied to both ends of the variable resistive element to transit from the low resistance state to the high resistance state is lower than the second threshold voltage to be applied to both ends of the variable resistive element to transit from the high resistance state to the low resistance state under the condition that the load resistance is not considered, to control the switching of the load resistance.

Manufacturing Method of Device of the Invention

Next, a manufacturing method of the device of the present invention will be described with reference to the drawings.

First Embodiment

Figure 20:
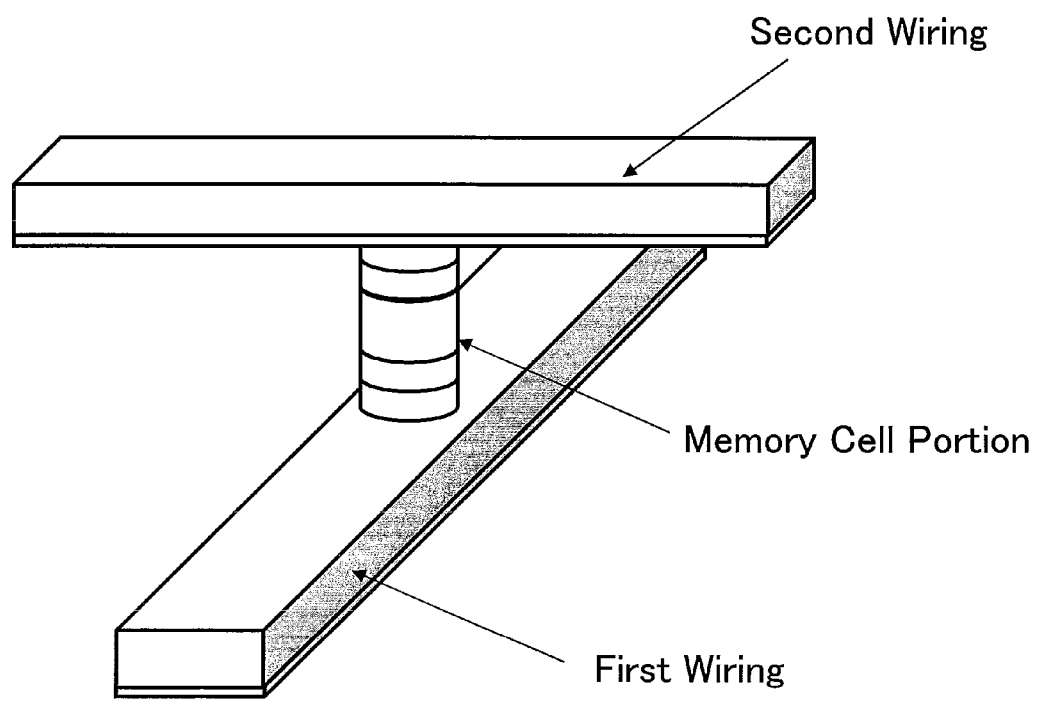
FIG. 20 is a schematic configuration diagram showing the nonvolatile semiconductor memory device according to the present invention.
Figure 21:
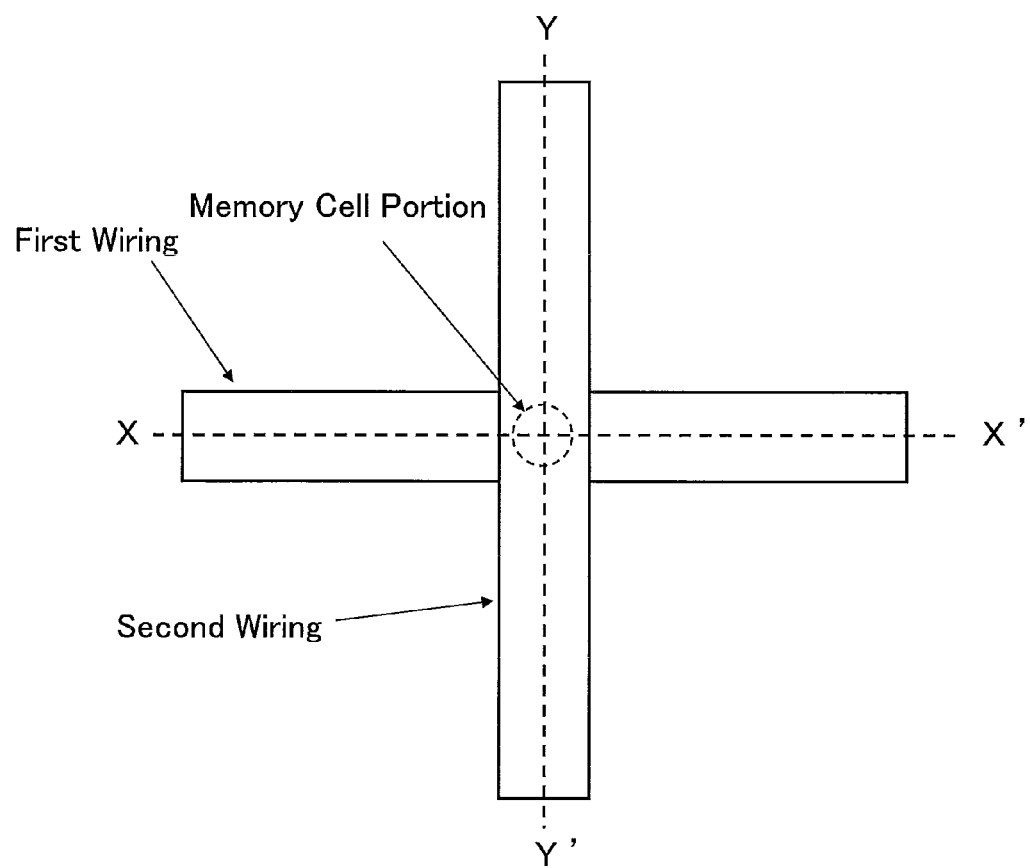
FIG. 21 is a schematic plan view showing the nonvolatile semiconductor memory device according to the present invention.

A description will be made of a first embodiment (hereinafter occasionally referred to as the "present embodiment") according to a manufacturing method of the device of the present invention, with reference to FIGS. 20 to 36. FIG. 20 is a schematic view showing a memory cell to be formed in the present embodiment, and FIG. 21 is a plan view showing the memory cell. The device of the present invention manufactured in the present embodiment is configured by a first wiring including a tungsten (W) layer and a TiN adhesive layer, a memory cell portion including a TiN barrier metal, a resistance lowering layer formed of TiN-type polysilicon, a TiN lower electrode, and a TiOxNy variable resistor, and a second wiring including an upper electrode and a tungsten layer. In addition, FIGS. 22 to 32 show the manufacturing method of the present embodiment in the order of steps. In FIGS. 22 to 32, figures A each show a vertical sectional view taken along line X-X' in FIG. 20, and figures B each show a vertical sectional view taken along line Y-Y' in FIG. 20. In addition, although a single memory cell is shown in FIG. 20 to simplify the figure, a plurality of memory cells are actually arranged in an X direction and a Y direction with or without regular intervals.

In addition, the following figures schematically show the sectional structure, and a contraction scale in the drawing does not always coincide with a contraction scale of the actual structure. The same is true in a second embodiment and thereafter.

In addition, conditions such as a dimension of the film thickness etc., a concentration, and a temperature described below are just examples and the present invention is not limited thereto. The same is true in the following embodiments.

In addition, in the present embodiment, a description will be made of a case where the unipolar switching operation is implemented by applying a voltage whose polarity is positive at the upper electrode with respect to the lower electrode.

Figure 22B:
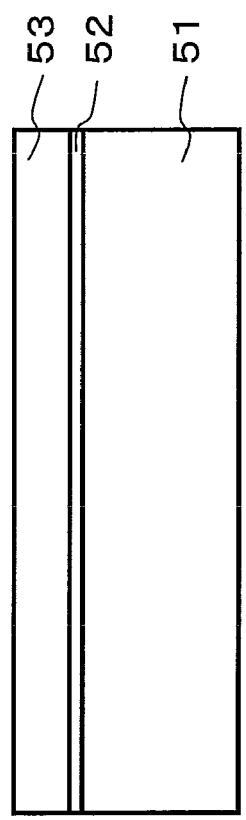
FIGS. 22A and 22B are schematic sectional views showing a manufacturing step according to a first embodiment of the nonvolatile semiconductor memory device according to the present invention.
Figure 22A:
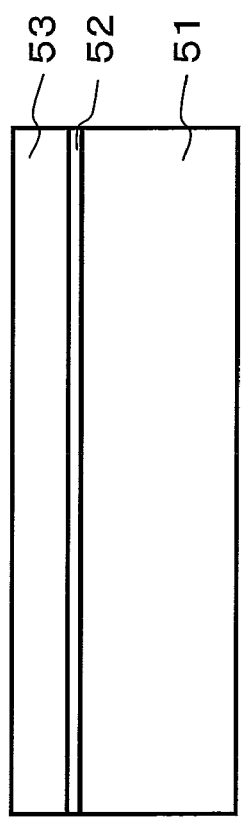

First, as shown in FIG. 22, a tungsten layer 53 serving as the first wiring is formed on an insulation film 51 formed of SiO₂ or the like overlying a substrate made of silicon or the like through a adhesive layer 52 composed of TiN or the like. Although tungsten is used for the first wiring in the present embodiment, the present invention is not limited thereto and a transition metal such as Ti, Cu, Co or Ta, or an alloy of these metals containing tungsten, or oxide or nitride showing conductivity may be used alternatively. In addition, although TiN is used for the adhesive layer 52 in the present embodiment, the present invention is not limited thereto and TaN or TiW may be used alternatively. The layers of TiN and W are formed by a well-known method such as a CVD (Chemical Vapor Deposition) method or a sputtering method. The film thickness of the TiN adhesive layer 52 is about 30 nm, and the film thickness of the tungsten first wiring 53 is about 200 nm. In addition, the adhesive layer 52 may be deposited depending on the kind of the metal used in the first wiring 53 and the adhesive layer 52 is not an indispensable layer.

Then, as shown in FIG. 23, these laminated-layer structure is processed and formed into the shape of a line so as to become the first wiring by a well-known dry etching method through a resist as a mask patterned by a photolithography method. The wiring width and the wiring interval at this time are set to 250 nm.

Figure 24B:
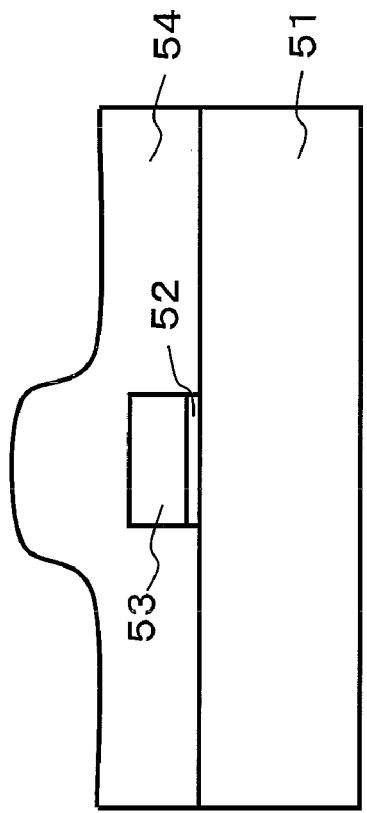
FIGS. 24A and 24B are schematic sectional views showing a manufacturing step according to the first embodiment of the nonvolatile semiconductor memory device according to the present invention.
Figure 24A:
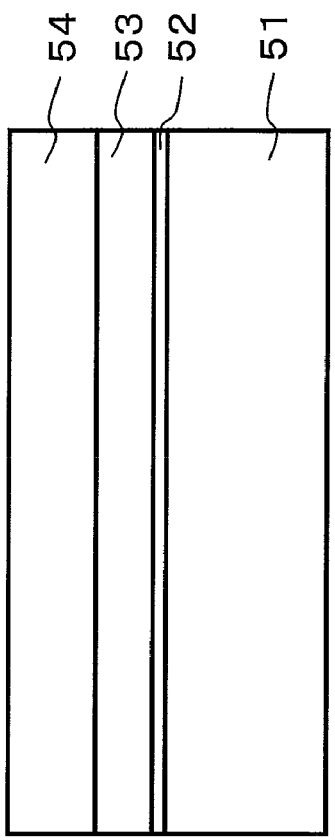

Then, as shown in FIG. 24, an insulation film 54 of SiO₂ or the like is formed on the first wiring and between the wirings. The SiO₂ layer is formed by a plasma CVD method or a HDP (High Density Plasma) CVD method. Since the SiO₂ layer is flattened by polishing in a following CMP (Chemical Mechanical Polishing) step, the film thickness of the SiO₂ layer needs to be at least thicker than the first wiring. In the present embodiment, the SiO₂ layer is formed to be 400 nm in thickness.

Then, as shown in FIG. 25, the SiO₂ layer is polished by the well-known CMP method to remove the SiO₂ layer on the first wiring 53 and flatten it. Since it is necessary to expose the tungsten surface by completely removing the SiO₂ layer on the first wiring 53, the tungsten layer is also polished, but since the polishing rate of SiO₂ to tungsten is high enough (about 10 or more), a polished thickness of the tungsten layer is considerably smaller than the formed thickness of the tungsten layer.

In addition, the method for forming the first wiring 53 is not limited to the above, and a well-known damascene process may be used.

Figure 26B:
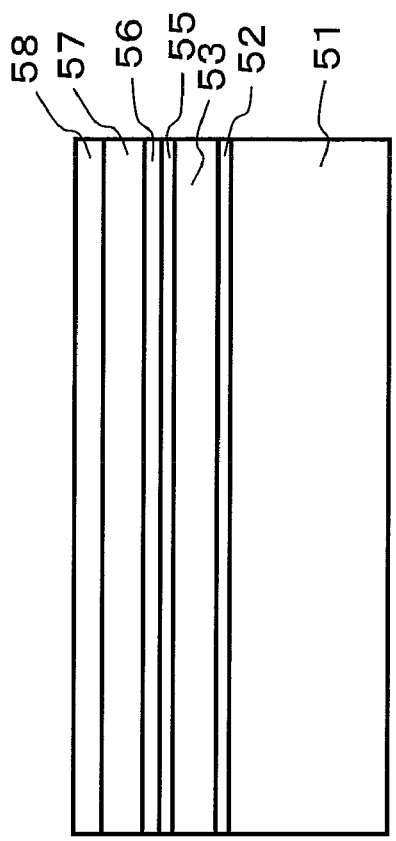
FIGS. 26A and 26B are schematic sectional views showing a manufacturing step according to the first embodiment of the nonvolatile semiconductor memory device according to the present invention.
Figure 26A:
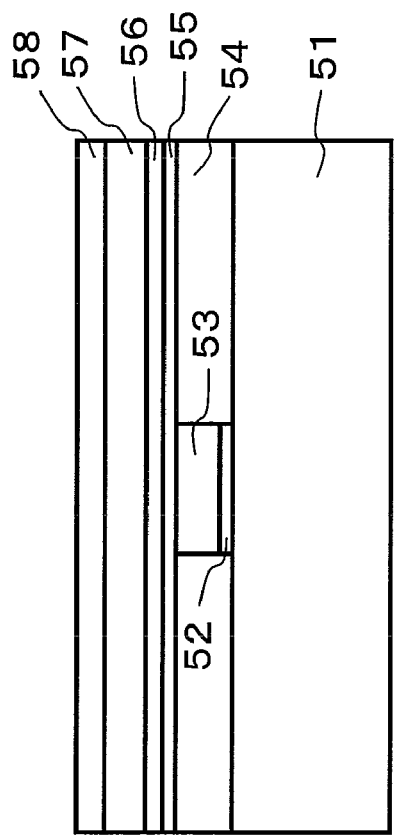

Then, as shown in FIG. 26, the memory cell portion is formed. First, a barrier metal layer 55 is formed of TiN and a resistance lowering layer 56 is formed of Ti so as to be 30 nm and 10 nm in thickness, respectively. The barrier metal layer 55 is formed in order to prevent the reaction between polysilicon to be formed above and tungsten of the first wiring, and the resistance lowering layer 56 is formed in order to lower the adhesive resistance with polysilicon to be formed above. Although TiN is used for the barrier metal layer 55 in the present embodiment, the present invention is not limited thereto and TaN or TiW may be used instead. In addition, Ti is used for the resistance lowering layer 56 in the present embodiment, the present invention is not limited thereto and Co or Ni may be used.

Thereafter, an N-type polysilicon 57 layer serving as a component of the Schottky barrier diode is further formed by a well-known LP (Low Pressure) CVD method. According to this method, the N-type polysilicon layer is formed by mixing a dopant that becomes an N type such as PH₃ while the polysilicon layer is formed. As an alternative method, a solid-phase diffusion method or a method for forming the N type by use of ion implantation may be used. In addition, a method for polycrystallizing an amorphous layer by a heat treatment may also be used. Thus, the dopant concentration of the formed N-type polysilicon layer 57 is about $5 \times 10^{18}$ atoms/cm³, and the film thickness thereof is about 150 nm. In addition, although polysilicon is used in the present embodiment, the present invention is not limited thereto and a semiconductor material such as Ge and GaAs may be used alternatively. Further, a TiN layer serving as a metal side electrode of the Schottky barrier diode and a lower electrode 58 of the variable resistor is formed to be 100 nm in thickness. Since this TiN layer is removed a little in the following step of flattening an insulation film, the film thickness thereof needs to be set in view of an amount of the removal. In addition, although the TiN layer combines the metal side electrode of the Schottky barrier diode and the lower electrode of the variable resistor, another material having a relatively large work function such as Pt, Co, or Ni may be inserted as the metal side electrode of the Schottky barrier diode.

Next, as shown in FIG. 27, the laminated-layer structure serving as the Schottky barrier diode is processed and formed into the shape of a column by a well-known dry etching method through a resist as a mask patterned by a well-known photolithography method. This column-shaped structure is processed so as to be arranged on the first wiring and a diameter thereof is 130 nm.

Figure 28B:
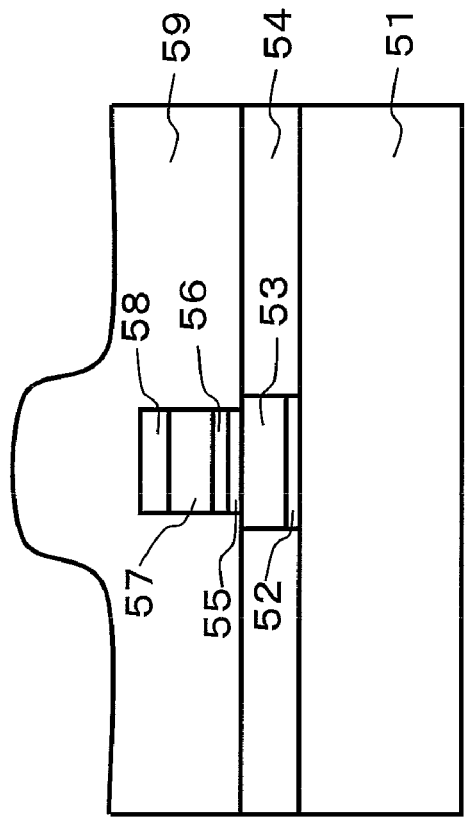
FIGS. 28A and 28B are schematic sectional views showing a manufacturing step according to the first embodiment of the nonvolatile semiconductor memory device according to the present invention.
Figure 28A:
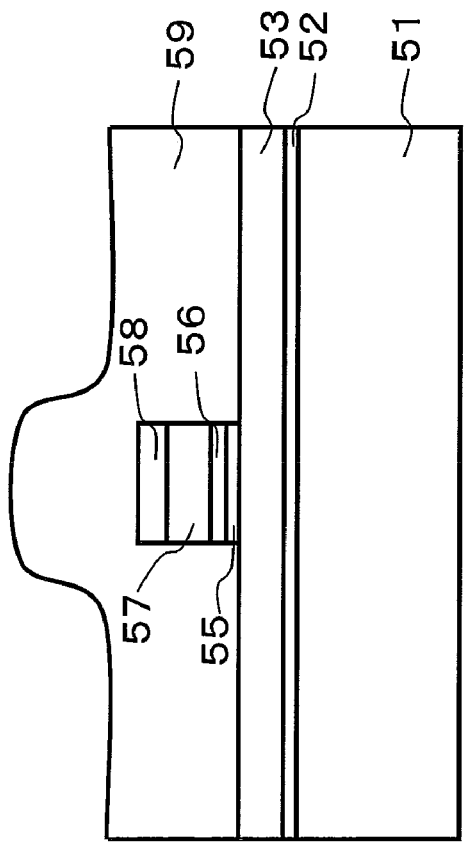

Next, as shown in FIG. 28, an insulation film 59 is formed of SiO₂ or the like on the column-shaped structure and between the column-shaped structures. This SiO₂ layer is formed by the plasma CVD method or the HDPCVD method. Since the formed SiO₂ layer is flattened by polishing the SiO₂ layer in the later CMP step, the layer needs to be thicker than the thickness (height) of the column-shaped structure. In the present embodiment, the thickness of the SiO₂ layer is about 500 nm.

Figure 29B:
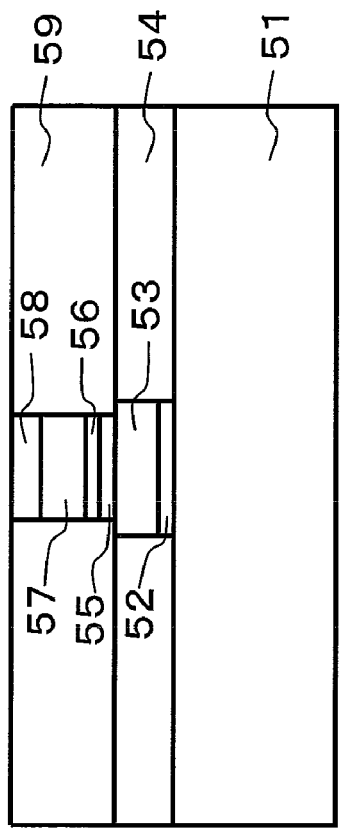
FIGS. 29A and 29B are schematic sectional views showing a manufacturing step according to the first embodiment of the nonvolatile semiconductor memory device according to the present invention.
Figure 29A:
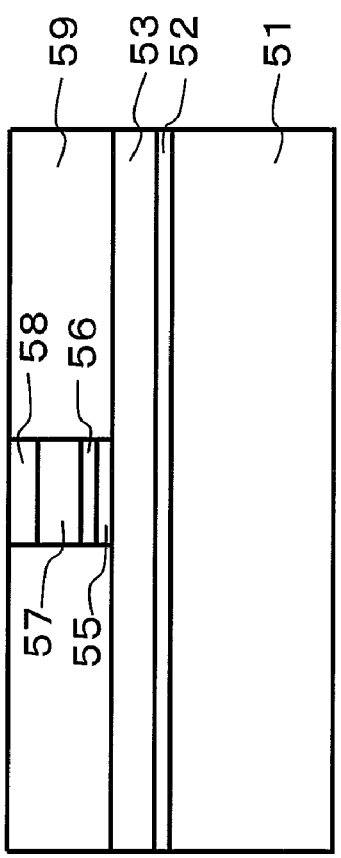

Then, as shown in FIG. 29, the SiO₂ layer is polished by the well-known CMP method to remove and flatten the SiO₂ layer on the column-shaped structure. Since it is necessary to expose the surface of the TiN layer by completely removing the SiO₂ layer on the column-shaped structure, the TiN layer positioned in the uppermost layer of the column-shaped structure is also polished, but since the polishing rate of SiO₂ to the TiN is high enough (about 10 or more), a polished thickness of the TiN layer is considerably smaller than the formed thickness of the TiN layer.

Figure 30B:
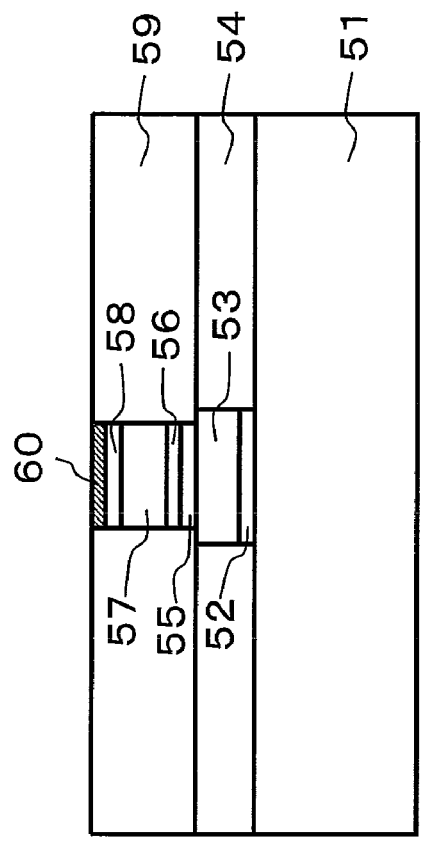
FIGS. 30A and 30B are schematic sectional views showing a manufacturing step according to the first embodiment of the nonvolatile semiconductor memory device according to the present invention.
Figure 30A:
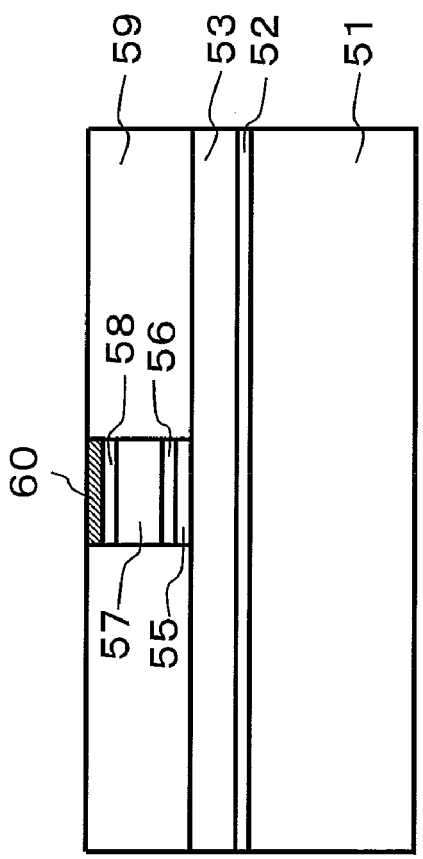

Then, as shown in FIG. 30, a titanium oxynitride (hereinafter described as the "TiON" for example) serving as a variable resistor 60 is formed by oxidizing the exposed surface of the TiN layer. According to the present embodiment, the TiON layer is formed by being held in an atmosphere of atmospheric-pressure oxygen containing 10% by weight of ozone at a substrate temperature of 300° C. for 10 minutes. At this time, the film thickness of the TiON layer is about 10 nm. However, the method for forming the TiON variable resistor is not limited to the above method, and the conditions can be changed within a range of 5 to 100% by weight of ozone concentration, and 250 to 500° C. of the substrate temperature. In addition, as other methods, a heat treatment in a reduced-pressure oxygen atmosphere or an oxygen plasma atmosphere, or an oxidizing method using an oxidizing chemical solution can be used.

Figure 31B:
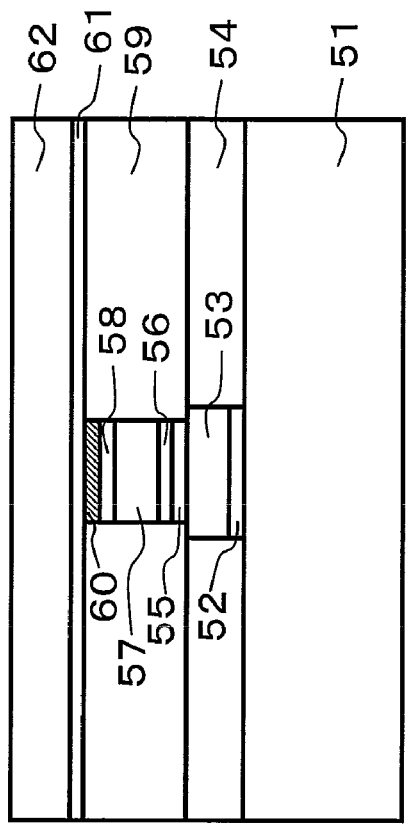
FIGS. 31A and 31B are schematic sectional views showing a manufacturing step according to the first embodiment of the nonvolatile semiconductor memory device according to the present invention.
Figure 31A:
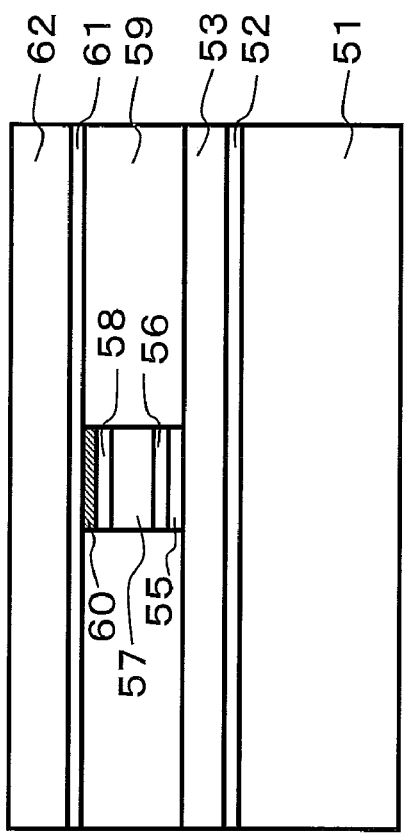

Then, as shown in FIG. 31, TiN serving as a adhesive layer 61 of the second wiring layer and tungsten serving as a second wiring layer 62 are deposited. The adhesive layer 61 functions not only as the adhesive layer of the second wiring layer 62 but also as the upper electrode of the variable resistor. In the present embodiment, although tungsten is used for the second wiring layer 62 similar to the first wiring, the present invention is not limited thereto and a transition metal such as Ti, Cu, Co or Ta or an alloy of these metals containing tungsten, or an oxide or nitride showing conductivity may be used alternatively.

Then, as shown in FIG. 32, the laminated-layer structure is processed and formed to be in the shape of a line by the well-known dry etching method through the resist as a mask patterned by a well-known photolithography method so that these laminated-layer structure becomes the second wiring. At this time, the second wiring needs to be arranged just above the column-shaped structure serving as the memory cell portion. In addition, the wiring width and wiring interval at this time is about 250 nm. Thereafter, an interlayer insulation film is formed and a flattening step is performed according to need, whereby the desirable nonvolatile semiconductor memory device can be manufactured.

Figure 33:
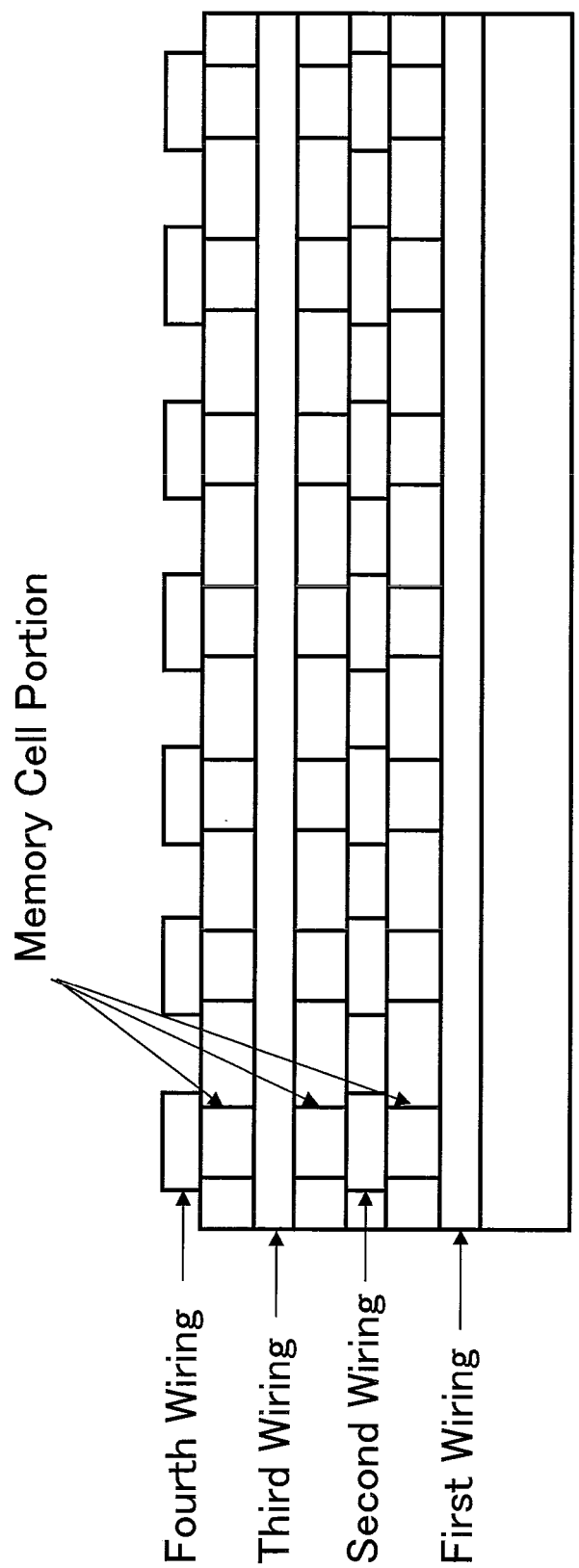
FIG. 33 is a schematic sectional view showing a manufacturing step according to the first embodiment of the nonvolatile semiconductor memory device according to the present invention.

The memory cells formed as described above are structured on the upper wiring layer (on the second wiring in the present embodiment) repeatedly, whereby a three-dimensional memory array can be built and the semiconductor memory device having the highly integrated variable resistive elements can be manufactured as shown in FIG. 33.

Figure 34:
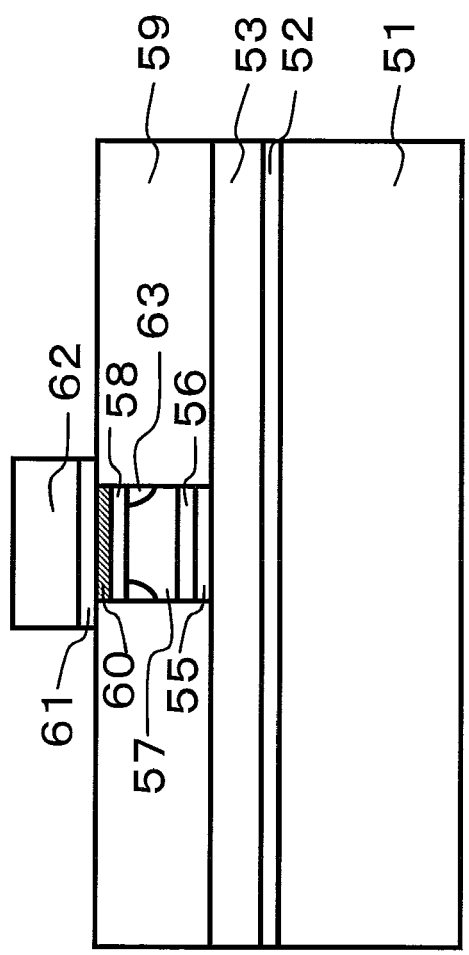
FIG. 34 is a schematic sectional view showing a manufacturing step according to the first embodiment of the nonvolatile semiconductor memory device according to the present invention.

In addition, as a variation of the present embodiment, as shown in FIG. 34, a P-type polysilicon layer 63 can be inserted to a part where the N-type polysilicon layer 57 is in contact with the lower electrode 58. The P-type polysilicon layer 63 can be formed by ion implantation with boron in an oblique direction after the column-shaped structure serving as the memory cell portion has been formed (after the step shown in FIG. 27). When the structure shown in FIG. 34 is formed, in the case where the reverse voltage is applied to the Schottky barrier diode, a reverse current can be reduced due to the spread of a depletion layer from the PN junction as compared with the general Schottky barrier diode, so that the preferable device characteristics having less sneak path current can be obtained.

Figure 35:
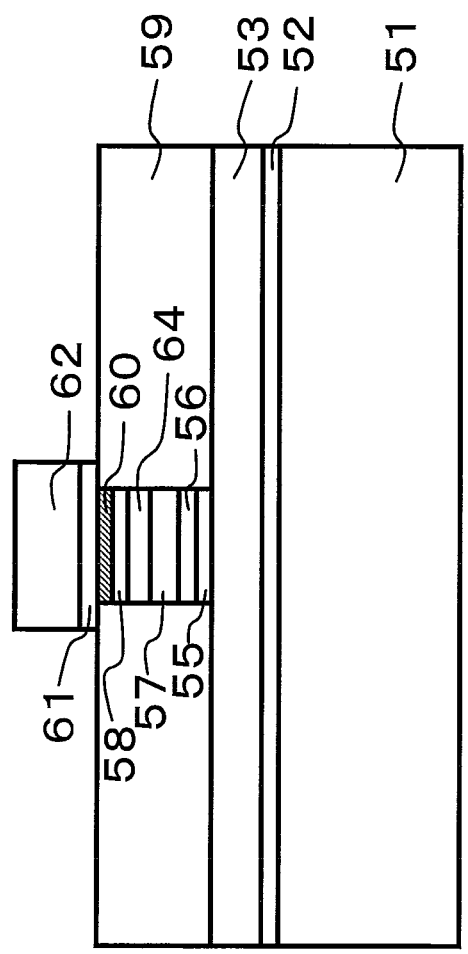
FIG. 35 is a schematic sectional view showing a manufacturing step according to the first embodiment of the nonvolatile semiconductor memory device according to the present invention.

In addition, as still another variation in the present embodiment, as shown in FIG. 35, a P-type polysilicon layer 64 can be inserted between the N-type polysilicon layer 57 and the lower electrode 58. The P-type polysilicon layer 64 can be formed by the LPCVD method similar to the N-type polysilicon layer. Thus, since the PN junction diode is formed in the memory cell portion instead of the Schottky barrier diode, the preferable device characteristics having further less sneak path current can be obtained.

Figure 36:
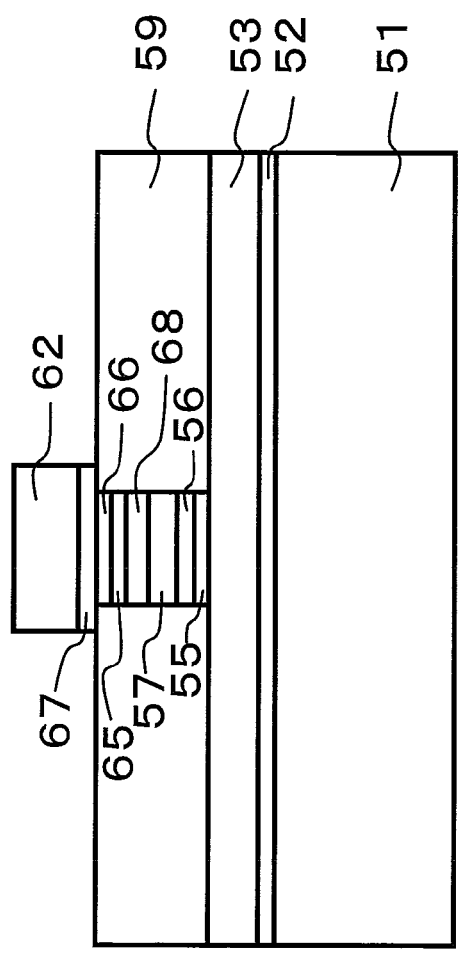
FIG. 36 is a schematic sectional view showing a manufacturing step according to the first embodiment of the nonvolatile semiconductor memory device according to the present invention.

Although the description has been made of the case where the memory cell having the variable resistive element showing the bipolar switching characteristics by itself is manufactured in the above embodiment, for example, when the memory cell having the variable resistive element not showing the bipolar switching characteristics by itself is manufactured, the polysilicon layer 57 can be both N and P conductivity types. In this case, as shown in FIG. 36, the lower electrode 65 is formed of Cu, the variable resistor 66 is formed of CuO by oxidizing Cu, and the upper electrode 67 is formed of Ti, Ta, W, or the like.

In addition, at this time, when the polysilicon layer 57 is formed of N-type polysilicon, it is necessary to insert a metal electrode 68 having a relatively large work function such as Pt, Co, Ni, or the like between the lower electrode 65 and the N-type polysilicon layer 57, as an electrode to form the Schottky barrier diode with the N-type polysilicon layer 57. On the other hand, when the polysilicon layer 57 is formed of P-type polysilicon, it is necessary to insert a metal electrode 68 having a relatively small work function such as Ti, Ta, W, or the like between the lower electrode 65 and the P-type polysilicon layer 57, as an electrode to form the Schottky barrier diode with the P-type polysilicon layer 57.

Second Embodiment

Figure 37:
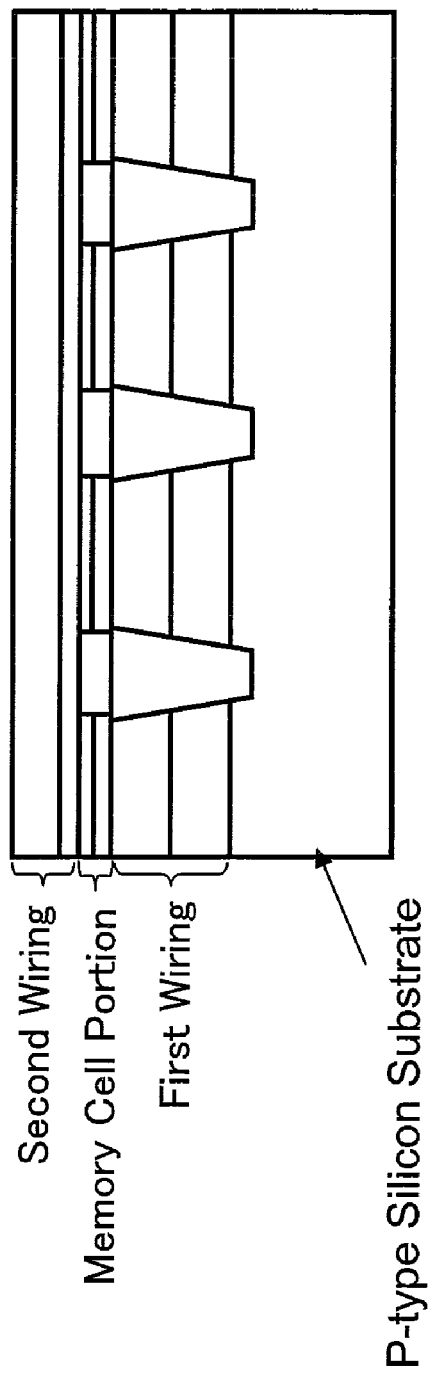
FIG. 37 is a schematic configuration diagram showing the nonvolatile semiconductor memory device according to the present invention.
Figure 38:
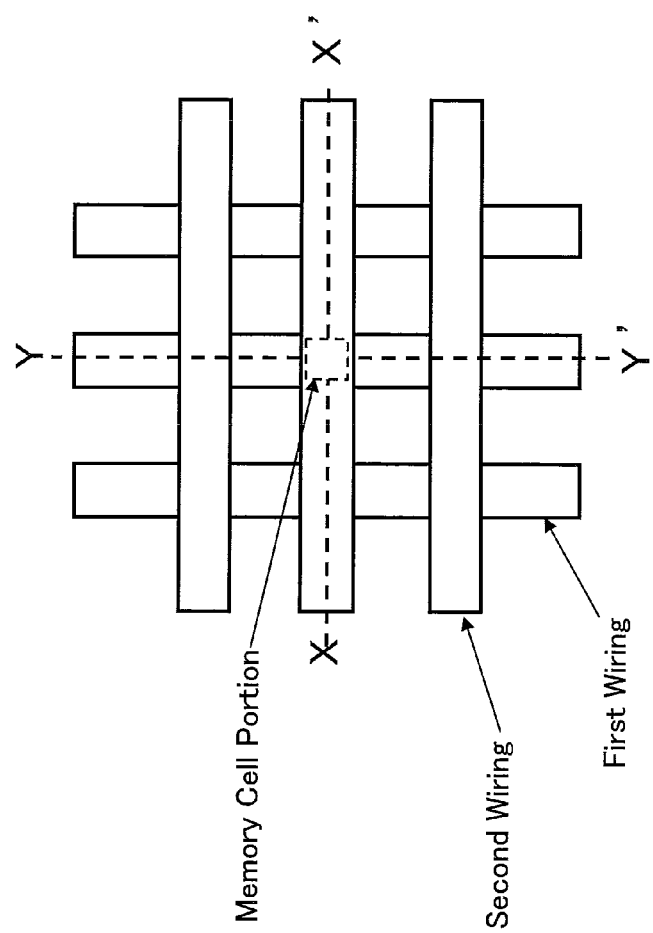
FIG. 38 is a schematic plan view showing the nonvolatile semiconductor memory device according to the present invention.

A description will be made of a second embodiment (hereinafter occasionally referred to as the "present embodiment") according to the manufacturing method of the device of the present invention, with reference to FIGS. 37 to 49. FIG. 37 is a schematic view showing a memory cell to be formed in the present embodiment, and FIG. 38 is a plan view showing the memory cell. The device of the present invention to be manufactured in the present embodiment is configured by a first wiring layer including an $N^+$ layer and an $N^-$ layer formed in a P-type silicon substrate, a memory cell portion including a TiN lower electrode and a TiON variable resistor, a second wiring including a TiN layer serving as an upper electrode and a adhesive layer, and a W layer. In addition, FIGS. 39 to 46 show the manufacturing method of the present embodiment in the order of steps. In FIGS. 39 to 46, figures A each show a vertical sectional view taken along line X-X' in FIG. 38, and figures B each show a vertical sectional view taken along line Y-Y' in FIG. 38. In addition, also in the present embodiment, similar to the first embodiment, a description will be made of a case where the unipolar switching operation is implemented by applying a voltage whose polarity is positive at the upper electrode with respect to the lower electrode.

Figure 39B:
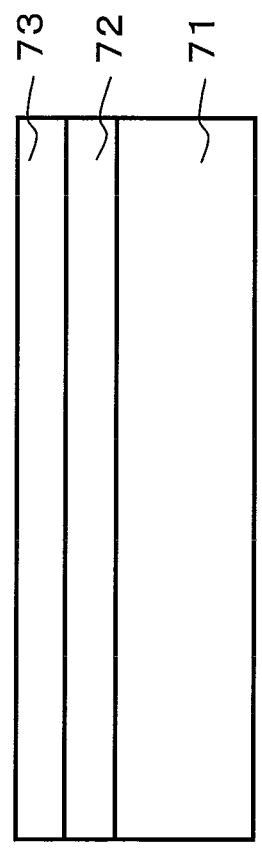
FIGS. 39A and 39B are schematic sectional views showing a manufacturing step according to a second embodiment of the nonvolatile semiconductor memory device according to the present invention.
Figure 39A:
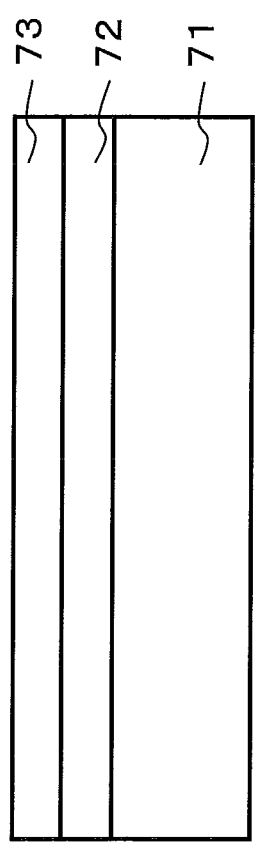

First, as shown in FIG. 39, an $N^+$ layer 72 and an $N^-$ layer 73 are formed in a P-type silicon substrate 71 by a well-known method such as ion implantation. The dopant concentration of the $N^+$ layer at this time is $5 \times 10^{20}$ atoms/cm$^3$, and the dopant concentration of the $N^-$ layer is $1 \times 10^{17}$ atoms/cm$^3$. The concentrations are set to the above values because the $N^+$ layer 72 needs to be sufficiently small in resistance as the first wiring layer while the $N^-$ layer 73 needs to form the Schottky junction in a contact with the TiN film serving as the lower electrode of the variable resistor.

Then, as shown in FIG. 40, an element isolation region 74 is provided by a well-known element isolation method, and the $N^+$ layer 72 and the $N^-$ layer 73 are formed to be in the shape of a line. The $N^+$ layer 72 and the $N^-$ layer 73 obtained in this way function as the first wiring.

Then, as shown in FIG. 41, a TiN layer serving as the metal side electrode of the Schottky barrier diode and the lower electrode 75 of the variable resistor is formed. At this time, the TiN layer is formed by a well-known method such as the sputtering method or the CVD method. In addition, since the TiN layer is removed a little in a later step of flattening an insulation film later, the film thickness thereof has to be set in view of an amount of the removal. In addition, the layer is formed so as to be in the shape of a line by the well-known dry etching method through a resist as a mask patterned by the well-known photolithography method.

Then, as shown in FIG. 42, an SiO$_2$ insulation film 76 is formed on the TiN layer and between the TiN layers. The SiO$_2$ layer is formed by the plasma CVD method or the HDPCVD method. Since the SiO$_2$ layer is flattened by polishing in the later CMP step, the film thickness of the SiO$_2$ layer needs to be at least thicker than the thickness (height) of the lower electrode 75. In the present embodiment, the SiO$_2$ layer is deposited to be about 300 nm in thickness.

Then, as shown in FIG. 43, the SiO$_2$ layer is polished by the well-known CMP method to remove and flatten the SiO$_2$ layer on the lower electrode 75. Since it is necessary to expose the surface of TiN by completely removing the SiO$_2$ layer on the TiN layer, the TiN layer itself is also polished, but since the polishing rate of SiO$_2$ to TiN is high enough (about 10 or more), a polished thickness of the TiN layer is considerably smaller than the formed thickness of the layer.

Then, as shown in FIG. 44, a TiON layer serving as a variable resistor 77 is formed by oxidizing the exposed surface of the TiN layer. According to the present embodiment, the variable resistor is formed by being held in an atmosphere of atmospheric-pressure oxygen containing 10% by weight of ozone at a substrate temperature of 300° C. for 10 minutes. At this time, the film thickness of the variable resistor is 10 nm. However, the method for forming the variable resistor is not limited thereto, and the conditions can be changed within a range of 5 to 100% by weight of ozone concentration, and 250 to 500° C. of the substrate temperature. In addition, as an alternative method, a heat treatment in a reduced-pressure oxygen atmosphere or an oxygen plasma atmosphere, or an oxidizing method using an oxidizing chemical solution can be used.

Figures 45A, 45B:
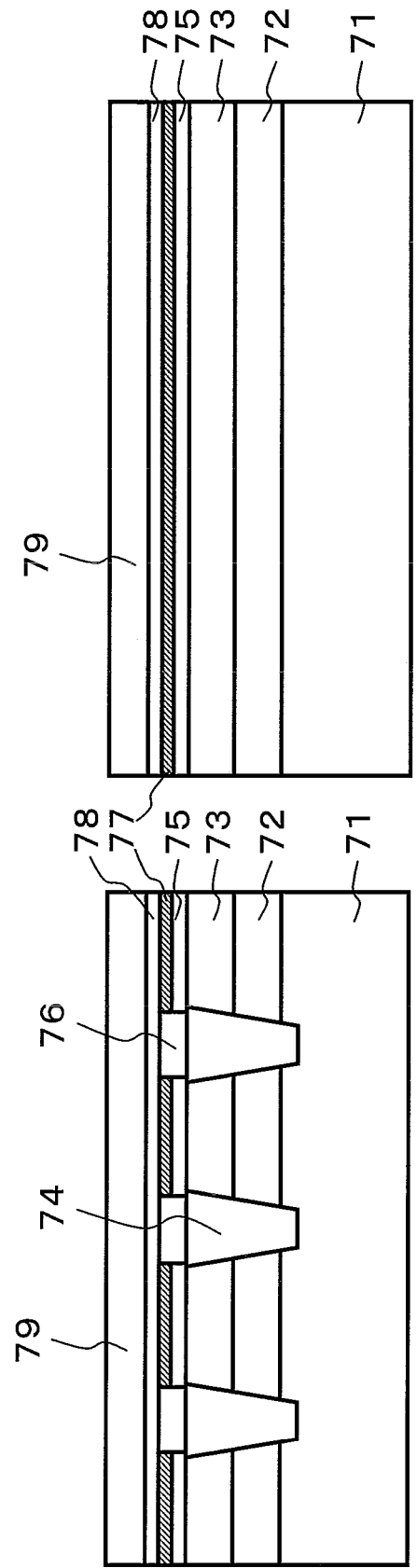
FIGS. 45A and 45B are schematic sectional views showing a manufacturing step according to the second embodiment of the nonvolatile semiconductor memory device according to the present invention.

Then, as shown in FIG. 45, a TiN layer serving as a adhesive layer 78 of a second wiring layer and a tungsten layer serving as a second wiring layer 79 are formed. The adhesive layer 78 functions not only as the adhesive layer of the second wiring layer 79 but also as the upper electrode of the variable resistor. Although tungsten is used for the second wiring layer in the present embodiment, the present invention is not limited thereto and a transition metal such as Ti, Cu, Co or Ta or an alloy of these metals containing tungsten, or an oxide or nitride showing conductivity may be used alternatively.

Then, as shown in FIG. 46, the laminated-layer structure is processed and formed to be in the shape of a line by the well-known dry etching method through the resist as a mask patterned by the well-known photolithography method so as to become the second wiring. In this processing of the second wiring layer, the process is performed to reach the variable resistor 77 and the lower electrode 76. After being processed in such a manner, the variable resistor becomes a shape of a rectangle. Thereafter, an interlayer insulation film is formed and a flattening step is performed according to need, whereby the desirable nonvolatile semiconductor memory device can be manufactured.

Figure 47:
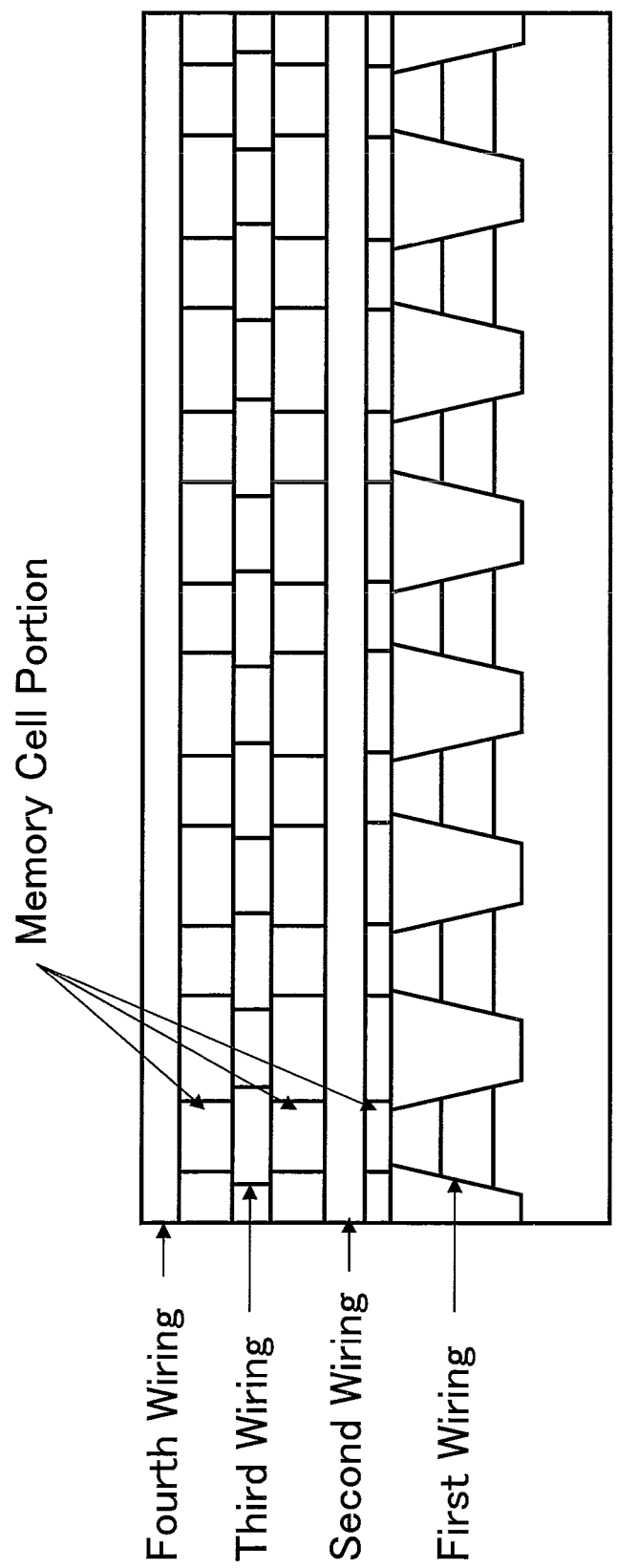
FIG. 47 is a schematic sectional view showing a manufacturing step according to the second embodiment of the nonvolatile semiconductor memory device according to the present invention.

As the manufacturing method to implement the present embodiment has been described above, when the present embodiment is combined with the first embodiment, the three-dimensional memory cell array as shown in FIG. 47 can be provided.

Figure 48:
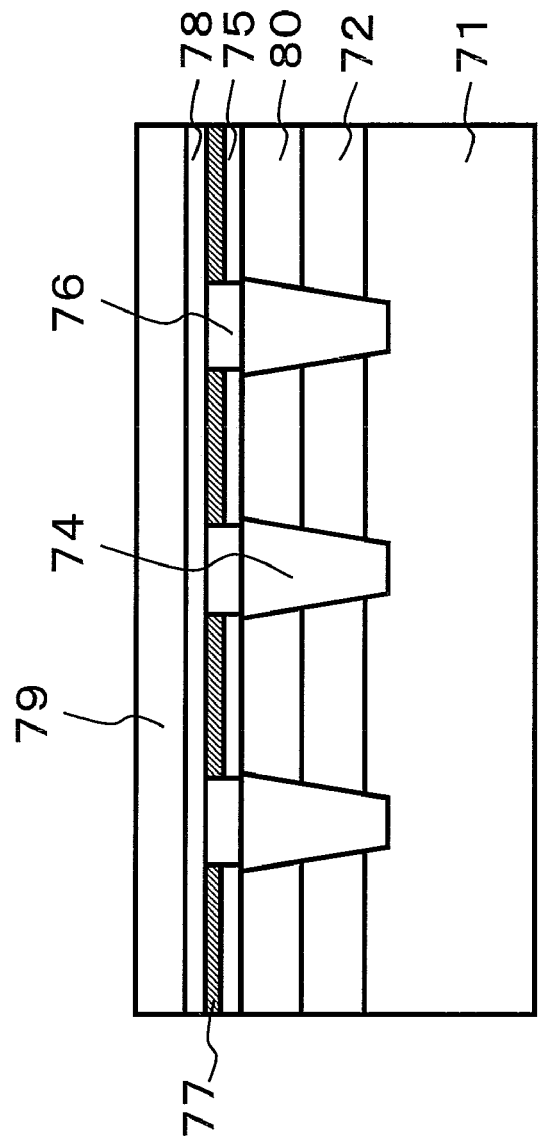
FIG. 48 is a schematic sectional view showing a manufacturing step according to the second embodiment of the nonvolatile semiconductor memory device according to the present invention.

In addition, as a variation of the present embodiment, as shown in FIG. 48, a P layer 80 may be formed instead of the N⁻ layer 73. The P layer 80 can be formed by the ion implantation similar to the N⁺ layer. In this way, a PN junction diode is formed instead of the Schottky barrier diode, thereby the preferable device characteristics having less sneak path current can be obtained.

Figure 49:
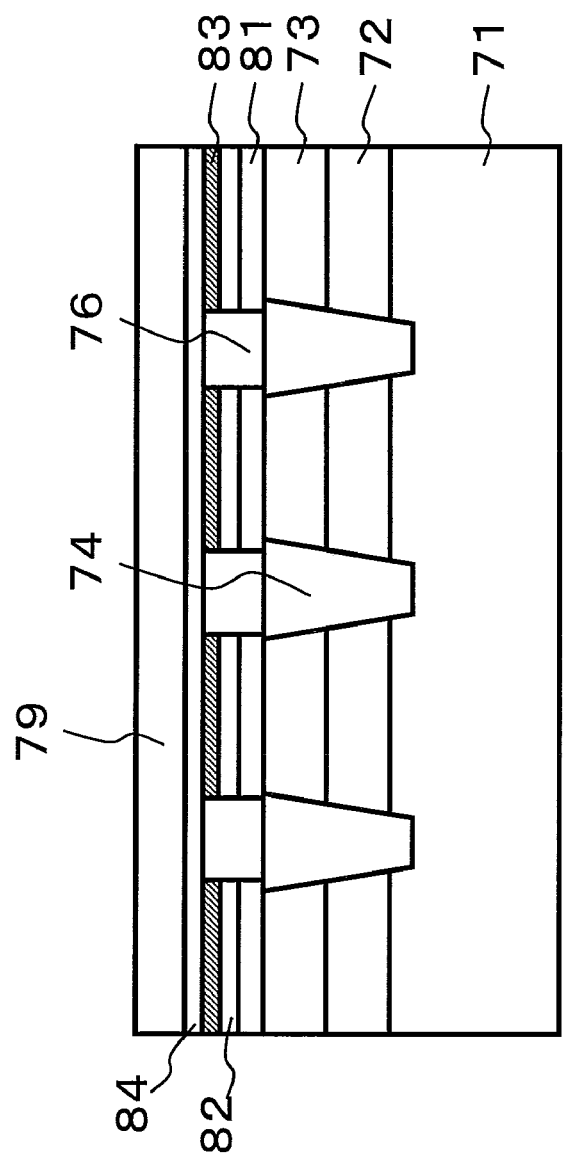
FIG. 49 is a schematic sectional view showing a manufacturing step according to the second embodiment of the nonvolatile semiconductor memory device according to the present invention.

In addition, although the description has been made of the case where the memory cell having the variable resistive element showing the bipolar switching characteristics by itself is manufactured in the above embodiment, for example, when the memory cell having the variable resistive element not showing the bipolar switching characteristics by itself is manufactured, as shown in FIG. 49, the lower electrode 82 is formed of Cu, the variable resistor 83 is formed of CuO by oxidizing Cu, and the upper electrode 84 is formed of Ti, Ta, W, or the like. Furthermore, in this case, it is necessary to insert a metal electrode 81 having a relatively large work function such as Pt, Co, Ni, or the like between the lower electrode 82 and the N⁻ layer 73, as a metal electrode to form the Schottky barrier diode. In addition, in the case of the above memory cell, the conductivity types of the silicon substrate and the implanted ion can be inverted, and in this case, it is necessary to insert a metal electrode 81 having a relatively small work function such as Ti, Ta, W, or the like between the lower electrode 82 and the N⁻ layer 73, as an electrode to form the Schottky barrier diode.

Third Embodiment

Figure 50:
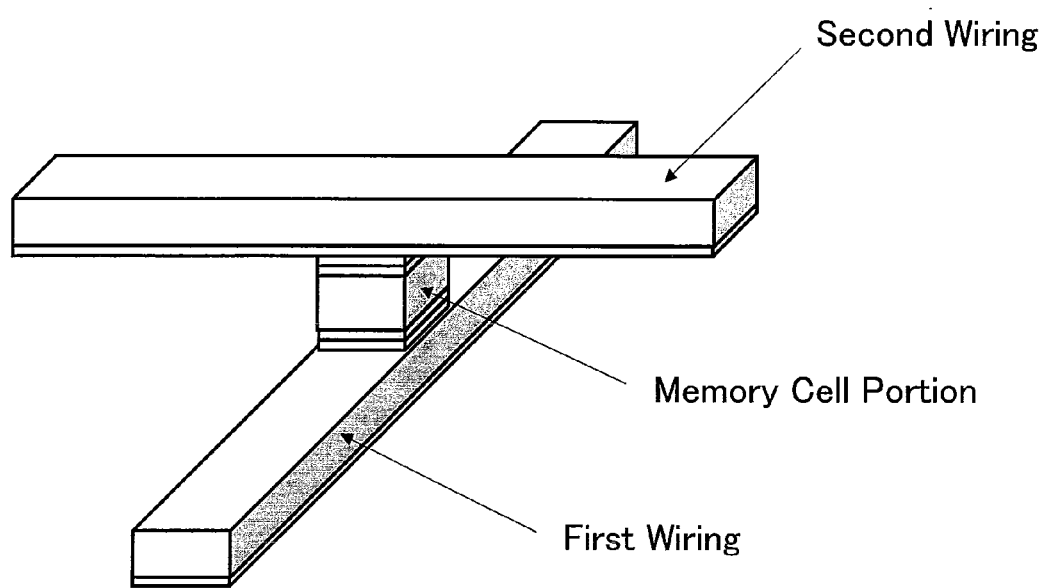
FIG. 50 is a schematic configuration diagram showing the nonvolatile semiconductor memory device according to the present invention.
Figure 51:
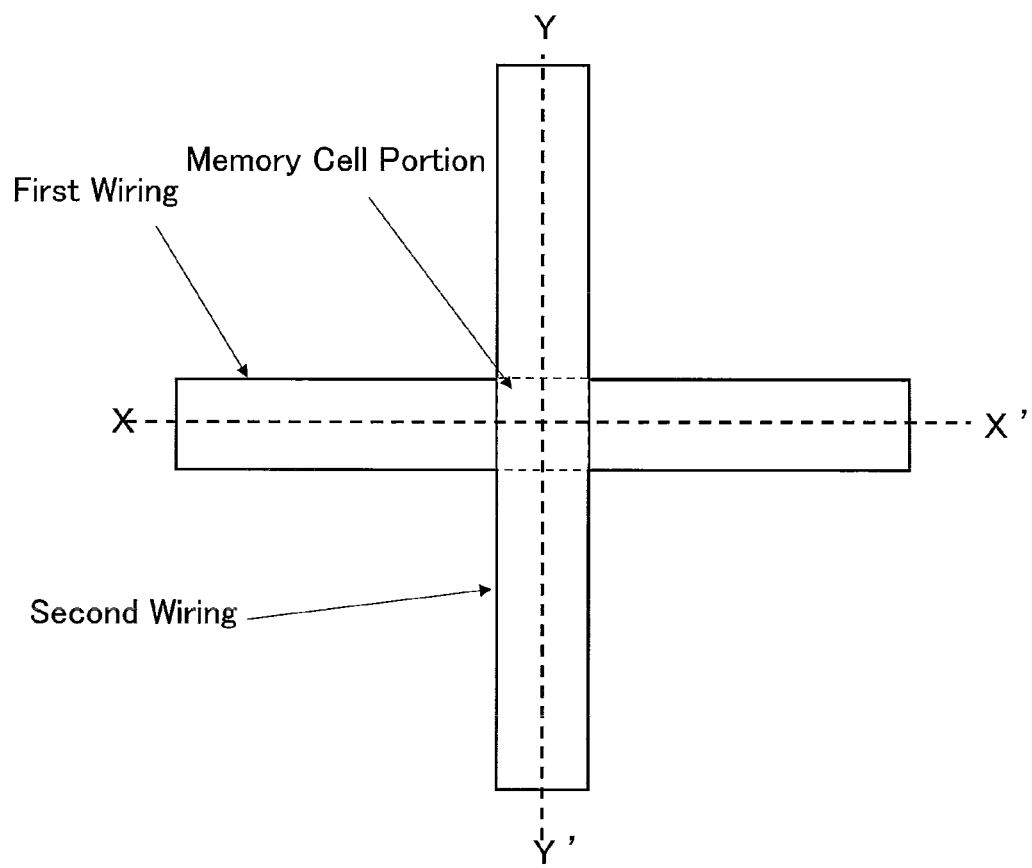
FIG. 51 is a schematic plan view showing the nonvolatile semiconductor memory device according to the present invention.

A description will be made of a third embodiment (hereinafter occasionally referred to as the "present embodiment") according to the manufacturing method of the device of the present invention, with reference to FIGS. 50 to 60. FIG. 50 is a schematic view showing a memory cell formed in the present embodiment, and FIG. 51 is a plan view showing the memory cell. The device of the present invention to be manufactured in the present embodiment is configured by a first wiring including a W layer and a TiN adhesive layer, a memory cell portion including a TiN barrier metal, a TiN-type polysilicon resistance lowering layer, a TiN lower electrode and a TiON variable resistor, and a second wiring including an upper electrode, a adhesive layer and a W layer. In addition, FIGS. 52 to 58 show the manufacturing method of the present embodiment in the order of steps. In FIGS. 52 to 58, figures A each show a vertical sectional view taken along line X-X' in FIG. 51, and figures B each show a vertical sectional view taken along line Y-Y' in FIG. 51. In addition, although a single memory cell is shown in FIG. 50 to simplify the figure, a plurality of memory cells are actually arranged in the X direction and the Y direction with or without regular intervals.

In addition, also in the present embodiment, similar to the first embodiment, a description will be made of a case where the unipolar switching operation is implemented by applying a voltage whose polarity is positive at the upper electrode with respect to the lower electrode.

Figure 52A:
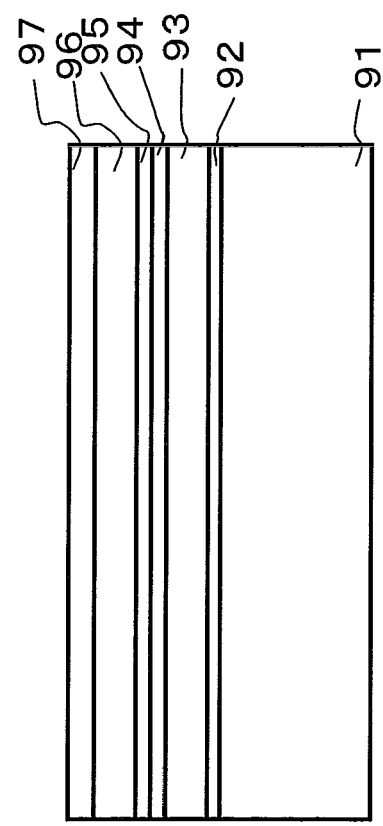
FIGS. 52A and 52B are schematic sectional views showing a manufacturing step according to a third embodiment of the nonvolatile semiconductor memory device according to the present invention.
Figure 52B:
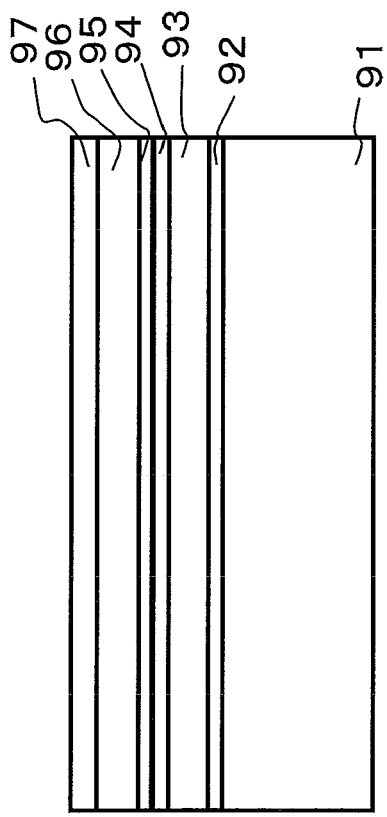

First, as shown in FIG. 52, a tungsten layer 93 serving as a first wiring is formed on an insulation film 91, formed of SiO₂ or the like, overlying on a substrate made of silicon or the like through a adhesive layer 92 composed of TiN or the like. Although tungsten is used for a first wiring in the present embodiment, the present invention is not limited thereto and a transition metal such as Ti, Cu, Co or Ta, or an alloy of these metals containing tungsten, or oxide or nitride showing conductivity may be used alternatively. In addition, although TiN is used for the adhesive layer 92 in the present embodiment, the present invention is not limited thereto and TaN or TiW may also be used alternatively. The TiN adhesive layer 92 and the tungsten first wiring 93 are formed by a well-known method such as the CVD method or the sputtering method. The film thickness of the TiN adhesive layer is about 30 nm, and the film thickness of the tungsten first wiring is about 200 nm. In addition, the adhesive layer 92 may be deposited depending on the kind of the metal used in the first wiring 93 and the adhesive layer 92 is not necessarily an indispensable layer.

After the tungsten layer 93 has been formed, the memory cell portion is formed. First, a TiN layer as a barrier metal 94 and a Ti layer as a resistance lowering layer 95 are formed to be 30 nm and 10 nm in thickness, respectively. The barrier metal layer is formed in order to prevent the reaction between a polysilicon layer to be formed above and tungsten of the first wiring, and the resistance lowering layer is formed in order to reduce the adhesive resistance with the polysilicon layer to be formed above. Although TiN is used for the barrier metal 94 in the present embodiment, the present invention is not limited thereto and TaN or TiW may also be used. In addition, Ti is used for the resistance lowering layer 95 in the present embodiment, the present invention is not limited thereto and Co or Ni may also be used.

Further, an N-type polysilicon layer 96 serving as a component of a Schottky barrier diode is then formed by the well-known LPCVD method. According to this method, the N-type polysilicon layer is formed by mixing a dopant that becomes an N type such as $PH_3$ while the polysilicon layer is formed. As an alternative method, a solid-phase diffusion method or a method for forming the N type by use of ion implantation may be used. In addition, a method for polycrystallizing an amorphous layer by a heat treatment may be used. Thus, the dopant concentration of the formed N-type polysilicon layer is about $5 \times 10^{18}$ atoms/cm$^3$, and the film thickness thereof is 150 nm. Further, a TiN layer serving as a metal side electrode of the Schottky barrier diode and a lower electrode 97 of the variable resistor is formed to be 100 nm in thickness. Since this TiN layer is removed a little in the later step of flattening an insulation film, the film thickness thereof needs to be set in view of an amount of the removal. In addition, while the TiN layer combines the metal side electrode of the Schottky barrier diode and the lower electrode of the variable resistor, another material having a relatively large work function such as Pt, Co, Ni, or the like may be inserted as the metal side electrode of the Schottky barrier diode.

Then, as shown in FIG. 53, the laminated-layer structure is processed and formed into the shape of a line so as to become the first wiring and the memory cell portion by the well-known dry etching method using a resist as a mask patterned by the photolithography method. The wiring width and the wiring interval at this time are set to about 130 nm.

Figure 54B:
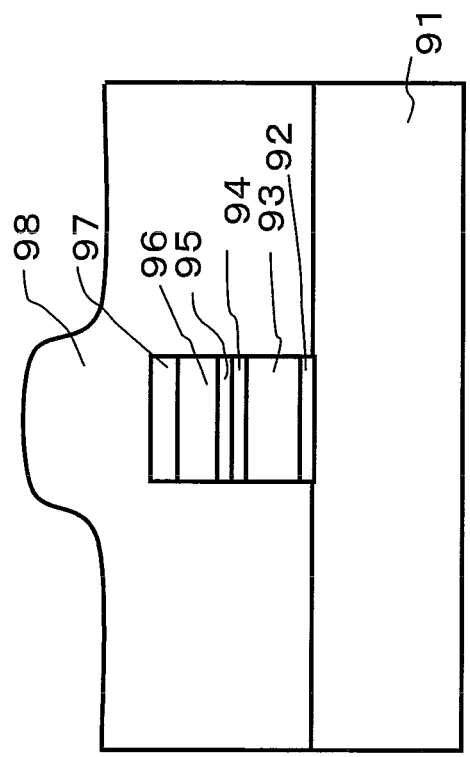
FIGS. 54A and 54B are schematic sectional views showing a manufacturing step according to the third embodiment of the nonvolatile semiconductor memory device according to the present invention.
Figure 54A:
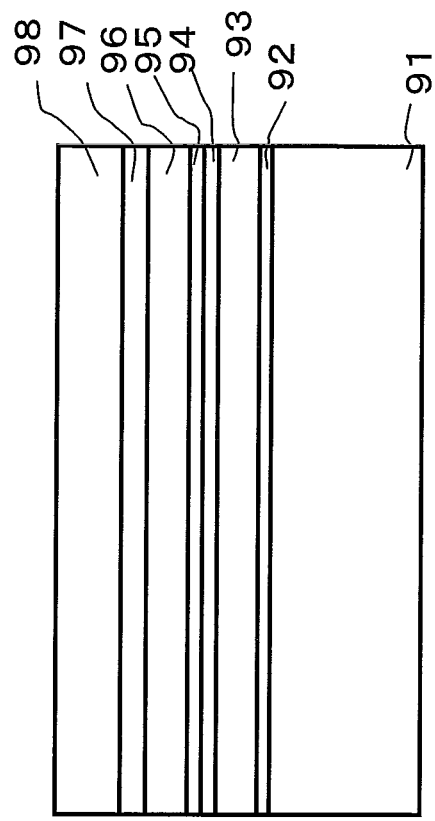

Then, as shown in FIG. 54, an $SiO_2$ insulation film 98 is formed on the first wiring and between the wirings. The $SiO_2$ film is formed by the plasma CVD method or the HDPCVD method. Since the $SiO_2$ layer is flattened by polishing in the later CMP step, the film thickness of the $SiO_2$ layer needs to be at least thicker than the first wiring. In the present embodiment, the $SiO_2$ layer is formed to be 700 nm in thickness.

Figure 55B:
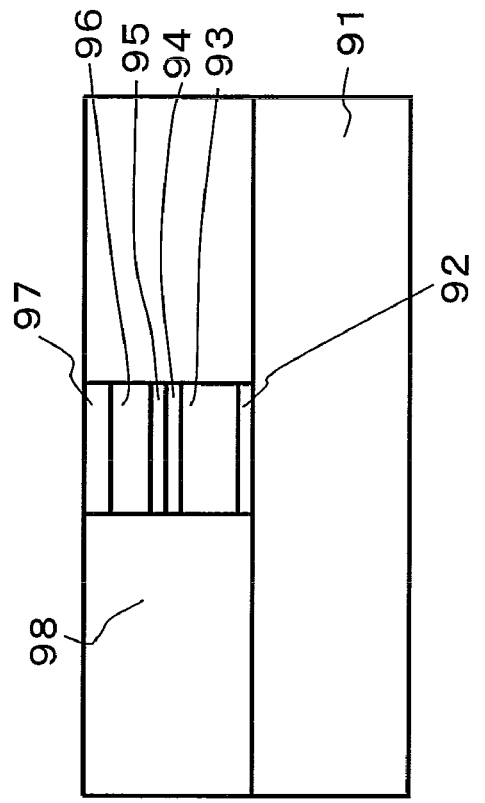
FIGS. 55A and 55B are schematic sectional views showing a manufacturing step according to the third embodiment of the nonvolatile semiconductor memory device according to the present invention.
Figure 55A:
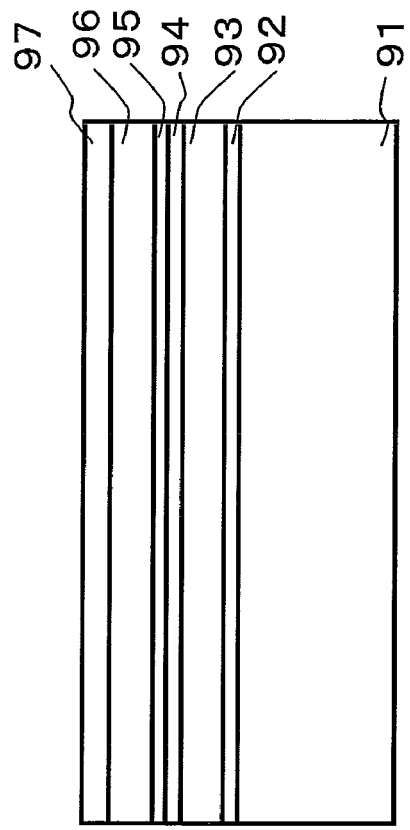

Then, as shown in FIG. 55, the $SiO_2$ layer is polished by the well-known CMP method to remove the $SiO_2$ layer on the first wiring and the memory cell portion and flatten the layer. Since it is necessary to expose the TiN surface by completely removing the $SiO_2$ layer on the first wiring, the TiN layer positioned uppermost layer of the memory cell portion is also polished, but since the polishing rate of $SiO_2$ to TiN is high enough (about 10 or more), a polished thickness of the TiN layer is considerably smaller than the formed thickness of the layer.

Figure 56B:
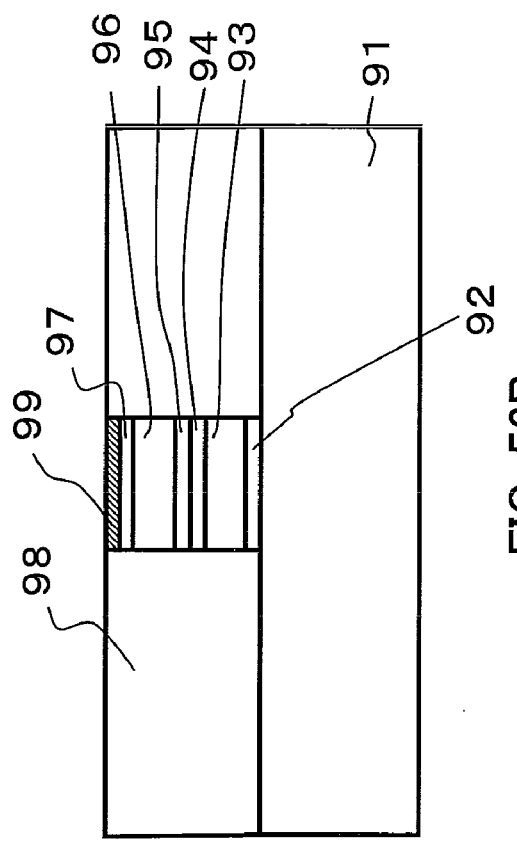
FIGS. 56A and 56B are schematic sectional views showing a manufacturing step according to the third embodiment of the nonvolatile semiconductor memory device according to the present invention.
Figure 56A:
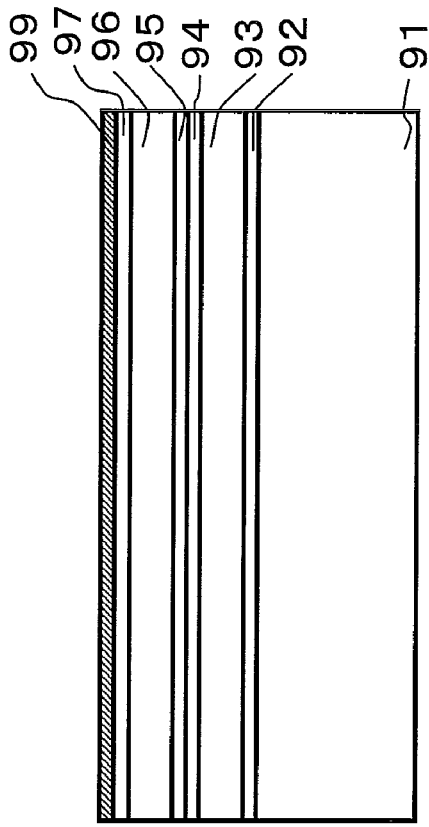

Then, as shown in FIG. 56, a TiON layer serving as a variable resistor 99 is formed by oxidizing the exposed surface of the TiN layer. According to the present embodiment, the variable resistor is formed by being held in an atmosphere of atmospheric-pressure oxygen containing 10% by weight of ozone at a substrate temperature of 300° C. for 10 minutes. At this time, the film thickness of the variable resistor is about 10 nm. However, the method for forming the variable resistor is not limited thereto, and the conditions can be changed within a range of 5 to 100% by weight of ozone concentration, and 250 to 500° C. of the substrate temperature. In addition, as an alternative method, a heat treatment in a reduced-pressure oxygen atmosphere or an oxygen plasma atmosphere, or the oxidizing method using an oxidizing chemical solution can be used.

Figures 57A, 57B:
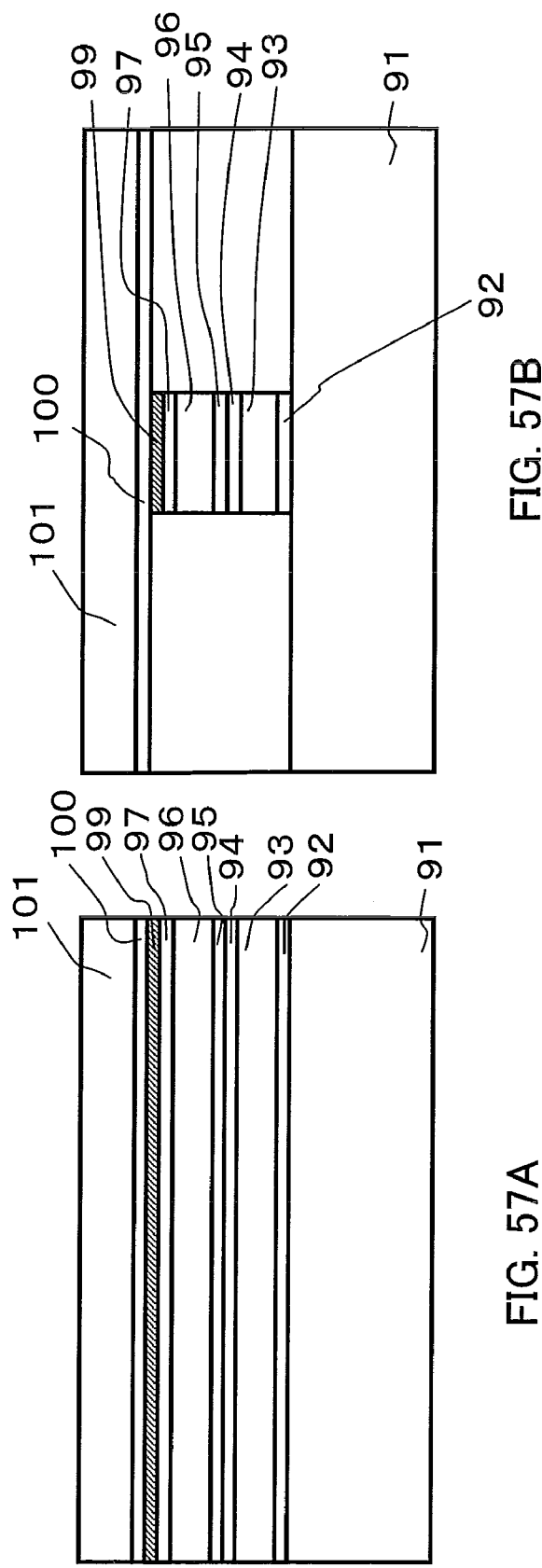
FIGS. 57A and 57B are schematic sectional views showing a manufacturing step according to the third embodiment of the nonvolatile semiconductor memory device according to the present invention.

Then, as shown in FIG. 57, a TiN layer serving as a adhesive layer 100 of a second wiring layer and a tungsten layer serving as a second wiring layer 101 are formed. The adhesive layer 100 functions not only as the adhesive layer of the second wiring layer 101 but also as an upper electrode of the variable resistor 99. Although tungsten is used for the second wiring layer similar to the first wiring in the present embodiment, the present invention is not limited thereto and a transition metal such as Ti, Cu, Co or Ta or an alloy of these metals containing tungsten, or an oxide or nitride showing conductivity may also be used.

Figure 58B:
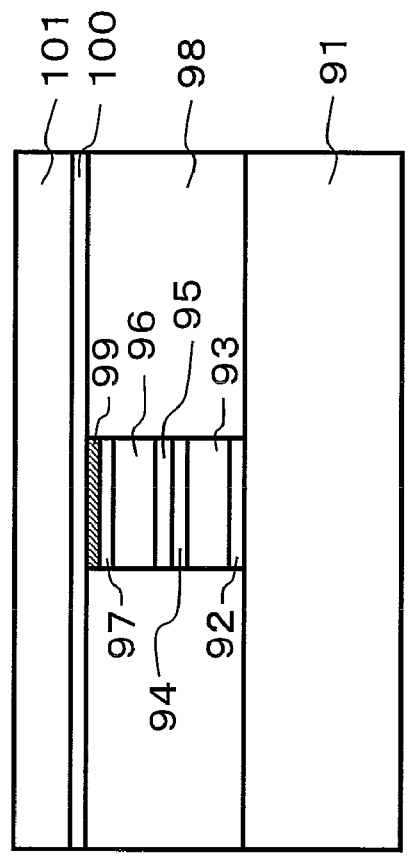
FIGS. 58A and 58B are schematic sectional views showing a manufacturing step according to the third embodiment of the nonvolatile semiconductor memory device according to the present invention.
Figure 58A:
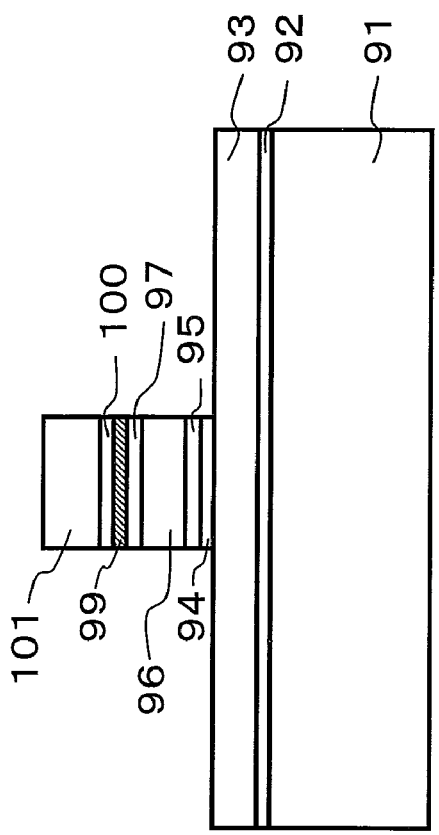
Figure 59:
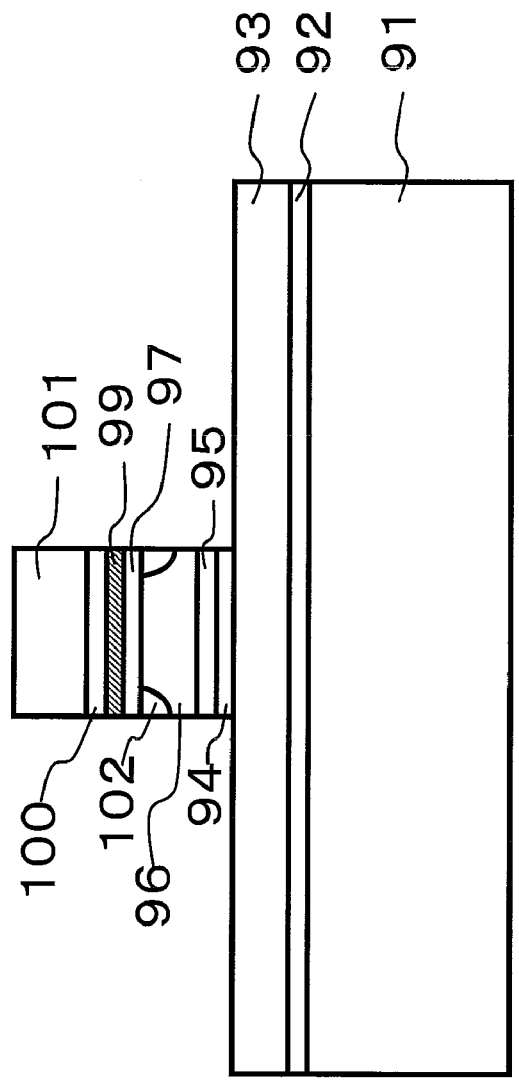
FIG. 59 is a schematic sectional view showing a manufacturing step according to the third embodiment of the nonvolatile semiconductor memory device according to the present invention.

Then, as shown in FIG. 58, the laminated-layer structure is processed by the well-known dry etching method through the resist as a mask patterned by the well-known photolithography method so as to become the second wiring and the memory cell portion. At this time, the process is performed to reach the TiN layer serving as the barrier metal 94 on the first wiring. The wiring width and the wiring interval at this time are about 130 nm. Thereafter, an interlayer insulation film is formed and a flattening step is performed according to need, whereby the desired nonvolatile semiconductor memory device can be manufactured.

The memory cells formed as described above are structured on the upper wiring layer (on the second wiring in the present embodiment) repeatedly, whereby a three-dimensional memory array having the same structure as shown in FIG. 33 can be built and the semiconductor memory device having the highly integrated variable resistive elements can be manufactured.

Figure 60:
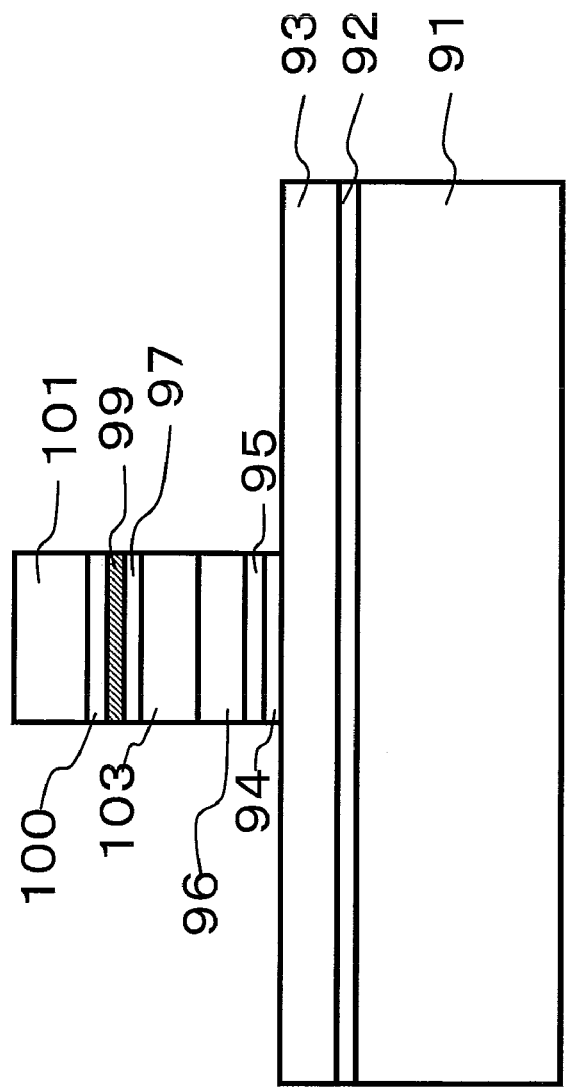
FIG. 60 is a schematic sectional view showing a manufacturing step according to the third embodiment of the nonvolatile semiconductor memory device according to the present invention.
Figure 61:
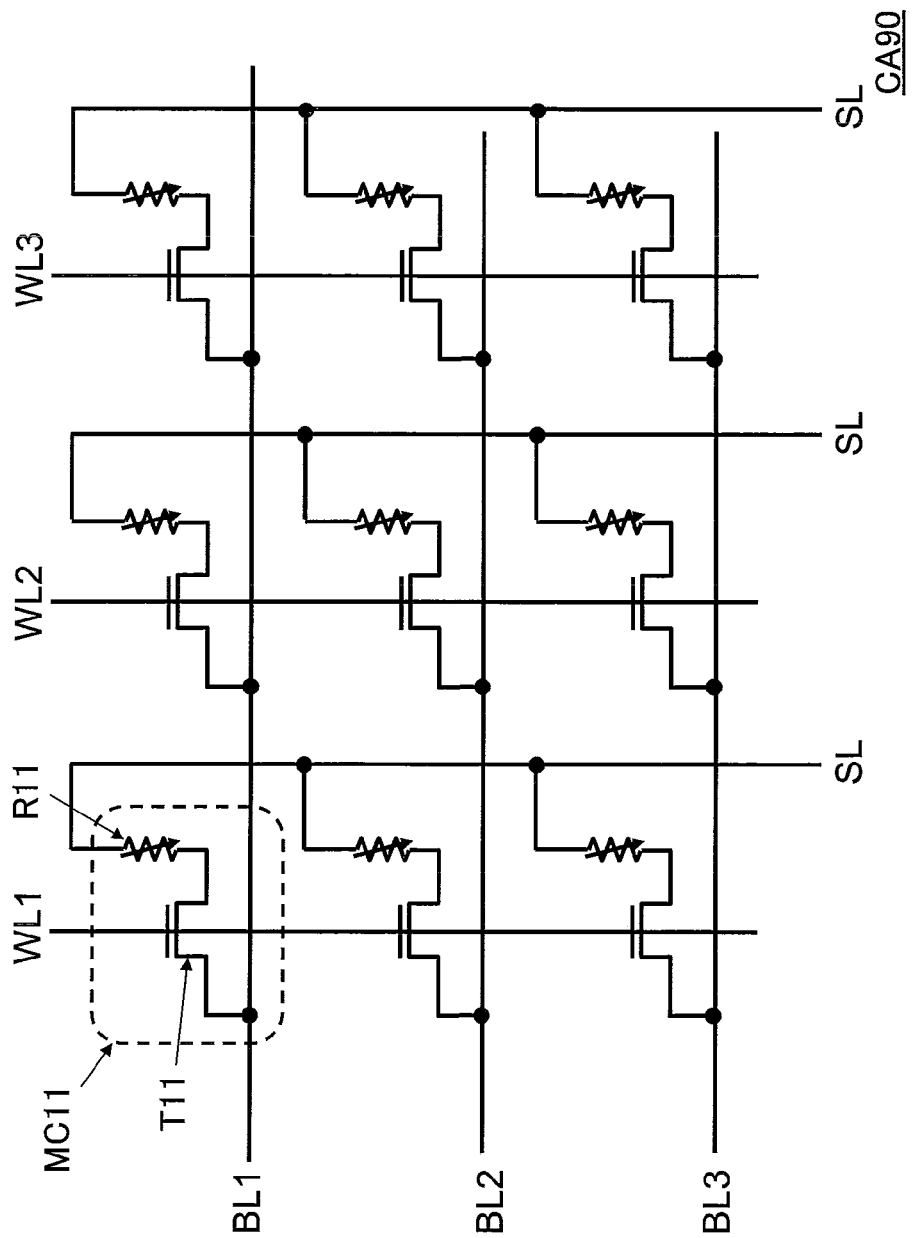
FIG. 61 is a configuration diagram showing a memory cell array having conventional 1T1R type memory cells.
Figure 62:
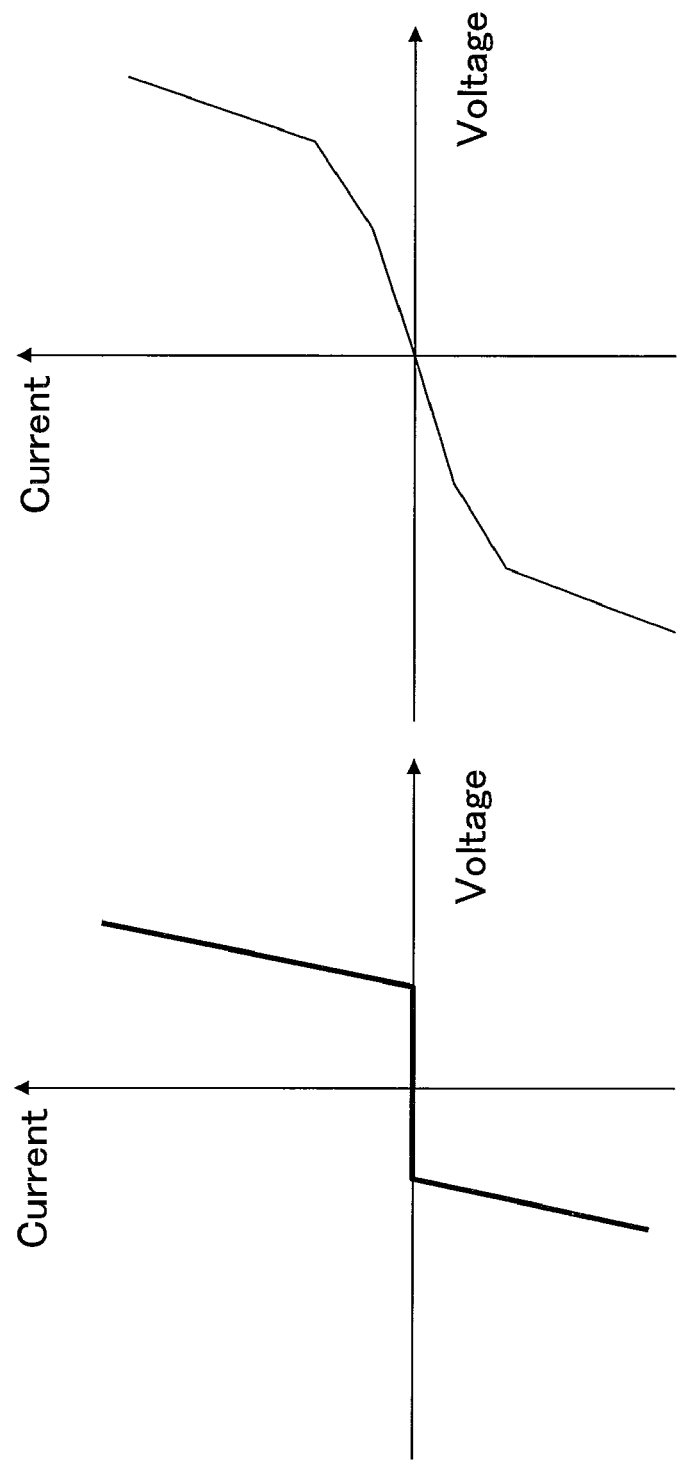
FIGS. 62A and 62B are views showing current-voltage characteristics of a two-terminal nonlinear element.
Figure 63:
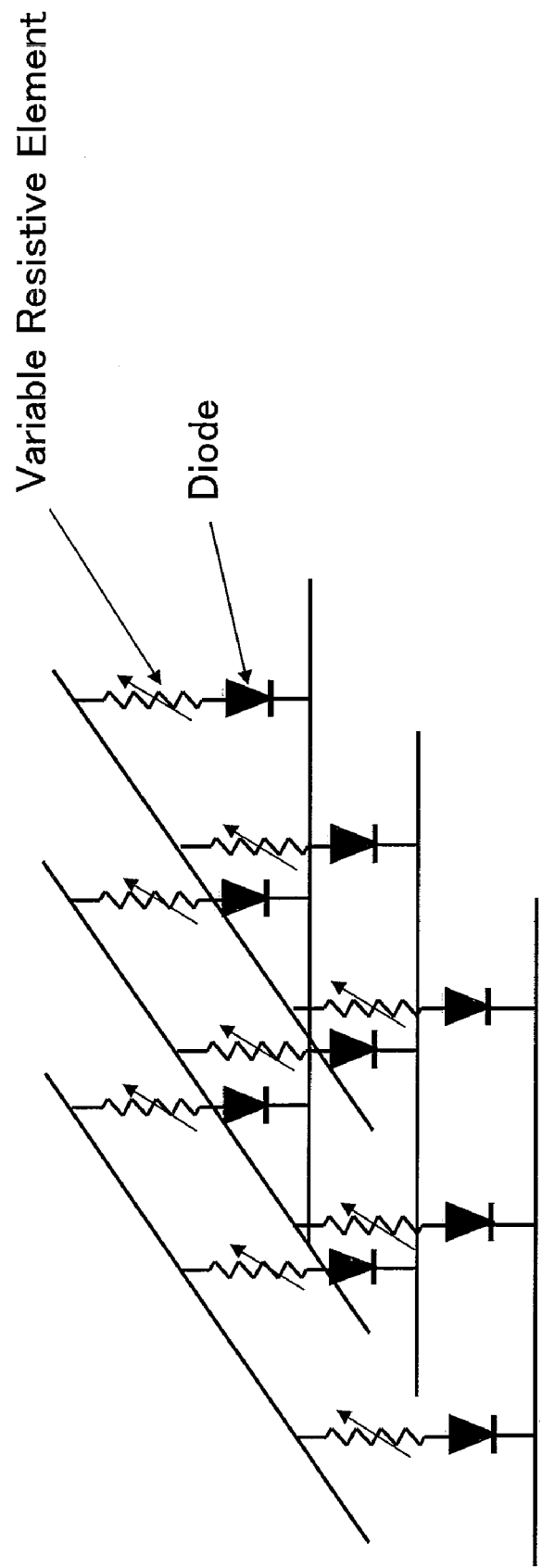
FIG. 63 is a configuration example showing a memory cell array having 1D1R type memory cells.
Figure 64:
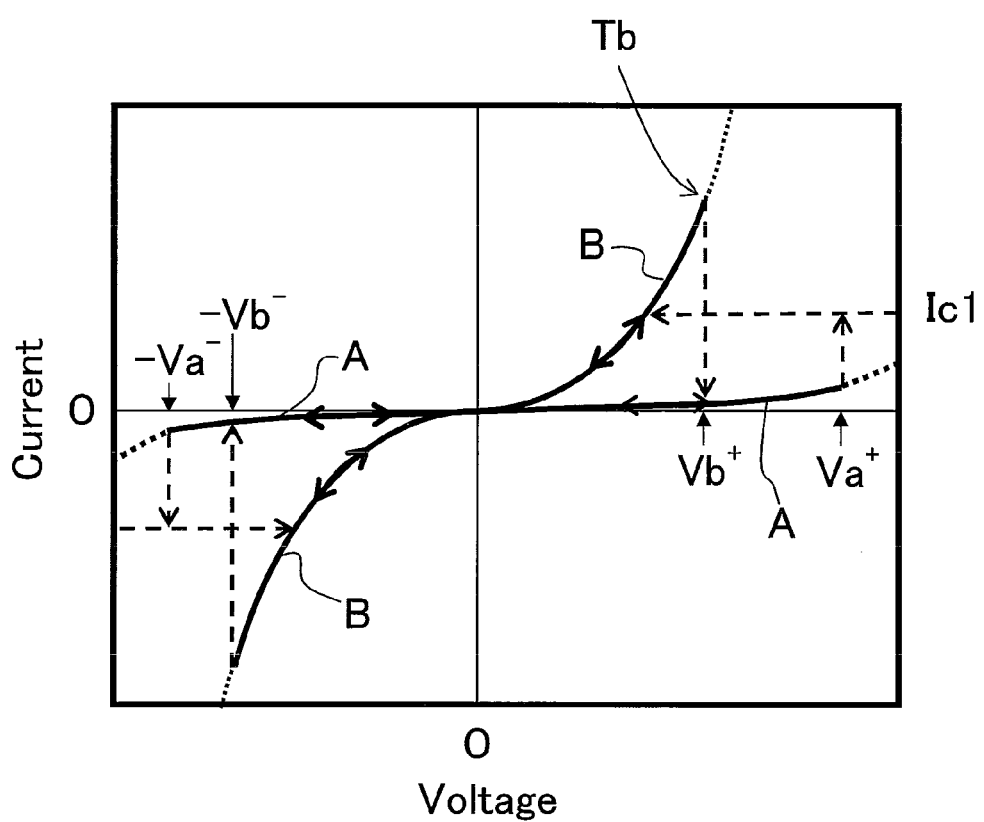
FIG. 64 is a graph showing basic resistance variation characteristics provided by applying a voltage to both electrodes of a variable resistive element having a structure in which a variable resistor is sandwiched between an upper electrode and a lower electrode.
Figure 65:
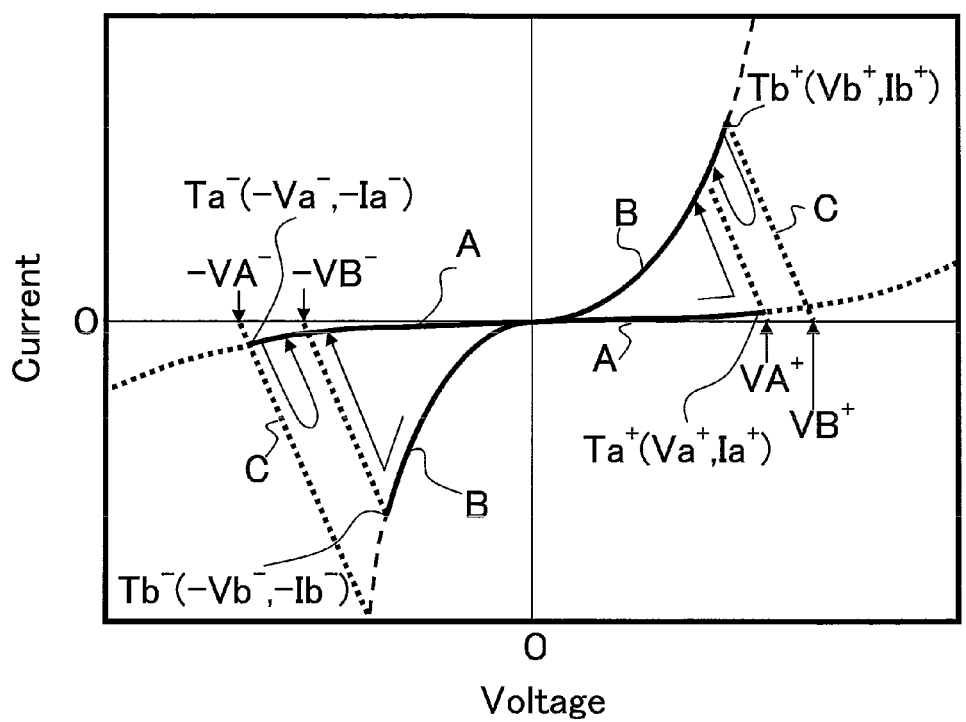
FIG. 65 is a graph showing another basic resistance variation characteristics provided by applying a voltage to both electrodes of the variable resistive element having the structure in which the variable resistor is sandwiched between the upper electrode and the lower electrode.
Figure 66A:
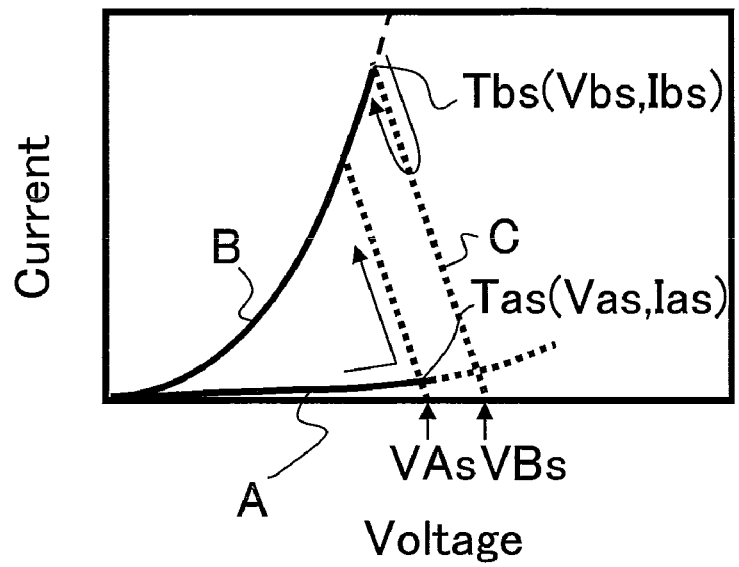
FIGS. 66A and 66B are graphs showing resistance variation characteristics of a conventional variable resistive element capable of performing a bipolar switching operation.
Figure 66B:
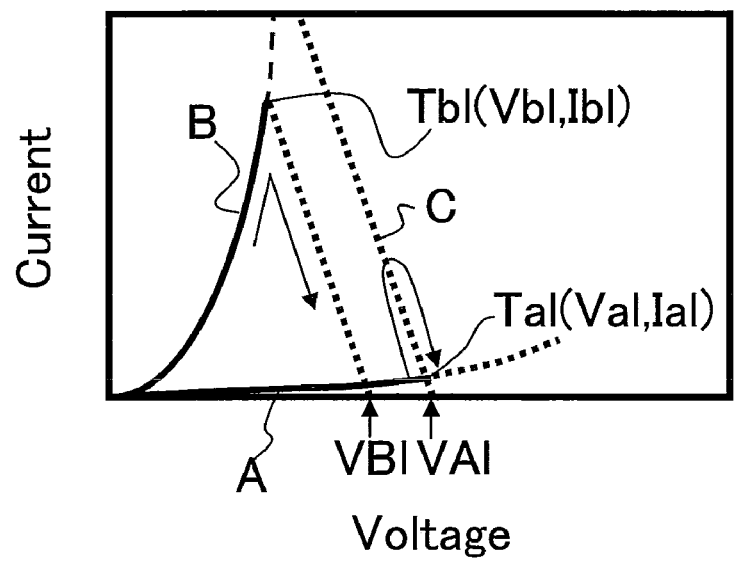

In addition, also in the present embodiment, similar to the first embodiment, a P-type polysilicon 102 may be formed at a part where the N-type polysilicon 96 is in contact with the lower electrode 97 by ion implantation from the oblique direction (refer to FIG. 59), and a P-type polysilicon layer 103 may be inserted between the N-type polysilicon layer 96 and the lower electrode 97 (refer to FIG. 60).

Furthermore, when the memory cell having the variable resistive element not showing the bipolar switching characteristics by itself is manufactured, similar to the first embodiment, the polysilicon layer 96 can have either N-type or P-type conductivity. In this case, the lower electrode 97 is formed of Cu, the variable resistor 99 is formed of CuO by oxidizing Cu, and the upper electrode 100 is formed of Ti, Ta, W, or the like. In this case also, a metal electrode is inserted between the polysilicon layer and the lower electrode 97 to form the Schottky barrier diode, depending on the conductivity type of the polysilicon layer 96.

INDUSTRIAL APPLICABILITY

The present invention can be used in a nonvolatile semiconductor memory device comprising a variable resistive element resistive characteristics of which change as result of voltage application, and, in particular, is effective in implementation of the nonvolatile semiconductor memory device capable of high-speed switching operations to the variable resistive element in a stable manner.

The invention claimed is:

1. A nonvolatile semiconductor memory device comprising:
    a memory cell having a variable resistive element having two terminals, the variable resistive element having resistive characteristics defined by current-voltage characteristics at both ends, the resistive characteristics transiting between two stably provided resistive characteristics of a low resistance state and a high resistance state when a voltage satisfying a predetermined condition is applied to the both ends;
    a load circuit connected to one end of the variable resistive element in series, the load circuit having load resistive characteristics defined by the current-voltage characteristics, the load resistive characteristics being switched between first load resistive characteristics and second load resistive characteristics, the second load resistive characteristics having a resistance higher than the first load resistive characteristics; and a voltage generation circuit for applying a voltage to both ends of a serial circuit configured by the variable resistive element and the load circuit, wherein a stored state of the variable resistive element is determined whether the resistive characteristics are in the low resistance state or the high resistance state and written when the resistive characteristics transit between the low resistance state and the high resistance state in response to application of a voltage to the both ends of the variable resistive element, the variable resistive element shows asymmetric characteristics in which when a polarity of an applied voltage to one terminal based on the other terminal is a first polarity, a first threshold voltage is lower than a second threshold voltage, the first threshold voltage being a lower limit value of an absolute value of the applied voltage required for the resistive characteristics to transit from the low resistance state to the high resistance state, the second threshold voltage being a lower limit value of an absolute value of the applied voltage required for the resistive characteristics to transit from the high resistance state to the low resistance state, and when the polarity of the applied voltage is a second polarity different from the first polarity, the first threshold voltage is higher than the second threshold voltage, the load resistive characteristics of the load circuit are switched so as to show the first load resistive characteristics during a first writing operation in which the resistive characteristics of the variable resistive element transit from the low resistance state to the high resistance state, and show the second load resistive characteristics during a second writing operation in which the resistive characteristics of the variable resistive element transit from the high resistance state to the low resistance state, and the voltage generation circuit applies a first writing voltage to the both ends of the serial circuit of the variable resistive element and the load circuit so that a voltage of the first polarity having an absolute value equal to or higher than the first threshold voltage is applied to the both ends of the variable resistive element of the memory cell to be written during the first writing operation, and applies a second writing voltage to the both ends of the serial circuit of the variable resistive element and the load circuit so that the voltage of the first polarity having the absolute value equal to or higher than the second threshold voltage is applied to the both ends of the variable resistive element of the memory cell to be written during the second writing operation.

2. The nonvolatile semiconductor memory device according to claim 1, wherein
the variable resistive element has a three-layer structure in which a variable resistor is sandwiched between a first electrode and a second electrode.

3. The nonvolatile semiconductor memory device according to claim 2, wherein
the memory cell has a rectifying element connected to the variable resistive element in series, and
the rectifying element provides forward bias when the voltage having the first polarity is applied to the both ends of the variable resistive element.

4. The nonvolatile semiconductor memory device according to claim 3, wherein
when the first polarity is a positive polarity, a Schottky barrier diode is provided at an interface between an N-type polycrystalline semiconductor and a lower electrode that is the lower of the first electrode and the second electrode, the N-type polycrystalline semiconductor being formed so as to be in contact with a lower surface of the lower electrode, and
when the first polarity is a negative polarity, the Schottky barrier diode is provided at an interface between a P-type polycrystalline semiconductor and the lower electrode, the P-type polycrystalline semiconductor being formed so as to be in contact with the lower surface of the lower electrode.

5. The nonvolatile semiconductor memory device according to claim 4, wherein
when the first polarity is the positive polarity, a P-type impurity is implanted to a part of a contact region with the lower electrode in the N-type polycrystalline semiconductor, and
when the first polarity is the negative polarity, an N-type impurity is implanted to a part of the contact region with the lower electrode in the P-type polycrystalline semiconductor.

6. The nonvolatile semiconductor memory device according to claim 3, wherein
when the first polarity is a positive polarity, a PN junction diode includes a P-type upper polycrystalline semiconductor formed so as to be in contact with a lower layer of the lower electrode, and an N-type lower polycrystalline semiconductor formed so as to be in contact with a lower layer of the upper polycrystalline semiconductor, and
when the first polarity is a negative polarity, a PN junction diode includes an N-type upper polycrystalline semiconductor formed so as to be in contact with a lower layer of the lower electrode, and a P-type lower polycrystalline semiconductor formed so as to be in contact with a lower layer of the upper polycrystalline semiconductor.

* * * * *